US012688336B2

(12) United States Patent
Onchuck et al.

(10) Patent No.: US 12,688,336 B2
(45) Date of Patent: Jul. 21, 2026

(54) METHODS AND DEVICES FOR CONSTRUCTION LAYOUT

(71) Applicants: Gerald Dean Onchuck, Mooreton, ND (US); Arnel William Onchuck, Wahpeton, ND (US)

(72) Inventors: Gerald Dean Onchuck, Mooreton, ND (US); Arnel William Onchuck, Wahpeton, ND (US)

( * ) Notice: Subject to any disclaimer, the term of this patent is extended or adjusted under 35 U.S.C. 154(b) by 1178 days.

(21) Appl. No.: 17/683,978

(22) Filed: Mar. 1, 2022

(65) Prior Publication Data

US 2023/0069082 A1     Mar. 2, 2023

Related U.S. Application Data

(60) Provisional application No. 63/237,712, filed on Aug. 27, 2021.

(51) Int. Cl.
*G06F 30/13* (2020.01)
*G06F 30/12* (2020.01)

(52) U.S. Cl.
CPC ............. *G06F 30/13* (2020.01); *G06F 30/12* (2020.01)

(58) Field of Classification Search
CPC ........... G06F 30/13; G06F 30/12; G06F 30/17
See application file for complete search history.

(56) References Cited

U.S. PATENT DOCUMENTS

| | | | |
|---|---|---|---|
| 5,091,869 A | 2/1992 | Ingram et al. | |
| 5,255,441 A | 10/1993 | Burgess et al. | |
| 5,337,149 A * | 8/1994 | Kozah | G01S 5/12 |
| | | | 356/601 |
| 6,260,283 B1 | 7/2001 | Abernathy et al. | |
| 6,384,823 B1 | 5/2002 | Donoghue | |
| 10,246,888 B2 | 4/2019 | Onchuck et al. | |
| 11,078,675 B2 | 8/2021 | Onchuck et al. | |
| 2003/0050878 A1 | 3/2003 | Rappaport et al. | |
| 2012/0010847 A1 | 1/2012 | Hamel et al. | |
| 2013/0155058 A1 * | 6/2013 | Golparvar-Fard | |
| | | | G06Q 10/06311 |
| | | | 345/419 |
| 2016/0345137 A1 * | 11/2016 | Ruiz | H04W 4/024 |
| 2019/0145114 A1 * | 5/2019 | Onchuck | E04G 21/1841 |
| | | | 33/666 |
| 2020/0011647 A1 * | 1/2020 | Swisterski | G01B 3/004 |
| 2021/0200713 A1 * | 7/2021 | Sridharan | G06F 16/288 |
| 2021/0233186 A1 * | 7/2021 | Cohen | G06Q 10/06316 |

\* cited by examiner

*Primary Examiner* — Emerson C Puente
(74) *Attorney, Agent, or Firm* — Kinney & Lange, P.A.

(57) ABSTRACT

A method of locating features for construction layout on a build site includes recalling a defined point descriptor associated with a first defined point, generating a point configuration for the mark point based on the first defined point coordinate data, generating detail data for a first mark point based on at least one of the point configuration and the defined point descriptor, generating a first reference position based on based on a coordinate position of the detail locating apparatus and the detail data, generating a first mark point position based on the first defined point coordinate data and the detail data, generating navigation instructions for moving the detail locating apparatus to align the first reference point position with the first mark point position, retrieving a first detail icon associated with the first mark point based on the detail data, and displaying the first detail icon.

20 Claims, 31 Drawing Sheets

| 22 | 54 | 56 | 58 | 20 |
|---|---|---|---|---|
| 92 | 241.0969 | -1539.5291 | 0.0 | BS13 |
| 93 | 241.0969 | -1539.0291 | 0.0 | BS14 |
| 1000 | 256.5170 | -1626.8437 | 0.0 | E1B |
| 1002 | 265.9433 | -1617.4174 | 0.0 | E1B |
| 1004 | 267.6377 | -1618.1193 | 0.0 | E1C |
| 1006 | 271.2095 | -1609.4963 | 0.0 | E1B |
| 1008 | 275.2914 | -1599.6417 | 0.0 | E1C |
| 1010 | 273.5969 | -1598.9398 | 0.0 | E1B |
| 1012 | 273.5969 | -1598.1181 | 0.0 | E1S |
| 1014 | 273.5969 | -1594.6182 | 0.0 | E1S |
| 1016 | 273.5969 | -1583.9158 | 0.0 | E1B |
| 1018 | 273.5969 | -1583.4932 | 0.0 | E256 |
| 1020 | 273.5969 | -1583.0349 | 0.0 | E2S |
| 1022 | 273.5969 | -1573.2691 | 0.0 | E2B |
| 1024 | 273.5969 | -1572.3682 | 0.0 | E2S |
| 1030 | 273.5969 | -1557.4932 | 0.0 | E356 |
| 1404 | 153.2522 | -1648.8312 | 0.0 | C15B |
| 1406 | 156.4813 | -1648.8312 | 0.0 | C16W |
| 1408 | 165.3980 | -1648.8312 | 0.0 | C16S6W |
| 1410 | 170.7313 | -1648.8312 | 0.0 | C16N6W |
| 1412 | 175.9188 | -1648.8312 | 0.0 | C16B |
| 1414 | 178.2313 | -1648.8312 | 0.0 | C17W6 |
| 1416 | 178.6896 | -1648.8312 | 0.0 | C17W |
| 1426 | 245.5969 | -1596.8691 | 0.0 | U1EASW |
| 1428 | 245.4510 | -1596.1179 | 0.0 | U1S |
| 1430 | 245.5969 | -1590.9304 | 0.0 | U1W |
| 1432 | 250.9302 | -1590.6387 | 0.0 | U1E6 |
| 1434 | 256.8052 | -1588.9513 | 0.0 | U1N |
| 1436 | 259.7011 | -1588.9513 | 0.0 | U1S |
| 1438 | 259.7011 | -1590.7847 | 0.0 | U1S |
| 1440 | 259.9927 | -1590.7846 | 0.0 | U1N |
| 1442 | 262.2635 | -1590.7846 | 0.0 | U1SE |
| 1444 | 259.8469 | -1594.6179 | 0.0 | U1EN |

50    52    54    56    58    20

400

402
Select defined point

404
Recall label

406
Parse label

408
Generate point configuration

410
Generate mark points

1000

Measure base position — 1002

Recall reference point preference — 1004

Measure arm orientation — 1006

Calculate reference point coordinate data — 1008

1200

Starting a timer — 1202

Selecting a mark point — 1204

Storing a first time — 1206

Locating the mark point — 1208

Storing a second time — 1210

METHODS AND DEVICES FOR CONSTRUCTION LAYOUT

CROSS-REFERENCE TO RELATED APPLICATION(S)

This application claims the benefit of U.S. Provisional Application No. 63/237,712 filed Aug. 27, 2021 for "METHODS AND DEVICES FOR CONSTRUCTION LAYOUT" by G. Onchuck and A. Onchuck.

BACKGROUND

The present invention relates generally to the field of construction layout. In particular, the present invention relates to a method of locating details during construction layout and an apparatus for locating those details.

When a new building is constructed, a floor plan is generated with the use of a drafting program. The floor plan is a scaled, sectioned, top-down view of each level of the building as it will appear on a build site. Typically, the floor plan includes predetermined lines and defining details for building components such as the walls, windows, doors and other features that are to be located on the site. These lines and details assist in laying out the building at full size on the build site. Construction layout refers generally to the process of translating a floor plan into practice by reading the plan components and identifying its detail to mark elements visually displaying the placement for the component on the build site, such as walls and window opening and support details.

Construction layout requires accurately locating the walls and positioning marks. One method involves the use of a builder's level, a tape measure, a blueprint plan with dimension lines, detail references and schedules to enable a full-scale position of all planned components on the site. Laying out elements to define all planned components by reading and transferring references from blueprints with handheld tools is time-consuming and typically requires at least two workers with significant expertise.

Electronic surveying equipment can assist with construction layout as an alternative to entirely manual layout. Electronic surveying equipment can include a "total station" that combines an electronic transit and electronic distance measuring device and can accurately determine angles and distances from the total station. A transit is a precision instrument used for measuring angles in horizontal and vertical planes. To determine distance, a laser is beamed from the total station to a reflective prism mounted near the top of a prism stake, and the electronic surveying equipment measures the amount of time the light takes to reflect back to the total station from the prism. When utilizing a prism stake, a point at the base of the prism stake is set at a particular location to allow the total station to provide an accurate reading. Alternatively, the prism can be mounted manually on a tripod or similar device and a laser can be projected downward from the tripod to indicate the point over which the prism is located. The prism must be completely level above the point to be located, as any lean from vertical will provide an inaccurate reading due the prism being slightly offset form the point that is being marked. The prism can also be mounted and leveled on a tripod or other similar device in order to ensure that the prism is level. The total station conveys the coordinates of the point to the user via a handheld unit that is also used to control the total station.

Using a total station for construction layout by design provides high positional accuracy, but human errors can arise as plans are read, which can lead to improper marks being placed on a build site. Further, the total station process generally requires that a single operator be responsible for executing the entire layout process. As such, additional labor cannot be used to shorten or expedite the layout process. In addition, the user is required to set the stake and re-level the prism to ascertain the user's position as the user moves around the site. The user also must level the prism above the final point to ensure that the user is actually marking the correct point as any lean of the prism stake and cause the location marked to be offset from the true position.

To reduce the time required for construction layout, a total station can be used in combination with abbreviated information describing defined points, with the abbreviated information reducing the need to back-reference the building plan while still allowing for use of a total station to accurately locate point positions on a build site. Methods using this type of abbreviated information can use a ruler with a prism mounted to a base. The ruler can be used to locate the proper positions of layout marks relative to the defined point. However, an operator must be able to interpret the abbreviated information, including the back or forward positioning for marks relative to the points, which can require significant expertise. Further, the proper location for the layout mark relative to the defined point must be manually measured by the operator, which can require significant time.

SUMMARY

According to one aspect of the present invention, a method of locating features for construction layout on a build site includes recalling a defined point descriptor associated with a first defined point, generating a point configuration for the mark point based on the first defined point coordinate data, generating detail data for a first mark point based on at least one of the point configuration and the defined point descriptor, generating a first reference point position based on a coordinate position of the detail locating apparatus and the detail data, generating a first mark point position based on the first defined point coordinate data and the detail data, generating navigation instructions for moving the detail locating apparatus to align the first reference point position with the first mark point position, retrieving a first detail icon associated with the first mark point based on the detail data, and displaying the first detail icon. The defined point descriptor is recalled by control circuitry and is parsed by the control circuitry. The point configuration, detail data, first reference point, first mark point position, navigation instructions, and first detail icon can all be generated by the control circuitry. The first detail icon is displayed by a user interface of the detail locating apparatus.

According to another aspect of the present invention, a detail locating apparatus for locating and marking detail on a construction site during construction layout includes a marker base having a vertical axis extending therethrough and a detail locator extending radially relative to the marker base. The detail locator comprises a user interface and control circuitry. The control circuitry is configured to generate a navigation icon for navigating a first reference point associated with the detail locating apparatus to a first mark point of the construction site, cause the user interface to display the navigation icon, retrieve a first detail icon associated with the first mark point, and cause the user interface to display the first detail icon.

According to yet another aspect of the present invention, a method of performing construction layout on a build site includes navigating a detail locating apparatus to a mark point based on navigation data displayed by the detail locating apparatus to align a reference point associated with the detail locating apparatus with the mark point and displaying, by a display, an icon associated with the mark point based on the reference point being aligned with the mark point. The detail locating apparatus comprises a base having a vertical axis, a display extending radially from the base, and an orientation sensor associated with the display. The mark point is associated with a position of a wall element on the build site. Detail data is generated by control circuitry of the detail locating apparatus based on a parsed descriptor associated with the mark point and/or a point configuration associated with the mark point. A location of the reference point on the detail locating apparatus is determined by control circuitry based on a measured position of the detail locating apparatus and the detail data. A location of the mark point on the detail locating apparatus is determined by control circuitry of the detail locating apparatus based on the position of the wall element and the detail data. The icon is displayed above a location on the build site where a layout mark should be made.

DETAILED DESCRIPTION

The present invention includes methods and devices for performing construction layout that substantially reduce the time and level of user expertise required to perform construction layout. Specifically, the present invention uses pre-generated descriptor information and relative point orientation combined with real-time measurements to eliminate many manual measurements currently required to perform construction layout. Each of the method and construction layout device disclosed herein allow an operator of any experience level, including operators with no experience, to efficiently and effectively perform construction layout. Although the methods and devices disclosed herein are generally described as useful for construction layout, it should be understood that the methods and devices can be adapted to for a variety of building trade techniques.

Figure 21:
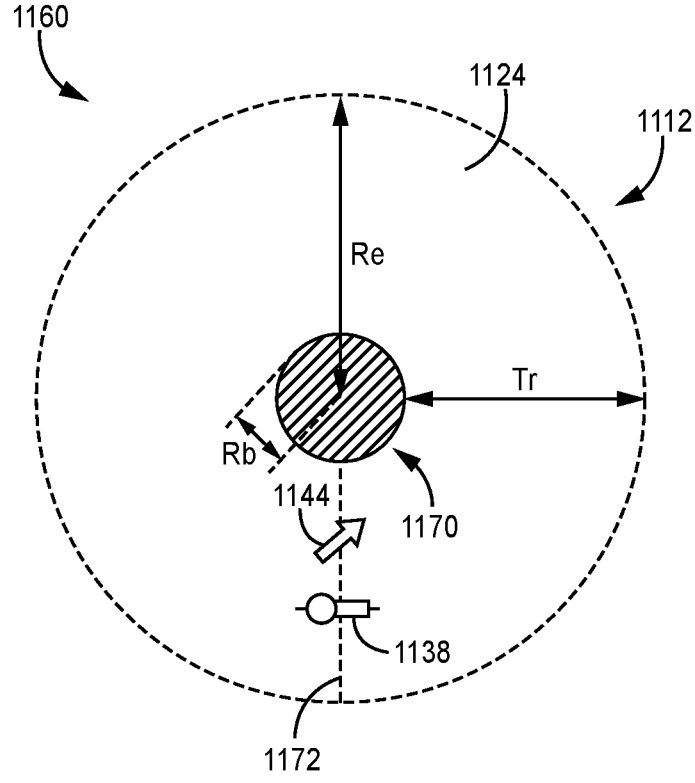
FIG. 21 is a top view of another example of a layout mark locator.
Figure 22:
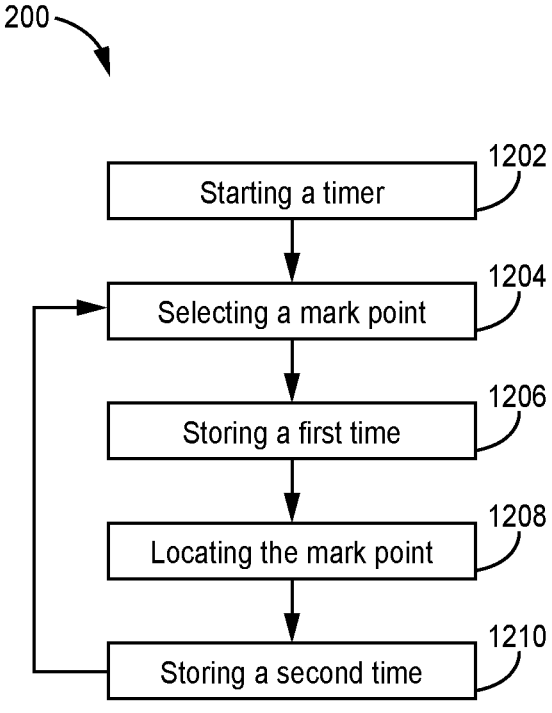
FIG. 22 is a flow diagram of a method of measuring time required to locate one or more layout details according to an example of the present invention.

FIGS. 1A-10 relate to methods that allow for the generation and location of mark points. Specifically, FIGS. 1A-10 relate to methods of generating mark points from defined points. As used herein, "mark points" refer to locations useful for making layout marks to describe floor plan features, while "defined points" refer to the location of the floor plan features themselves. The present disclosure offers numerous advantages related to the generation and location of mark points, as detailed herein. Most notably, the generation and location of mark points substantially reduces the level of operator experience required to accurately perform construction layout. The aspects of the present invention that improve the ease and efficiency with which construction layout can be performed can also be applied to other trade applications. FIGS. 11-21 relate to various apparatuses that can be used with the methods outlined in FIGS. 1A-10, as well as various methods related to the implementation of the methods outlined in FIGS. 1A-10 on the apparatuses disclosed herein. FIG. 22 relates to a method for generating various metrics useful for tracking and improvement of the other methods and apparatuses outlined herein.

Methods of Generating and Locating Mark Points

Figure 1A:
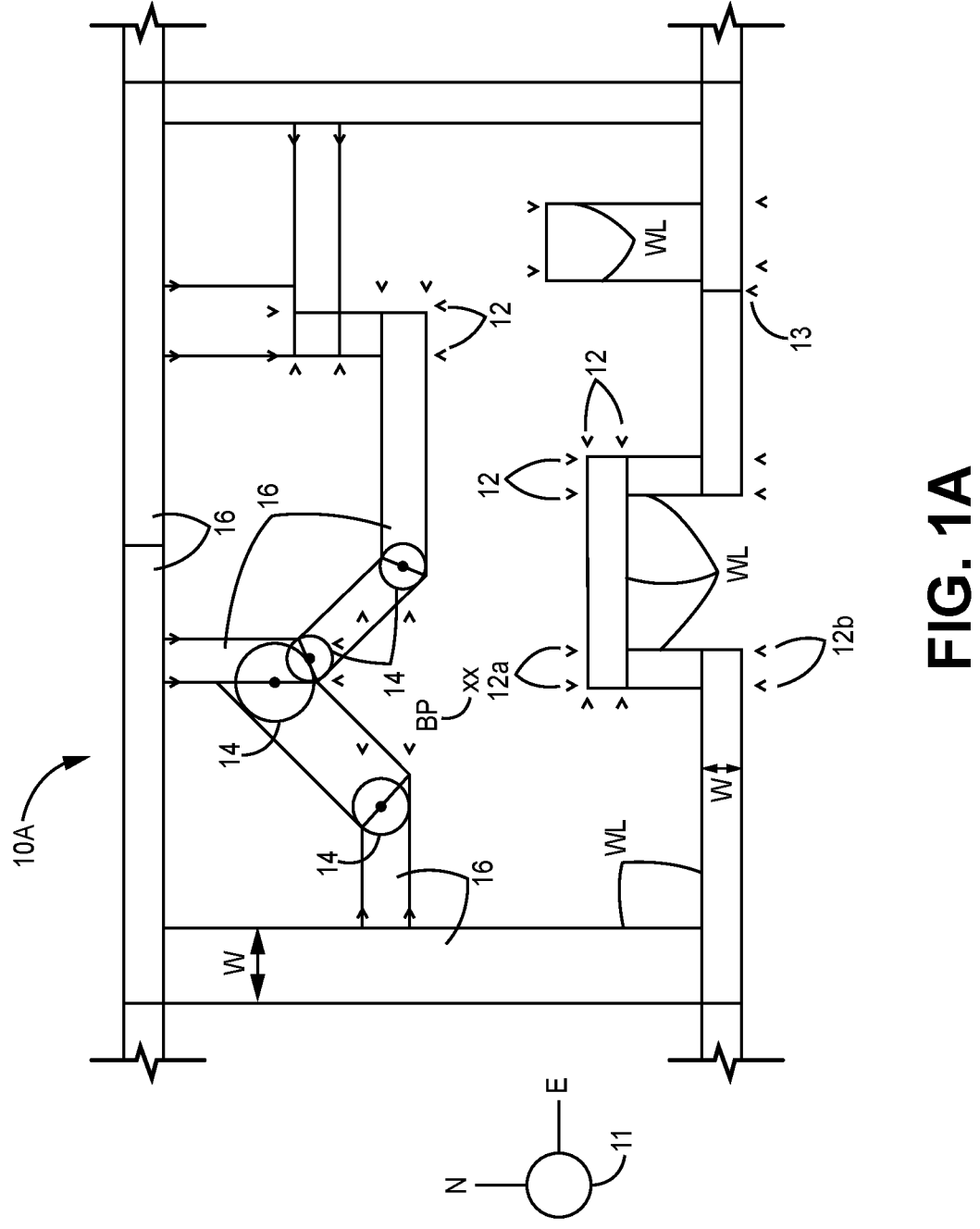
FIG. 1A is a top view of an example of a section of a floor plan showing layout marks.

FIG. 1A is a top view of floor plan section 10A, which shows various features marked with layout marks. Floor plan section 10A is oriented according to a relative directional orientation that is selected for the site. Relative north and relative east, as depicted in FIGS. 1A & B by compass directions 11, are not required to align with true north and true east, respectively. The relative directional orientation of floor plan 10 can define an arbitrary reference basis. The relative directional orientation is established for construction layout.

Floor plan section 10A includes multiple examples of layout marks, including orienting arrows 12, control marks 13, and angled wall marks 14, though it should be understood that other types of marks are possible. Although the layout marks are shown relative to the floor plan 10, such layout marks are made at full scale on the construction site during construction layout, not on the floor plan 10. The layout marks are positioned relative to a feature of interest on the build site. Orienting arrows 12 are aligned with most wall lines WL to indicate the direction that wall line WL extends relative to the mark. Additionally, orienting arrows 12 are provided in twinned sets, with each pair of orienting arrows 12a pointing in a first direction having an associated pair of orienting arrows 12b pointing towards and associated with the first pair of orienting arrows 12. In this way, it is known that each wall 16 is defined by wall lines WL extending between the first pair of orienting arrows 12a and the second pair of orienting arrows 12b. During layout, wall lines are marked on the site, such as with a chalk line. For example, a line can be made between associated orienting arrows 12. The direction of the line is indicated to the user by the orientation of orienting arrows 12.

Control marks 13 indicate the location where the end of a prefabricated wall segment should fall on the construction site. Control marks 13 are generally marked on the construction site where wall 16 is long enough to require the joining of multiple prefabricated wall segments to construct the wall at full size. Utilizing control marks 13 ensures that walls 16 are being installed at the correct locations on the site based on the joint between two prefabricated wall segments falling at the correct location as indicated by control mark 13. In this way, the use of control marks 13 ensures, for example, that the building will not overrun its foundation due to excess length inadvertently gained during construction.

Angled wall marks 14 indicate the ends of walls intersecting at non-right angles. For the angled intersection of two walls having the same width, angled wall mark 14 is preferably a circular mark surrounding junction of the two walls. The diameter of angled wall mark 14 is determined by and is representative of the width of the wall associated with angled wall mark 14, such that wall lines WL are tangential to angled wall mark 14. Where two intersecting walls have the same width, an angled wall mark 18 can have a diameter equal to the width of the intersection walls, such that the wall lines WL extending from the angled wall joint are tangential to the perimeter of the angled wall mark 14. Where two intersecting walls do not have the same width, separate and additional wall marks can be used to denote the width of the walls and an angled wall mark 14 can be used to denote the intersection of the angled walls. While angled wall mark 14 is shown as a circular mark, it is to be understood that angled wall mark 14 can be any suitable mark for indicating the ends of angled walls.

Backsight points BP, depicted in FIG. 1A, are generated prior to layout and, in examples using a total station and prism, are used in combination with total station information to accurately locate the prism on the build site. Backsight points BP can carry vertically through each floor of the building and can be located at any desired position within the interior of the building. Once the lower floor is constructed, a vertical line, such as a laser light, can be shot vertically from the location of the backsight point BP on the lower floor. A hole can be punched through the subfloor of the upper floor to provide a visual indicator of the location of the backsight point BP. Electronic surveying equipment can store the location of the backsight points BP along with the floor plan such that the location of the backsight points BP is given by the electronic surveying equipment. Backsight points BP are preferably arranged in pairs and are configured to project vertically through every floor of the building. As such, backsight points BP provide the operator with a locating reference point regardless of which floor is being laid out. Arranging backsight points BP in pairs allows the backsight points to have redundancy, such that at least one backsight point BP can be utilized if the other backsight point BP is obstructed, such as by a floor joist. In some examples, there are two or more pairs of backsight points BP to ensure that a reference is available for all floors. For example, the backsight point pairs can be marked at least 6 inches (15.24 centimeters) apart, such that a vertical line can extend unimpeded from at least one of the pair of backsight points BP to the flooring of the upper unit. The other backsight point BP can be located in a similar manner as the first backsight point BP, located based on the location of the first backsight point BP, and/or located as needed.

Figure 1B:
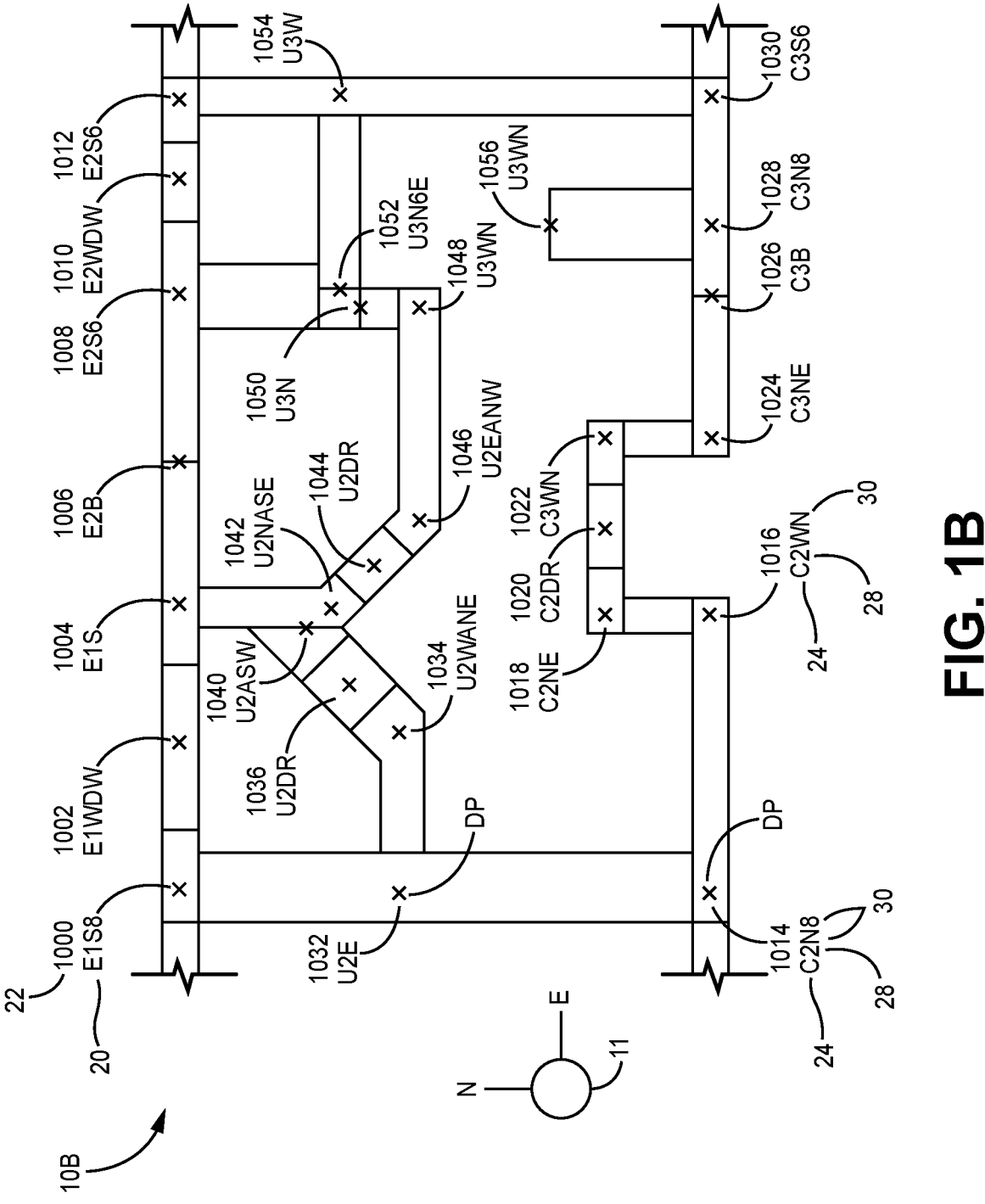
FIG. 1B is a top view of the floor plan section of FIG. 1A showing defined points.

FIG. 1B is a top view of floor plan section 10B, which is substantially the same as floor plan section 10A except floor plan section 10B does not show layout marks and instead shows defined points. Defined points DP, indicated by "x" characters in FIG. 1B, are located at features of interest on the floor plan. For example, defined points DP can be located at corners, butt joints, angled wall joints, doors, or windows. Each defined point DP has descriptor 20, which includes numbers and letters that encode the feature at which the defined point is located, and point number 22, which is an arbitrary but unique reference number assigned to the defined point.

An unmarked floor plan (e.g., a copy of floor plan section 10A lacking layout marks or a copy of floor plan section 10B lacking defined points DP, descriptors 20, and point number 22) can be processed using one or more methods of processing a floor plan to generate each defined point DP and assign those defined points a point number 22 and descriptor 20. A suitable method of plan processing, for example, can use a seed point to identify a boundary of a given type of wall, such as an exterior wall or a corridor wall. The seed point can be established either manually (by operator input) or automatically. After seed points are established, the plan processing method can then create defined points for each wall by tracing each wall through the floor plan. It should be understood that other suitable methods of plan processing can be used to process a floor plan to generate defined points DP having point numbers 22 and descriptors 20.

Descriptors 20 are reference identifiers associated with each defined point DP, and include sub-descriptors indicating several characteristics of the associated defined point DP. These Although these sub-descriptors are described in greater detail below, descriptors 20 can most generally include any information describing the defined point DP, such as the type of wall (e.g., exterior, corridor, etc.) or the type of feature (e.g., corner, butt joint, etc.) at which the defined point is located. In the example depicted in FIG. 1B, descriptors 20 include group type 24 grid position 28, and trade detail descriptor 30, the significance of which will be explained subsequently. Group type 24 encodes the type of wall along which the defined point is located, such as an exterior wall or a corridor wall. Grid position 28 identifies the numbered unit in a multi-unit build site that the defined point DP is located in or adjacent to. In some examples, grid position 28 can be referred to as a "unit number." Trade detail descriptor 30 encodes the type of feature at which the defined point is located and, in some examples, provides the relative direction that a layout mark should point. The direction in which a layout mark is oriented or points is stored in detail formation table 100 is referred to herein as a "bearing," as will be described in more detail subsequently, and is usually stored as a character representative of a compass direction, such as "N," "S," "W," or "E." Trade detail descriptor 30 can also store other values that describe properties of the feature at which the defined point is located. In the depicted example, trade detail descriptor 30 stores numeric wall width values useful for construction layout. Some defined point descriptors 20 in the depicted example lack a trade detail descriptor 30. These defined points can, for example, have a default width value or can have a width value derived from another point having a width value stored as trade detail descriptor 30. Trade detail descriptor 30 will generally be discussed herein as encoding a wall width, as the examples described herein generally refer to building layout techniques. However, trade detail descriptor 30 can also encode other values or properties as required for other trade applications and can vary based on the relevant trade application or technique.

Characters used for each of group type 24 and trade detail descriptor 30 of descriptors 20 shown in FIG. 1B are used consistently therein. Using the group type 24 an example, "E" can indicate an exterior wall, "C" can encode corridor walls, "BP" can indicate a backsight point, and "U" can indicate a wall not belonging to one of the other designations. Using trade detail descriptor 30 as a further example, "C" can indicate a corner, "A" can indicate an angled wall joint, "B" can indicate a butt joint, "WDW" can indicate a window, "DR" can indicate a door, and various combinations of "N," "S," "W," and "E" can indicate bearing values. It should be understood, however, that any character, combination of characters, or symbol can represent these features, and that this approach to the description of features can extend to features not specifically identified herein, including features useful for trade applications other than construction layout.

As shown by the examples depicted in FIG. 1B, the meaning of a character in descriptor 20 is based in part on the position of the character in descriptor 20. For example, a group type 24 of "C" can encode a corridor wall and a detail descriptor 30 of "C" can indicate that a wall is a corner. Similarly, a group type 24 of "E" can indicate an exterior wall and a trade detail descriptor 30 of "E" can indicate an east-pointing layout mark. To improve clarity for operators and for other subsequent operations, certain combinations of group type 24 and detail descriptor 30 can be invalid. Invalid combinations can be recognized by an operator or by control circuitry and ignored to prevent improper marking of the build site. For example, a descriptor 20 that includes both a group type 24 of "C" and a detail descriptor 30 of "C" can be an invalid descriptor 20 due to the use of the same character in multiple positions of descriptor 20. Similarly, control circuitry can be configured to recognize a descriptor 20 as invalid where one or more features encoded by the detail descriptor 30 are invalid or incompatible with the group type 24 of the descriptor 20.

Point number 22 can be used to order points on a floor plan for later use by one or more methods described herein. For example, in floor plan section 10B, defined points have point numbers 22 ranging from "1000" to "1056," with points having the same group type 24 arranged in sequential sets. The construction layout process can be completed in a sequential order according to the point number 22 values of each defined point DP. As the defined points shown in floor plan section 1B are arranged in sequential sets by group type 24, an operator performing construction layout would first mark all defined points having one group type 24 before marking all defined points of another group type 24. The defined point order can be expanded to include other points and direct the operator to place layout mark in, for example, a clockwise arrangement about the build site, as will be discussed in more detail subsequently. The sequential ordering of the defined points around the build site can provide the build order during construction layout. Point number 22 can be used in combination with the coordinate positions of each defined point DP to determine the relative orientations of different defined points DP and further to provide information about the directionality of walls 16 and wall marks (e.g., orienting arrows 12, control marks 13, or angled wall marks 14).

Figure 2:
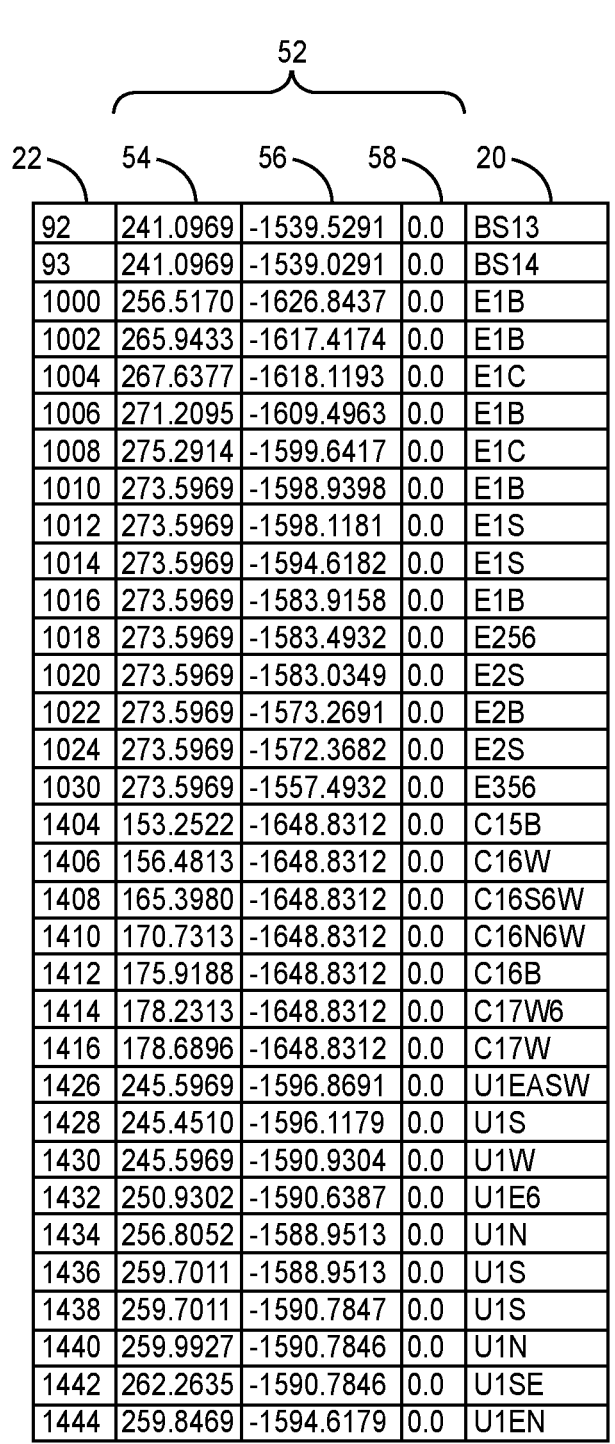
FIG. 2 is a schematic view of an example of a defined point order.

FIG. 2 is a schematic view of defined point order 50, which is an ordered compilation of defined points derived from a floor plan. Each entry in defined point order 50 include the point number 22, coordinate data 52, and descriptor 20. Each entry is organized according to its point number 22, such that the point number 22 of each subsequent entry increases. Like floor plan section 10B, defined points in defined point order 50 are arranged into sequential sets by group type 24. Coordinate data 52 includes northing coordinate 54, easting coordinate 56, and vertical coordinate 58. Northing coordinate 54 represents the position of each defined point along a north-south extending axis and easting coordinate 56 represents the position of each defined point along an east-west extending axis, wherein the north-south and east-west extending axes are oriented according to relative compass directions 11. Northing coordinate 54 and easting coordinate 56 represent coordinate information pertaining the relative north and east of the build site and are not required to align with compass directions based on magnetic north. Vertical coordinate 58 represents the vertical position of the defined point along an axis normal to both the north-south and east-west extending axes.

Defined point order 50 can be generated by control circuitry by extracting defined point data and coordinate data from an unmarked floor plan. For example, control circuitry can be configured to process an unmarked floor plan and place all defined point data into a defined point order. Alternatively, defined point order 50 can be generated from a marked floor plan having defined point data, such as floor plan section 10B, by using, for example, a screen scraping method. For example, control circuitry can be configured to recognize point number 22 and descriptor 20 on floor plan section 10B and store those values as entries in defined point order 50. Similarly, control circuitry can recognize symbols that represent defined points DP on floor plan section 10B and generate a coordinate position for each point. Alternatively, coordinate data 52 can be included in floor plan section 10B for each of defined points DP in addition to descriptor 20 and point number 22, and control circuitry can recognize and store coordinate data 52 in defined point order 50. Once generated, defined point order 50 can then be used by the control circuitry for other methods and purposes discussed herein.

As depicted in FIGS. 1B and 2, point numbers 22 can be assigned to defined points during plan processing so as to group defined points together by their group type 24. Advantageously, this allows an operator following the defined point order to move continuously around a build site by following walls of a single group type 24, improving efficiency of building layout. Ordering defined point by group type 24 also enables an operator to more efficiently use a layout pattern, such as the layout pattern described subsequently with respect to FIG. 6.

Conventionally, to place layout marks on the build site, an operator first locates a defined point and then subsequently determines the proper positions of the layout marks relative to the defined point based on operator knowledge and experience. By contrast, the current disclosure relates to various methods and devices for directly locating mark points, which are representative of locations of layout marks. Where only one layout mark is required to mark a feature, the mark point can be the exact location of where the mark should be made. Where two or more layout marks are required to mark a feature, the mark point can be a single point adjacent to the position of the layout marks that allows an operator can mark all necessary layout marks using a detail locating apparatus at a single location. Examples of detail locating apparatuses will be described subsequently with respect to FIGS. 11-13D and 21. Control circuitry can be configured to automatically recognize which defined points require which combinations of layout marks and to generate mark points at useful positions for performing construction layout, as will be described in detail subsequently, and especially with respect to FIGS. 3A-10.

Advantageously, directly locating mark points greatly reduces the requisite operator knowledge and experience required to perform construction layout. In particular, directly locating mark points greatly reduces the need for an operator to be able to determine the proper position of layout marks relative to each defined point. Control circuitry can be configured to determine the proper position of layout marks relative to each defined point and to store that information as "mark points." The real-time position of an operator can then be compared against the stored location of the mark point and conveyed to an operator as navigation instructions for locating the mark point. The control circuitry can also determine other relevant information, such as the type and number of marks that should be made, and also store that information with other mark point data. This information can be communicated to the operator in addition to the navigation instructions, further reducing the requisite operator knowledge needed to accurately make layout marks. Thus, defining and locating mark points greatly reduces the need for operator knowledge and experience over conventional techniques utilizing defined points only. As will be explained in more detail subsequently, the methods and devices disclosed herein allow for generation of mark points from defined point data and further enable inexperienced operators to locate mark points and accurately place layout marks on a build site.

Figure 3A:
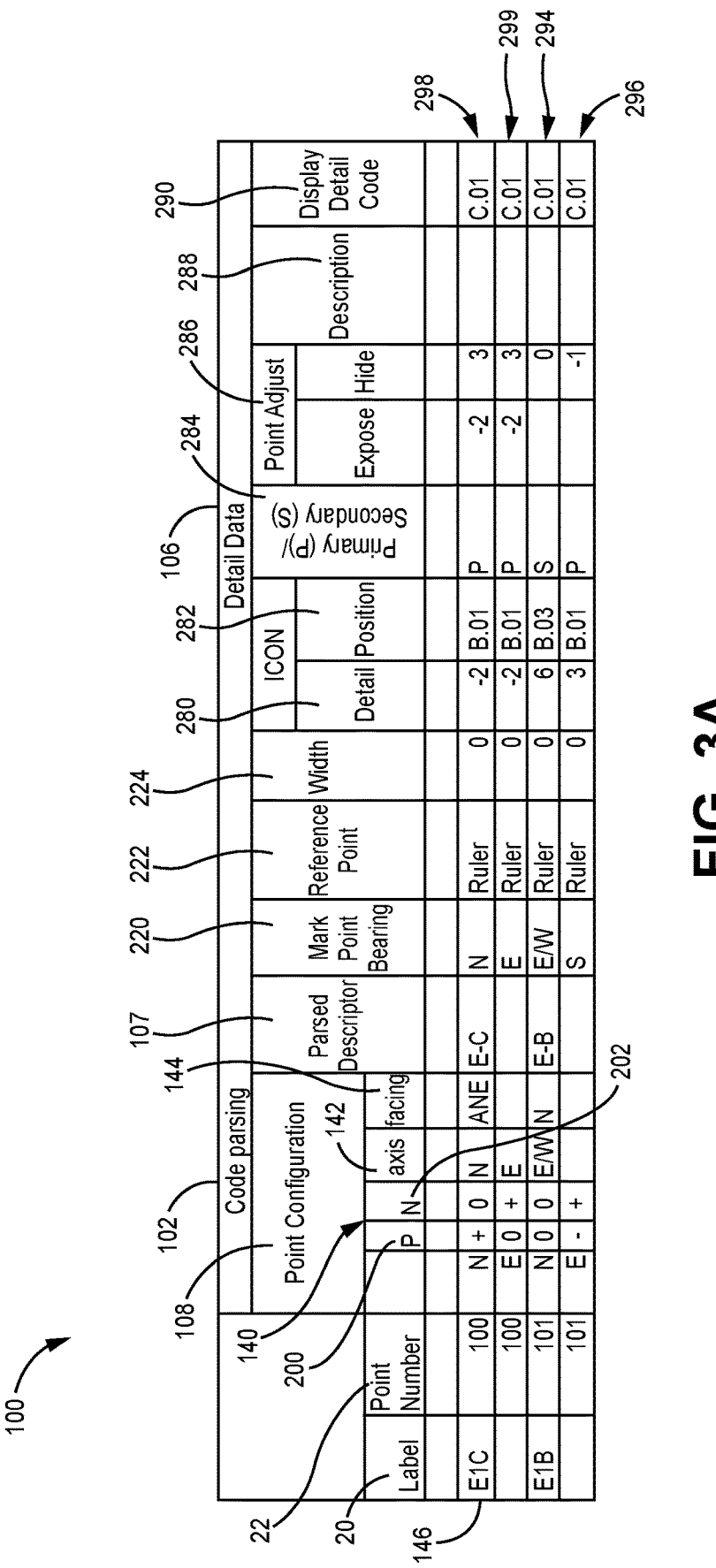
FIG. 3A is a schematic view of an example of a detail formation table.
Figure 3B:
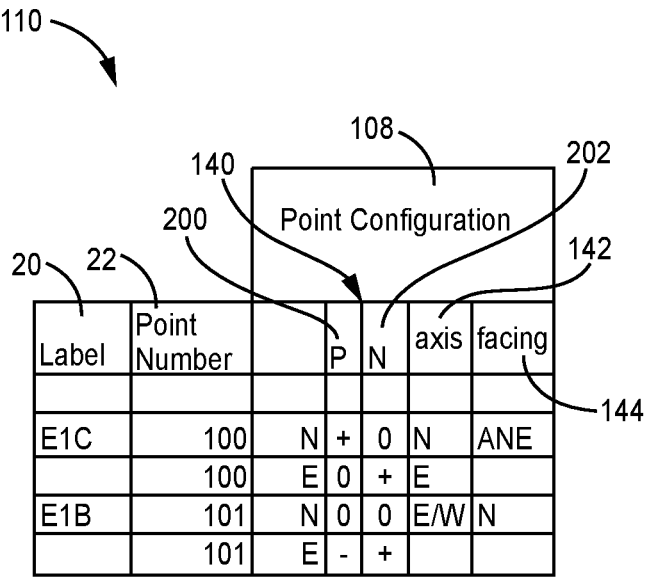
FIG. 3B is a schematic view of the point configuration section of the detail formation table of FIG. 3A.
Figure 4:
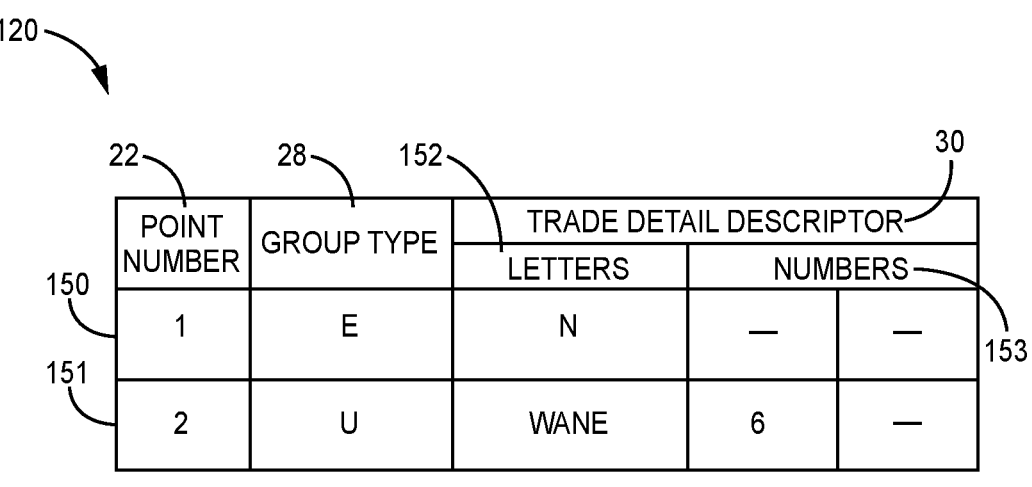
FIG. 4 is a schematic view of an example of a separation table.
Figure 5:
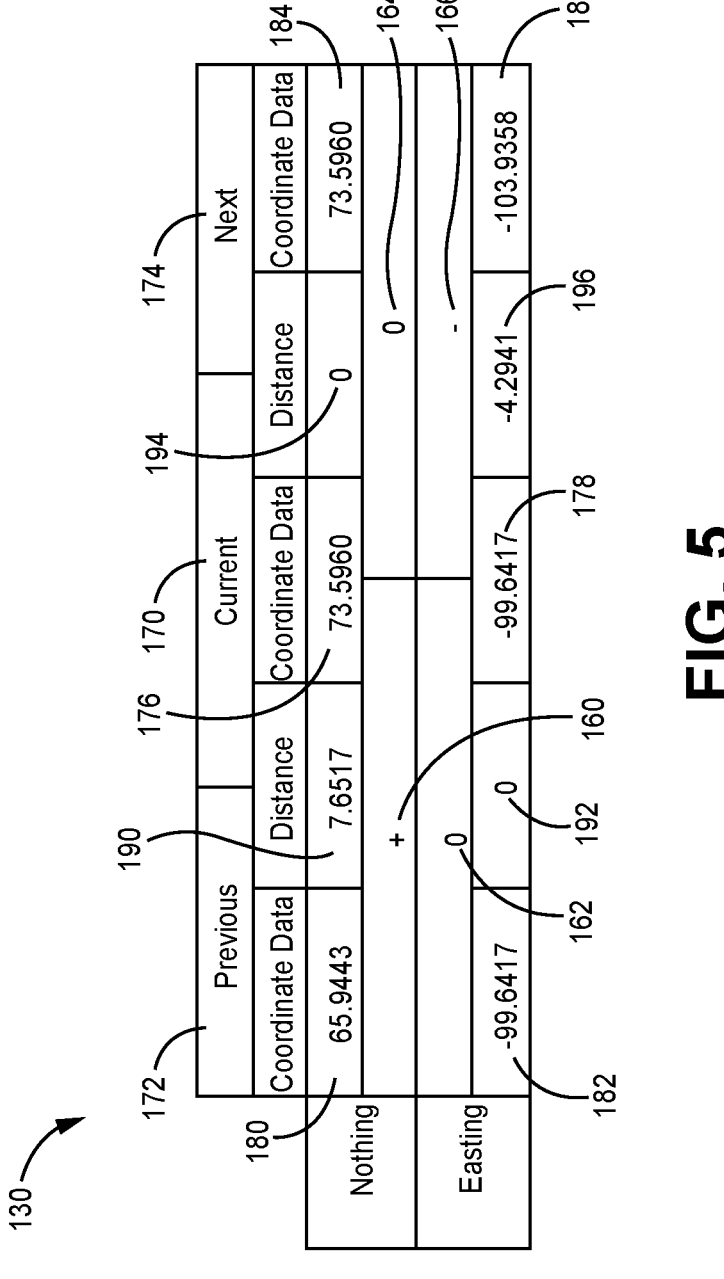
FIG. 5 is a schematic view of an example of a match box generating table.

FIGS. 3A-5 illustrate tables that can be used to create and define mark points based on defined point data stored in a defined point order. FIG. 3A depicts detail formation table 100, which stores information for code parsing 102 and detail data 106. Entries in detail formation table 100 are organized into rows and each row in detail formation table 100 represents a single mark point. As will be explained in more detail subsequently, code parsing 102 includes parsed descriptor 107 and point configuration 108, and is used to populate detail data 106 values for each mark point. As will also be explained in more detail subsequently, detail data 106 stores data describing the mark point, including but not limited to: the orientation of layout marks to be made at the mark point; the location of the reference point used for navigation to the mark point relative to the detail locating apparatus; and various icons for communicating the number and type of layout marks that should be made at the mark point. Detail data 106 can be stored on a memory and recalled during construction layout to convey mark point information as icons and/or text to an inexperienced operator, thereby allowing an inexperienced operator to perform construction layout. Information stored in detail data 106 can also be used to generate instructions that enable inexperienced operators to efficiently navigate to mark points. FIG. 3B depicts point configuration table 110, which includes the point configuration information of code parsing 102 of detail formation table 100 in FIG. 3A but omits detail data 106 for clarity. FIG. 4 depicts separation table 120, which is used to parse the descriptor 20 of a given defined point into parsed descriptor 107, which is useful for defining attributes of mark points. FIG. 5 depicts match box generating table 130, which is used to generate relative orientations that are stored in the point configuration 108 of detail formation table 100. FIGS. 3A-5 will be discussed together for clarity, though it should be understood that any of detail formation table 100, separation table 120, point configuration table 110, or match box generating table 130 can be used with other suitable systems for generating mark point information.

Separation table 120 is used to generate parsed code 107 and match box generating table 130 is used to generate relative orientation 140 of point configuration 108. Relative orientation 140 is representative of the relative orientation of the defined point with which the mark point is associated and nearby defined points, and is used to generate axis 142 and facing 144. Axis 142 and facing 144 represent properties of the defined point with which the current mark point is associated. Axis 142 represents the orientation of the wall(s) along which the defined point is located and facing 144 represents a virtual orientation of an operator at the defined point, as will be explained in more detail subsequently. Axis 142, facing 144, and parsed code 107 can be used to populate detail data 106 for the mark point.

In operation, control circuitry populates code parsing 102, including parsed descriptor 107 and point configuration 108, for each mark point based on the descriptor 20 of the relevant defined point as well as the relative orientations of the previous and next defined points DP in the defined point order 50. Control circuitry can determine the number of mark points associated with a given defined point as parsed descriptor 107 is populated based on a pre-defined parameter. The parameter can be based on, for example, a user preference, a trade standard, or trade technique. As a specific example, the parameter can be based on a trade technique used in construction layout, such as the use of two layout marks to define a corner, with each layout mark representing one interior wall line WL that forms the corner. Control circuitry can recognize that a particular defined point DP represents a corner based on a particular parsed descriptor 107 and, referencing the pre-defined parameter, create mark points that delineate the end of each wall line WL that forms the corner. Control circuitry can then generate detail data 106 for each mark point.

As shown in FIG. 3A and more clearly in FIG. 3B, point configuration table 110 includes relative orientation 140, axis 142, and facing 144. As will be discussed in greater detail subsequently, relative orientation 140 corresponds to the relative positions of nearby defined points, axis 142 corresponds to the relative compass direction of the wall or walls that the current defined point is located on, and facing 144 corresponds to a predicted position that an operator would be facing at the defined point. As such, the point configuration 108 information can be used to simulate a virtual position and orientation of an operator at any defined point location on the build site. Advantageously, the virtual position represented by point configuration 108 can then be used to determine detail data 106 for each mark point by simulating the logic of a human operator interpreting descriptor 20 and placing layout marks.

FIG. 4 shows separation table 120, which can be used to transform descriptor 20 for a defined point into parsed descriptor 107 and stored in detail formation table 100. Separation table 120 decomposes descriptor 20 into several sub-descriptors conveying different information, which can then be selectively combined to form parsed descriptor 107, as noted above and described in greater detail below. Separation table 120 is shown as an example for parsing defined point descriptors 20. It is to be understood, however, that defined point descriptors can be parsed in any desired manner suitable for construction layout or another building trade technique.

Separation table 120 includes values for point number 22, group type 24 and trade detail descriptor 30 for each of entries 150 and 151, which correspond to the values described previously with respect to FIG. 1B. In separation table 120, alphanumeric characters of trade detail descriptor 30 are separated into letters 152 and numbers 153. In the depicted example, letters 152 encode the type of feature that is located at the defined point (e.g., a corner, a butt joint, etc.) and numbers 153 encode a width of the wall at the defined point.

Point number 22 for each of entries 150 and 151 is the same as the point number 22 for each corresponding defined point in a defined point order, and can be populated by recalling the point number 22 for each defined point from the defined point order. Group type 24 and trade detail descriptor 30 are derived from the descriptor 20 for the defined points.

Control circuitry can be configured to recognize the group type 24 and trade detail descriptor 30 for descriptors 20 associated with a defined point order, such as the descriptors shown in defined point order 50, and populate separation table 120 appropriately for each point. Based on the combinations of group type 24 and trade detail descriptor 30 in separation table 120 for each defined point, control circuitry can then generate the appropriate number of mark points in detail formation table 100. Detail data 106 can then be populated for each mark point according to the group type 24 and trade detail descriptor 30 for the corresponding defined point.

In the example shown, separation table 120 includes two entries 150 and 151 derived from example descriptors 154 and 156. Entry 150 is derived from example descriptor 154 and has a point number 22 of "1," indicating that it is the first point in the defined point order. Entry 151 is derived from example descriptor 156 and has a point number 22 of "2," indicating that it is the second point in the defined point order. In the examples shown in FIG. 4, grid positions 28 from descriptors 20 are not included in separation table 120. Accordingly control circuitry can be configured to ignore the grid position 28 values of example descriptors 154 and 156. It should be understood that in some examples, the grid positions may be included in separation table 120. Further, descriptors 20 can have other character patterns that can also be recognized and entered into separation table 120 and the specific patterns discussed herein with respect to example descriptors 20 are merely included as illustrative examples. In general, each descriptor 20 is a concatenation or transformation of a plurality of elements that can include, but are not limited to, point numbers 22, group types 24, grid positions 28, and trade detail descriptors 30.

As shown in FIG. 4, example descriptor 154 is "E1N." The "E" character is separated and stored as group type 24 and, in this example, indicates the defined point is located along an exterior wall. As described previously, grid positions are not stored in separation table 120. As such, the "1" is ignored and not stored in separation table 120. The "N" character is separated and stored as letters 152 of trade detail descriptor 30. Example descriptor 154 lacks numbers in trade detail descriptor 30 and accordingly only null values (represented by "-" characters) are stored as numbers 153 of trade detail descriptor 30 in separation table 120.

Example descriptor 156 is "U1WANE6." The "U" character is separated and stored as group type 24 and, in this example, indicates that the corresponding defined point is located along a wall that is neither an exterior wall nor a corridor wall. The "1" corresponds to the grid position of the defined point and is not stored in separation table 120. The "WANE" characters are separated and stored as letters 152 of trade detail descriptor 30. Example descriptor 156 includes a "6" in trade detail descriptor 30, which is separated and stored as numbers 153 in separation table 120. As described previously, numbers 153 corresponds to a wall width value that can be stored in detail formation table 100. Numbers in trade detail descriptor 30 describing wall width can be stored at the end of descriptor 20 to improve clarity between numbers representing wall width that should be stored as numbers 153 of trade detail descriptor 30 and numbers that represent a unit number and should be stored as grid position 28. Additionally and/or alternatively, descriptor 20 can include parentheses or brackets surrounding numbers related to wall widths, thereby allowing operators and/or control circuitry to more efficiently distinguish wall width values and grid position 28 values. As will be explained in more detail subsequently, trade detail descriptor 30 can further encode bearing 220 information in some examples of point descriptor 20. As will also be explained in more detail subsequently, the relative orientations of adjacent defined points can be used to generate bearing 220 in examples where trade detail descriptor 30 does not contain bearing 220 information.

After the descriptor 20 of a defined point is parsed using separation table 120, the group type 24 and trade detail descriptor 30 can be stored in the corresponding mark point entries of detail formation table 100 as parsed descriptor 107. As shown in FIG. 3A, parsed descriptor 107 can include a "-" character between group type 24 and trade detail descriptor 30 in the position of grid position 28 to clearly demarcate characters representing group type 24 and trade detail descriptor 30. Grid position 28 is not included in parsed descriptor 107. For example, entry 150 can be stored in detail formation table 100 as "E-N" and entry 151 can be stored as "U-WANE(6)." In some examples contemplated herein, parsed descriptor 107 does not have a "-" character between group type 24 and trade detail descriptor 30. Similarly, though parsed descriptor 107 has only been described herein as including group type 24 and trade detail descriptor 30, it should be understood that parsed descriptor 107 can contain any necessary information to determine detail data 106 for each entry of detail formation table 100. More generally, parsed descriptor 107 can have any format that uses alphanumeric characters to identify one or more features of a floor plan. As will be explained in more detail subsequently, parsed descriptor 107 can be used to populate entries of detail formation table 100 and can further be used to determine which elements of point configuration 108 should be used to determine the mark point bearing 220.

FIG. 5 depicts match box generating table 130, which can be used to generate relative orientation 140 information for a defined point. Relative orientation information 140 is stored in point configuration 108 of code parsing 102 for mark points associated with the defined point. As will be explained below, the relative orientation 140 information and the coding of the defined point is used to generate various mark point data, including facing 144 and axis 142 information. Though the relative orientations 140 of defined points are used to generate facing 144 and axis 142 information, the facing and axis information are stored with and linked to individual mark points, as the facing 144 and axis 142 of a given mark point is used to generate detail data 106 for that mark point.

Match box generating table 130 is used to generate relative previous northing 160, relative previous easting 162, relative next northing 164, and relative next easting 166 from coordinate data for current point 170, previous point 172, and next point 174. As will be explained subsequently, relative previous northing 160, relative previous easting 162, relative next northing 164, and relative next easting 166 represent the sign of the relative northing and easting distances between current point 170 and each of previous point 172 and next point 174. As will also be explained in more detail subsequently, the information generated by match box generating table 130 can also be used to generate axis 142, facing 144, and bearing 220 information.

Previous point 172 and next point 174 are selected from the defined point order based on the current point 170. As will be explained in more detail subsequently, the current point can be selected by operator input or can be selected automatically. The previous point 172 is a defined point in the defined point order having the closest point number 22 that is lower than the point number 22 of the current point 170 and also having the same group type 24 as the current point 170. The next point 174 is a defined point in the defined point order having the closest point number 22 that is higher than the point number 22 of the current point 170 and also having the same group type 24 as the current point 170. The previous point 172 and the next point 174 have the same group type 24 as the current point 170 so that the coordinate data of previous point 172, next point 174, and current point 170 can be used to determine the relative orientations of wall(s) extending from current point 170.

Northing and easting data for each of current point 170, previous point 172, and next point 174 are recalled from a defined point order and stored in match box generating table 130. Northing and easting coordinate data for current point 170 is stored as current northing 176 and current easting 178, northing and easting coordinate data for previous point 172 is stored as previous northing 180 and previous easting 182, and northing and easting coordinate data for next point 174 is stored as next northing 184 and next easting 186.

Match box generating table is used to generate values for previous northing distance 190 and previous easting distance 192, which represent the relative distance between previous point 172 and current point 170, as well as next northing distance 194 and next easting distance 196, which represent the relative distance between next point 174 and current point 170. In the example shown, previous northing distance 190 is generated by subtracting previous northing 180 from current northing 176, and previous easting distance 192 is generated by subtracting previous easting 182 from current easting 178. Next northing distance 194 is generated by subtracting current northing 176 from next northing 184, and next easting distance 196 is generated by subtracting current easting 178 from next easting 186.

Each of previous northing distance 190, previous easting distance 192, next northing distance 194, and previous northing distance 190 are converted into a character indicating the sign of each number and stored as relative previous northing 160, relative previous easting 162, relative next northing 164, and relative next easting 166, respectively. A "+" value indicates that the easting or northing value of the previous or next point is greater than the compared value of the current point. A "−" value indicates that the easting or northing value of the previous or next point is less than the compared value of the current point. A "0" value indicates that the easting or northing value of the previous or next point is the same as the compared value of the current point. Although these particular symbols and notations are shown for illustrative purposes, any easily legible graphic could be used. Such graphics should be selected for simplicity and easy readability, and could for example look like the examples provided. For example, "<," "=," and ">" can be respectively used in place of "−," "0," and "+" values described herein.

Relative previous northing 160, relative previous easting 162, relative next northing 164, and relative next easting 166 can then be stored as relative orientation information 140 in detail formation table 100 for mark points associated with the defined point and used to generate axis 142 and facing 144 information in combination with parsed descriptor 107. As will be explained in more detail subsequently, only the sign of the relative distance is required for the generation of axis 142 and facing 144 information that is stored in detail formation table 100. As such, representing relative distance as the sign of the relative distance advantageously reduces the complexity of information stored in detail formation table 100.

In the example of match box generating table 130 depicted in FIG. 5, the relative previous northing 160 is "+," indicating that the previous point has a greater northing coordinate value than the current point. The relative previous easting is "0," indicating that the previous point and the current point have the same easting coordinate value. Thus, it can be inferred that the previous and current points are situated along a north-south extending wall. The relative next northing 164 is "0," indicating that the next point and the current point have the same northing value. The relative next easting 166 is "−," indicating that the next point has a lesser easting coordinate value than the current point and is situated to the relative west of the current point. From this, it can be inferred that the previous point and the current point are situated along a north-south extending wall and the next point and the current point are situated along an east-west extending wall, such that the current point is a corner with a previous point to the relative north and a next point to the relative west.

Returning to FIGS. 3A and 3B, the relative orientation information generated by match box generating table 130 is stored as previous values 200 and next values 202 of relative orientation information 140 in detail formation table 100 for all mark points associated with the defined point used as current point 170. Previous values 200 represent the relative previous northing 160 and relative previous easting 162 and next values 202 represent the relative next northing 164 and relative next easting 166 of the next point. The relative orientation information 140 stored in detail formation table 100 is used to generate axis 142 and facing 144 values, as will be explained in more detail subsequently.

Axis 142 represents a compass direction of the extension of a wall along which or near a mark point is located. Axis 142 can be a single compass direction or multiple compass directions. For example, if a mark point is located at the end of a wall, it can have an axis 142 of a single compass direction to indicate the direction that the wall extends away from the mark point. If a mark point is located along an intermediate portion of a wall, it can have two, opposite compass directions to indicate the directions that the wall extends relative to the mark point.

Control circuitry can use relative orientation data 140 from match box generating table 130 to generate axis 142 information. For example, if the previous northing 180 and next northing 184 values are "0," and if the previous easting 182 is "−" and the next easting 186 is "+," it can be inferred that the previous point is to the relative west of the current point and the next point is to the relative east of the current point. The orientation of wall lines determined from relative orientation data 140 can be stored as axis 142 in point configuration table 110. In the case of a defined point where multiple walls meet, such as a corner, the control circuitry can be configured to generate two mark points for two separate layout marks, each corresponding to an individual wall. Each mark point can have an individual axis value corresponding to each wall, as well as separate bearing 220 values, as will be described in more detail subsequently.

For example, as shown in FIG. 3A, defined point descriptor entry 146 represents an exterior corner between a north-extending wall and an east-extending wall. Two individual mark points are generated from the parsed descriptor 107 for that individual defined point. One has an axis 142 of "N," indicating that it is associated with the north-extending wall. The other mark point has an axis 142 of "E," indicating that it is associated with the east-extending wall.

As parsed descriptor 107 encodes the type of feature, such as an exterior corner, the parsed descriptor 107 can also be used in combination with the relative orientation 140 for a given defined point to determine axis values for mark points associated with the defined point. Specifically, the parsed descriptor 107 can be used to validate that the relative orientation information 140 for the defined point is correct and is producing the correct axis values. For example, a corner should have two axis values offset by 90 degrees. Control circuitry can use the parsed descriptor 107 for a defined point to recognize that a point is a corner and validate that the axis values produced using the relative orientation 140 values.

Facing 144 is the direction that a simulated operator would be facing at a given defined point. One method of determining facing 144 involves evaluating the relative orientations of nearby points in the context of a pre-determined layout pattern. As used herein, a layout pattern refers to a pattern that describes the manner in which an operator moves throughout a build site to perform construction layout. A layout pattern thereby allows the location of previous and next points to be used to simulate the orientation of an operator moving throughout a build site as construction layout is performed. Other rules and constraints can be used in addition to the layout pattern to determine the facing 144 for the defined point.

One method of determining facing 144 involves evaluating the relative orientations of nearby points in the context of a pre-determined layout pattern. As used herein, a layout pattern refers to a pattern that describes the manner in which an operator moves throughout a build site to perform construction layout. A layout pattern thereby allows the location of previous and next points to be used to simulate the orientation of an operator moving throughout a build site as construction layout is performed.

Figure 6:
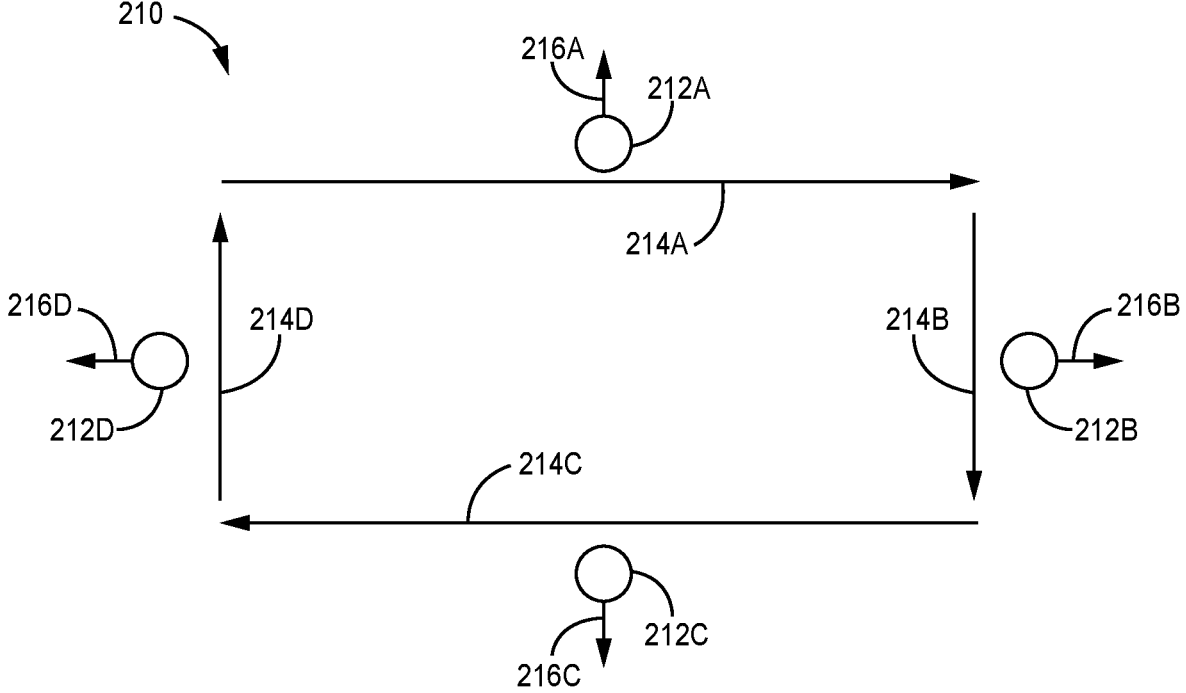
FIG. 6 is a top view of an example of a layout pattern.

FIG. 6 shows layout pattern 210, which is an example of a layout pattern that will be referred to herein as a right-handed clockwise layout pattern. According to layout pattern 210, an operator moves through each of positions 212A-D according to arrows 214A-D. An operator following this pattern faces in the direction of arrows 216A-D at each of positions 212A-D. According arrows 216A-D, an operator following layout pattern 210 faces outward at each position 212A-D as the operator moves according to arrows 214A-D. Accordingly, an operator following layout pattern 210 continuously moves to the operator's relative right while moving in a clockwise pattern. At the corners or junctions between two of arrows 216A-D, an operator faces outward, such that the arrowhead of one arrow is to the operator's relative left and the tail of the second arrow is to the operator's relative right.

For example, if the current point is on an east-west extending wall, the next point is to the relative east, and the previous point is to the relative west, an operator following the right-handed clockwise layout pattern would be facing north at the current point. The controller can be configured to recognize the relative orientation pattern outlined in the above example and store "N" as facing 144 for mark points associated with that defined point. As another example, if the current point is on a north-south extending wall, the next point is to the relative north, and the previously point is to the relative south, an operator following the right-handed clockwise layout pattern would be facing west at the current point. The controller can be configured to recognize that where previous northing 180 is "−," next northing 184 is "+," and both previous easting 182 and next easting 186 are 0, a "W" value representing the relative west of the build site should be stored as facing 144 for mark points associated with that defined point.

Layout pattern 210 can be performed iteratively for all points in a given floor plan. For example, layout pattern 210 can be performed first for exterior wall points and then can be performed a second time for corridor wall points. It may be impractical to include some points in a floor plan in other group types (e.g., as exterior or corridor wall points). These points can instead be grouped together as a separate group type and located in a third iteration of layout pattern 210. Layout pattern 210 can then be performed for other wall or feature types. As layout pattern 210 is performed iteratively, the first point of a given wall type can be selected based on arbitrary choice or convenience, among other options. For example, after construction layout has been performed for all exterior wall points, the nearest corridor wall point can be navigated to and layout pattern 210 can be repeated for all corridor wall points. As described previously with respect to the example of defined point order 50 shown in FIG. 2, defined points stored in a defined point order can be arranged in sequential point number 22 sets according their group type 24. Within each sequential point number 22 set, defined points can be arranged by point number 22 in an order that replicates layout pattern 210, such that an operator performing layout of the defined points in the order of their point number 22 would move according to layout pattern 210.

The right-handed clockwise layout pattern shown in FIG. 6 will be discussed with respect to other aspects of the invention described herein for convenience and consistency. However, it should be understood that an alternative layout pattern can be used with any aspect of the present invention. In some examples, an operator may be able to select a preferred layout pattern and facing values can then be determined based on relative orientations and the selected layout pattern.

Notably, two adjacent points are not always required to determine facing and axis information for the currently-selected defined point. Information from parsed descriptor 107 can be used to supplement incomplete relative orientation information to generate axis 142 and facing 144. For example, if the current point is not an angled wall joint or a corner and the coordinate data of only one of the previous and next points is known, axis 142 information can be determined from the parsed descriptor 107 for the current point and the relative orientation of the adjacent point having known coordinate data. If the layout pattern is also known, the facing can also be inferred. As a specific example, if the relative orientation of the next point is not known, but the previous point has a relative northing of "+" and a relative easting of "0," it can be inferred that the axis 142 of the current point is a north-extending axis. If the layout pattern is the right-handed clockwise pattern disclosed herein, an operator following that pattern from the previous point to the current point would be facing to the relative east of the build site, meaning that an "E" representing the relative east of the build site should be stored as the facing 144 for the current point.

Although axis 142 and facing 144 have been described with a notation referencing compass directions for illustrative purposes, any easily legible graphic could be used. Such graphics should be selected for simplicity and easy readability, and could for example look like the examples provided. For example, axis 142 and facing 144 can be represented by numbers indicating an angle from relative north.

Data from point configuration table 110 is used in combination with parsed descriptor 107 to generate bearing 220, reference point 222, and width 224, each of which will be described in more detail subsequently. Control circuitry can be configured to generate bearing 220, reference point 222, and width 224 from point configuration table 110 and parsed descriptor 107.

Bearing 220 represents a compass direction that is derived from one or more of descriptor 20, axis 142, and facing 144. The value stored as bearing 220 refers to the relative direction that a layout mark is pointing on a build site and can be used to define various other detail data for a given mark point. For example, a mark that indicates the easternmost end of an east-west wall would have a bearing 220 of "W," indicating that the mark should be pointed to the relative west. Multiple mark points associated with the same defined point can have identical or differing bearing 220 values based on the point configuration 108 and parsed descriptor 107 of the defined point. In the depicted example, bearing 220 is represented by letters indicating compass directions. However, in other examples, bearing 220 can be represented by other characters indicating a compass direction. For example, numbers indicating an angle from relative north could be used to represent bearing 220.

For some points, bearing information can be derived from the descriptor 20 of the point alone. As described previously, trade detail descriptor 30 of descriptor 20 can contain characters that encode for mark point bearings. Control circuitry can be configured to recognize that the trade detail descriptor 30 includes bearing information and to store the information as bearing 220 in detail formation table 100. As discussed previously, the bearing information can be represented in trade detail descriptor 30 as text representing compass directions. Also as discussed previously, characters can be reused for convenience within trade detail descriptor 30. For example, "WDW" can be used to represent a point corresponding to part of a window and "W" can be used to designate a western bearing. Control circuitry can be configured to recognize patterns in trade detail descriptor 30 and thereby determine which portions of trade detail descriptor 30 represent bearing 220 and which describe other information about the point. Using the above example, control circuitry can recognize that a "W" followed by "DW" indicates a window, while a "W" by itself indicates a bearing. Control circuitry can be configured to recognize other combinations of letters and numbers as either bearing 220 or other trade detail descriptor 30 information as required for a given trade application.

Where the descriptor 20 for a given point does not contain bearing information, one or more of relative orientation 140, facing 144, and axis 142 information can be used in combination with the descriptor 20 to generate the bearing 220 for a given mark point. Control circuitry can be configured use descriptor 20 to determine which of relative orientation 140, facing 144, axis 142, or both, as will be explained in more detail subsequently.

For example, the facing information can be used to determine the bearing of a butt joint between external and corridor walls. If the defined point is coded by descriptor 20 as an exterior point, the previous point is to the relative west, and the next point is to the relative east along an east-west extending wall, the facing would be north under the right-handed clockwise layout pattern.

As a further example, axis 142 information can be used to determine the bearing of a defined point coded as a corner. If the defined point is coded as an exterior corner, the previous point is to the relative north, and the next point is to the relative east, control circuitry can be configured to create two separate mark points. One mark point can have an axis 142 value of "N," indicating that it corresponds to the wall extending to the north of the defined point. The other mark point can have an axis 142 value of "E," indicating that it corresponds to the wall extending to the east of the defined point. The facing for this corner in the right-handed clockwise pattern would be "NE," representing a northeastern direction, as described previously. As marks oriented toward the northeast of the build site are not useful in layout of a corner of a north-south extending wall and an east-west extending wall, the facing 144 information is not useful to determine the bearing 220 of mark points for a corner. However, the axis information for the corner can be used to determine bearing information for the corner instead. The mark for the north-extending wall should be oriented toward the north and the mark for the east-extending wall should be oriented toward the east. Thus, the bearing 220 and axis 142 values for each mark point should be identical for corners. In this example, the mark point for north-extending wall has an axis of "N," indicating that it is associated with a north-extending wall, and should also have a bearing of "N,"

indicating that the mark made at that mark point should be oriented to the north of the build site. Similarly, the mark point for east-extending wall has an axis of "E," indicating that it is associated with an east-extending wall, and should also have a bearing of "E," indicating that the mark made at that mark point should be oriented to the east of the build site.

While facing 144 values have been described herein as useful for determining the bearing 220 of butt joints and axis 142 values have been described herein as useful for determining the bearing of corners, it should be understood the combination of axis 142 and facing 144 information can be used with a descriptor 20 to determine bearing 220 information for marks and mark points representing a wide variety of building features, including features not explicitly noted or described herein.

The relative orientation information discussed above can also be used to validate various information encoded in descriptor 20 and/or the point order of various defined points. For example, the current point can be indicated as a corner by a character in descriptor 20 and the relative orientation information of points adjacent to the current point in the defined point order can be used to validate that the current point is correctly labeled as a corner. Control circuitry can be configured to detect a relative orientation pattern indicating a corner and, if such a pattern is absent, produce an error message to indicate that either: (1) the defined point order has an error, or (2) the descriptor 20 of the current point is erroneous.

In some examples, a bearing 220 value stored in trade detail descriptor 30 of a descriptor 20 can be validated against the facing 144 for a mark point derived from the descriptor 20. For example, for some mark points, the bearing 220 of the mark point should be encode a direction that is opposite the direction encoded by the facing 144 for that mark point. Control circuitry can be configured to recognize that the direction of the bearing 220 should be opposite the direction of the facing 144 for that mark point and, if it is not, produce an error message to indicate that either: (1) the defined point order has an error, or (2) the descriptor 20 of the current point is erroneous.

As yet a further example, if the next point lacks axis and/or orientation information such that a facing cannot be determined as outlined above, the bearing value for an exterior wall point can be determined in part from the descriptor 20 of the current point as well as the axis 142 of the previous point. This may arise during the layout of different portions of buildings that are laid out and constructed in multiple portions or parts. This may arise during the layout of buildings in multiple portions or parts. Thus, only the layout pattern and the coordinate value of the previous point are required to generate a facing 144 value.

Together, axis 142 and facing 144 encode virtual representations of the wall lines adjacent to a defined point (and, consequently, mark points corresponding to the defined point) and the orientation of an operator at that defined point, respectively. As such, axis 142 and facing 144 can be used to generate the proper orientation and spacing of mark points relative to a defined point, and can further be used to validate parsed descriptor 107.

Advantageously, determination of bearing 220 allows the proper orientation of layout marks to be determined from only the parsed descriptor 107 of the current defined point and the relative orientations 140 of the current, previous, and next defined points. As will be explained in more detail subsequently, the bearing information can be used with other aspects of the present invention to, for example, select an active mark point. Further, the bearing 220 can be used to determine a bearing axis extending in a compass direction corresponding to the bearing 220. The mark point is located along the bearing axis and the offset between the mark point and the defined point along the bearing axis can be stored as point adjust 286. As will also be explained in more detail subsequently, storing offset as point adjust 286 in detail formation table 100 allows the offset between the mark point and the defined point to be adjusted dynamically based on site conditions, thereby allowing the location of the mark point to be adjusted according to, for example, operator preference, site geography, or trade application requirements.

Reference point 222 refers to the reference point used for locating a mark point. As used herein, a mark point has been "located" when the coordinate value of the reference point and the coordinate value of the mark point are the same. The reference point is a virtual point associated with the operator or a detail locating apparatus. To this extent, the precise location of the reference point is based in part on operator preference for locating a mark point having a given parsed descriptor 107 and point configuration 108. Control circuitry can be configured to automatically generate a reference point based on operator preference for a given combination of parsed descriptor 107 and point configuration 108. For example, it can be advantageous for an operator using a detail locating apparatus having an arm rotatably mounted to a central base (e.g., layout mark locator 660 discussed subsequently with respect to FIGS. 13A-F) to have a reference point located along the rotatable arm or located at the position of the base. Based on parsed descriptor 107, control circuitry can automatically assign a reference point of "ruler," indicating that the reference point should be located on the arm, or a reference point of "base," indicating that the reference point should be the position of the base. The "ruler" and "base" reference points described herein are provided as illustrative examples, any reference point notation can be used that clearly conveys the portion of the detail locating apparatus that should be used as a reference point.

Width 224 is derived from the descriptor 20 of either the current point or a nearby point. As described previously, trade detail descriptor 30 can include characters that represent the wall width. These characters can be stored as numbers 153 in code separation table 120, for example. Control circuitry can be configured to recognize numbers in trade detail descriptor 30 and use these characters to generate a wall width value. Where numbers are surrounded by parentheses or brackets in parsed descriptor 107, control circuitry can be configured to recognize that numbers in parentheses or brackets correspond to wall width and to store the number as width 224 in detail formation table 100. Control circuitry can also be configured to recall wall width from numbers 153 of code separation table 120 and store the width as width 224 in detail formation table 100. The numbers can be stored directly as a wall width and in detail formation table 100 or, in some examples, they can be cross-referenced against one or more additional tables to generate a wall width value that is stored in detail formation table 100. Using additional tables increases the complexity of wall width values that can be coded into descriptor 20. Moreover, wall width values stored in detail formation table 100 can be those used within the trade of construction layout. For example, a "6" in descriptor 20 can indicate that the wall has a nominal finished width of 5.5 inches. A "6." instead of "6" to indicate that the wall has an actual width of 6 inches instead of a nominal finished width of 5.5 inches.

Wall width values typical of other trade applications can also be stored in detail formation table 100.

Although some examples of descriptor 20 do not include numbers in trade detail descriptor 30, it may still be desirable to determine a wall width value for these points. If the descriptor 20 does not contain wall width values but otherwise indicates that the point is a type that should have a width 224 value in detail formation table 100, the width of a nearby point from along the same wall can be used to generate the wall width for the current point. Generally, mark points at the end of walls have descriptor 20 values that contain wall width information. Once the axis of the current point is known, control circuitry can search forwards and backwards through the point order until it finds the two nearest defined points that have coded bearing values in their descriptor 20 that point toward the current point. These defined points should be located at the end of the wall on which the current point is located. If the width along the wall is uniform, the wall width values coded in the descriptor 20 of those points should be identical and can be used as the wall width value of the current point.

Figure 7:
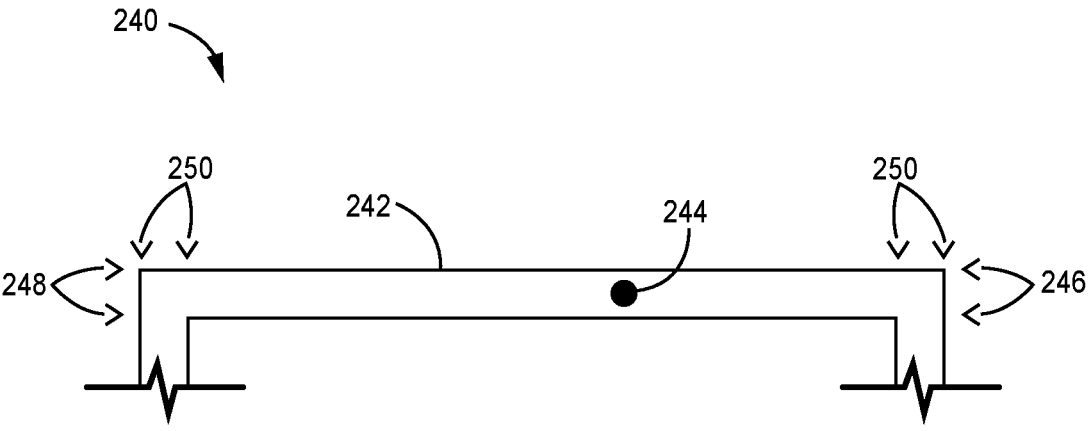
FIG. 7 is a top view of another example section of a floor plan showing layout marks.

FIG. 7 is a top view of floor plan section 240 having wall 242, which is a simple example that illustrates how points at the end of walls can be used to determine the width of a point along the same wall. Point 244 is located between the ends of wall 242. Mark 246 is pointed toward the western side of the build site and is located on the eastern end of wall 242. Mark 248 is pointed toward the eastern side of the build site and is located on the western end of wall 242. Thus, marks 246 and 248 at the ends of wall 242 both point toward point 244. Conversely, marks 250 point toward the relative south of the build site and do not point toward point 244. As the orientation that a mark is pointing is stored as bearing 220, control circuitry can be configured to find the points at the end of the wall by scanning through the point order until it locates a point with a "west" bearing 220 and a point with an "east" bearing 220. The control circuitry can confirm that those points have the same width value 224 and store that value as the width 224 for the current point. If the end points do not have the same width value 224, the control circuitry can be further configured to produce an error code indicating that either the defined point order is incorrect or one of the two end points has an incorrect descriptor 20.

Returning again to FIG. 3A, parsed descriptor 107 can also be used to generate the other values of detail data 106, including icon detail 280, icon position 282, primary/secondary information 284, point adjust 286, description 288, and display detail code 290, each of which will be described in more detail subsequently. Control circuitry can be configured to generate detail data 106 according to parsed descriptor 107.

Icon detail 280 contains a value which control circuitry can use to retrieve an icon that can communicate to an operator the layout mark that should be made at a given mark point. More specifically, the icon can convey the both the type and orientation of the layout mark that should be made on the build site. Icon detail 280 is derived from the parsed descriptor 107 for a given mark point. The icon can be displayed to an operator by, for example, a display or another user interface. The icon can display lines or shapes corresponding to layout marks and can be configured such that an operator can accurately mark the build site by imitating or copying the positions and orientations of the displayed layout marks onto the build site.

The value stored in icon detail 280 for a given mark point can be cross-referenced against one or more additional lookup tables to generate the icon for that mark point, allowing for less complex, non-graphical data to be stored as icon detail 280 in detail formation table 100. Control circuitry can be configured to automatically populate the icon detail 280 from the parsed descriptor 107 of a mark point. Further, if control circuitry recognizes that parsed descriptor 107 codes for multiple points and creates multiple mark points in detail formation table 100, the control circuitry can generate appropriate icon detail 280 values for each mark point.

Icon position 282 values are used to determine the location along a display at which icons encoded by icon detail 280 values should be displayed. To this extent, icon position 282 values are useful for placing icons on user interfaces capable of displaying icons at multiple locations. Like icon detail 280, if control circuitry recognizes that parsed descriptor 107 codes for multiple points and creates multiple mark points in detail formation table 100, the control circuitry can generate appropriate icon position 282 values for each mark point at substantially the same time. For systems capable of displaying an icon only at a single position, detail data 106 can omit icon position 282.

Icons are described variously herein as a method of communicating mark point information to an operator performing construction layout. It should be understood that icons are merely one method of conveying mark point information and that a variety of other methods, such as sound- or tone-based methods could also be employed. In those examples, icon detail 280 and icon position 282 can be replaced by appropriate entries for storing how mark point information should be communicated.

Primary/secondary information 284 encodes for whether a point is a primary point or a secondary point. As used herein, a primary point refers to a mark point where a layout mark should be made. A secondary point refers to an intermediate point that is useful for navigating to a primary point. Some secondary points are used only for navigations and layout marks are not made at those secondary mark points. However, in some examples, an operator can make layout marks at secondary points that are useful for wall line placement. Similarly, an operator can make a mark at a secondary point that is useful for intermediate markings between distant primary markings. In FIG. 3A, primary points are encoded in detail formation table 100 using the text "P" and secondary points are encoded in detail formation table 100 using the text "S," though any desired indicator can be used to distinguish between primary and secondary points.

As an example, mark points 294 and 296 of detail formation table 100 are related mark points derived from a single defined point with the descriptor 20 of "E1B," indicating a butt joint located along an exterior wall. As indicated by the axis 142 values, mark points 294 and 296 are located along an east-west extending exterior wall. Mark point 294 is a secondary point and mark point 296 is a primary point. As will be explained in more detail subsequently, different mark points can be activated selectively according to the bearing of the mark point. To this extent, the secondary mark point, which has a bearing 220 along the E/W axis, aids navigation of the E/W extending portions of the wall to the primary mark point 296, which has a south bearing 220.

As a further example, mark points 298 and 299 of detail formation table 100 are also related mark points derived from a single defined point having a descriptor 20 of "E1C," indicating an exterior wall corner. Like mark points 294 and 296, mark points 298 and 299 include all data (i.e., code parsing 102 and detail data 106 entries) stored in each respective row. Control circuitry can be configured to simultaneously display information for all mark points associated with the current defined point. Information for each mark point can be displayed as one or more icons. Mark points 298 and 299 are both primary points. Mark point 298 has a north bearing 220, indicating that the wall mark placed at mark point 298 points to the north and marks the north-extending wall. Mark point 299 has an east bearing 220, indicating that the wall mark placed at mark point 299 points to the east and marks the east-extending wall.

Where a user interface or display device can display more than one icon, icons for both primary and secondary points can be displayed simultaneously. In these examples, primary and secondary mark points can be indicated by different types of icons help operators quickly and efficiently distinguish primary points from secondary points. For example, the icons corresponding to a secondary point can be represented as a different color than icons corresponding to a primary point; icons corresponding to a secondary point can be represented with dotted lines while primary point icons are represented with solid lines; the secondary points can be translucent while the primary points can be opaque; etc.

Point adjust 286 is used to position a mark point relative to the coordinate information for the corresponding defined point. As mark points are derived from defined points, the location of a mark point can be described as relative to the coordinate position of the corresponding defined point. The position of a mark point can be determined by adjusting the coordinate location by the amount stored in point adjust 286 in the direction of the mark point bearing 220. A positive point adjust 286 adjusts the mark point in the direction of mark point bearing 220 and a negative point adjust 286 adjusts the mark point in the opposite direction of the mark point bearing 220. As an explanatory example, mark point 294 has a point adjust 286 of "−2" and a bearing of "N." Accordingly, the location of mark point 294 is two units to the south of the defined point coordinates.

In detail formation table 100, point adjust 286 includes values labeled as "exposed" and "concealed." These values indicate the desired amount of point adjust so that marks made at a mark point are exposed following construction layout or are concealed following construction layout. In some projects, it may be advantageous to have exposed layout marks, while in others it may be advantageous to have concealed layout marks. For example, a concrete floor may be the final surface for that building, unlike wood backers which are typically covered by another flooring. Some marking can stain the concrete. To ensure that the markings are not exposed when the build is complete, the point adjust 286 can cause the detail to be marked under the location of the finished wall. Alternatively, it can be advantageous to have exposed marks to allow the positions of the placed walls to be manually checked against the wall marks. Conversely, where the floor is not a finished surface, such as is often the case for wood bases, it can be advantageous for layout marks to be exposed following construction layout. Point adjust 286 can include separate values for exposed and concealed wall marks to allow an operator to dynamically switch between making exposed and concealed marks during construction layout. Similarly, parsed descriptor 107 can contain values that indicate a floor type and control circuitry can be configured to select the correct point adjust 286 based on the floor type. Alternatively, point adjust 286 can include only a single value for each mark point and an operator can select whether point adjust 286 values for exposed or concealed marks should be generated as a preference prior to performing construction layout.

In some examples, it may be advantageous for a layout mark to point in different directions based on the location of the wall mark relative to adjacent wall lines. For example, for orienting arrows 12 marking a butt joint along an exterior wall, it can be advantageous for the orienting arrows 12 to point toward the exterior wall lines disposed perpendicular to the corridor wall lines extending away from the butt joint. Consequently, it can be advantageous to reverse the bearing of the corresponding mark point entry in detail formation table 100 based on whether the mark should be made outside of or inside of the exterior wall lines. Control circuitry can be configured to recognize when the bearing 220 of a mark point should be reversed based on the desired point adjust 286 and automatically update the value stored in detail formation table 100.

Figure 8:
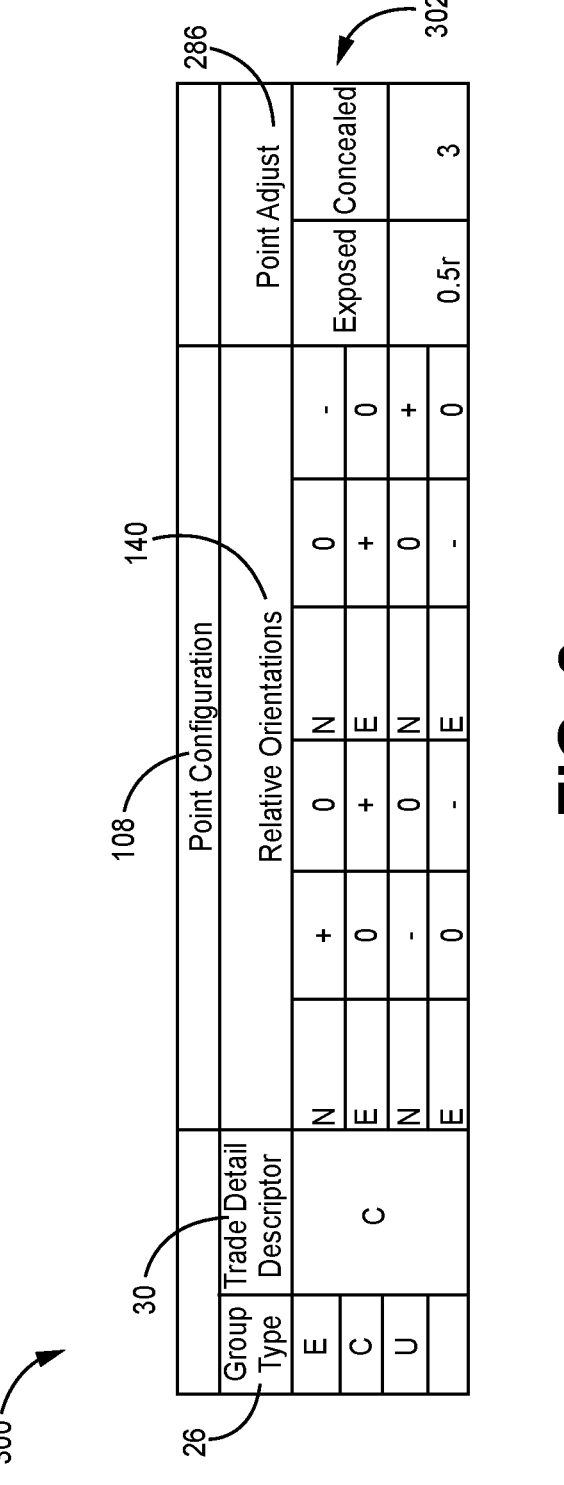
FIG. 8 is a schematic view of an example of a point adjust table.

Point adjust 286 can be derived from parsed descriptor 107, point configuration, or a combination of parsed descriptor 107 and point configuration. Point adjust 286 can also be adjusted or changed dynamically based on site conditions. For example, if the surface at the location of the mark point is rough, if there is a hole at the mark point location (e.g., if the mark point is located on an upper floor of a building at a position where a column will extend through the floor), if the mark point location is beyond an exterior of an upper or basement level of a building (e.g., if the mark point is located in the air adjacent to an upper level), or is a location otherwise unsuitable for making a layout mark, the value stored in point adjust 286 can be changed to adjust the offset of the mark point from the defined point such that the mark point can be located at a location suitable for making the layout mark. Further, one or more lookup tables can be cross-referenced to generate point adjust 286. FIG. 8 is a schematic diagram of an example of point adjust table 300, which can be cross-referenced to generate point adjust 286 values for detail formation table 100.

Point adjust table includes values group type 24, trade detail descriptor 30, and point configuration 108 data, which are cross-referenced by mark point data from detail formation table 100. Control circuitry can be configured to cross-reference the parsed descriptor 107 and point configuration 108 against the entries of point adjust table 300. Although point adjust table 300 is depicted in FIG. 8 as having only a single entry, it should be understood that point adjust table 300 can have multiple entries for a variety of point types.

Point adjust table 300 includes values for both exposed and concealed wall marks. As described previously, the correct point adjust 286 value can be selected from point adjust table 300 according to operator preference. Similarly, there can be examples of point adjust table 300 that do not include separate point adjust 286 entries for exposed and concealed marks. Rather, point adjust table 300 can be repopulated with the appropriate point adjust 286 values for exposed or concealed marks according to operator input prior to construction layout.

In some examples, it may be appropriate for mark points with different group types to have the same point adjust 286. In these examples, the trade detail descriptor 30 and point configuration 108 can be used to distinguish mark points needing different point adjust 286 values. Group type 24 of point adjust table can include multiple entries corresponding to different group types in order to increase the informational density of point adjust table 300.

In further examples, it may also be appropriate for mark points with similar relative orientations 140 to have the same point adjust 286. In these examples, similar relative orientations 140 can be grouped in point adjust table 300, increasing the density of point adjust table 300 and thereby improving the efficiency of cross-referencing point adjust table 300. Further, as grouping associated point configurations also decreases the overall number of point adjust 286 values stored in point adjust table 300, it likewise allows for point adjust 286 values to be changed (e.g., based on operator preference) more efficiently by decreasing the number of entries that need to be repopulated.

For example, entry 302 in point adjust table 300 includes multiple relative orientation 140 combinations. Each point configuration corresponds to an "acute" corner, wherein a line drawn in the direction of the facing from the vertex of the corner forms a 45-degree angle with each wall extending from the corner. Accordingly, a mark point having the parsed descriptor 107 of entry 302 and any of the point configurations 108 of entry 302 can be cross-referenced against entry 302. Based on operator preference for exposed or concealed wall marks, the appropriate point adjust 286 value from entry 302 can then be stored as point adjust 286 for the mark point in detail formation table 100.

Point adjust 286 values in point adjust table 300 can be stored as values or formulas. For example, the point adjust 286 value can be stored as a ratio of a component of a detail locating apparatus used for construction layout. In examples where it is advantageous for a mark point to be spaced from a defined point location according to a dimension of the detail locating apparatus used to locate the mark point, storing point adjust 286 as a ratio of a component of the detail locating apparatus allows point adjust table 300 to be more easily used with a variety of detail locating apparatuses having different dimensions. Rather than adjust all point adjust 286 values stored in point adjust table 300, exchanging detail locating apparatuses having different dimensions only requires the relevant dimension of the detail locating apparatus to be adjusted. Control circuitry can be configured to accept an operator input of the relevant dimensions of the detail locating apparatus being used and use the appropriate dimension to generate point adjust 286.

In point adjust table 300, the "concealed" point adjust 286 of entry 302 is stored as a value of "3," indicating that the mark point should be adjusted by 3 units relative to the coordinate position of the defined point. The "exposed" point adjust 286 of entry 302 is stored as a formula of "0.5r," here indicating that the amount of point adjust 286 should be a ratio of 0.5 of a radius or width of the detail locating apparatus used. Further, though entry 302 only shows a formula including a radius or width of a detail locating apparatus, this is merely a non-limiting example and other appropriate dimensions of a detail locating apparatus could also be used as the basis for a formula stored in point adjust table 300. For example, point adjust table 300 can contain a character that indicates that the point adjust should move the mark point in the opposite direction of the bearing.

Description 288 provides information that is not suitable for representation by an icon and is better represented via text, such as complex descriptions or error codes. During the generation of entries in detail formation table 100, control circuitry can perform various validations of each entry. For example, as described previously, control circuitry can validate point configuration 108 against parsed descriptor 107 and to produce an error code if the feature identified by parsed descriptor 107 is not represented in the point configuration 108 for that mark point. As a further example, control circuitry can be configured to produce an error code for parsed descriptor 107 combinations that are not recognized or for points that lack a parsed descriptor 107, which may occur as a result of errors in processing a floor plan into defined points. An error code can, for example, alert the operator to identify the joint manually from the floor plan in order to make any required wall marks. As yet a further example, control circuitry can be configured to generate a description 288 for a mark point with a valid parsed descriptor 107 and point configuration 108 combination in order to provide further clarifying detail to an operator making layout marks. Description 288 can be automatically populated by control circuitry and can be further configured to cause, for example, a user interface to display the text stored in description 288 in addition to or instead of any icons encoded in icon detail 280.

Detail display code 290 contains a value that can be used by control circuitry to select a mark point from one or more mark points associated with the current defined point. As described previously, an operator may manually select a given defined point as the "current" point for generating relative orientation 140 with match box generating table 130 or the current defined point may be automatically selected. The value stored in detail display code 290 corresponds to a type of operator input required to select one mark point where multiple mark points are associated with a given defined point. Control circuitry can cause icons and other information, such as navigation information for navigating to the mark point, to be selectively displayed for only the selected mark point, simplifying and increasing the clarity of the information communicated to the operator.

For example, it may be advantageous for an operator to navigate to a secondary point before navigating to a primary point, as secondary points can be used as navigational aids for navigating between two distant primary points. An operator can select the secondary point and, while the secondary point is selected, only information pertaining to the secondary point is communicated to the operator. After navigating to the secondary point, the operator can then select and navigate to the primary point.

In some embodiments, the type of operator input encoded by detail display code 290 corresponds to a particular physical manipulation of the detail locating apparatus being used for construction layout. For example, if the detail locating apparatus includes a vertically-extending pole with a radially-extending rotatable arm, detail display code 290 can encode a compass direction and an operator can select a mark point by rotating the rotatable arm to align with the encoded compass direction.

The information stored in detail data 106 of detail formation table 100 can be used to generate instructions that can be used by inexperienced operators and, in some examples, operators with no experience to perform construction layout. The instructions generated from information stored in detail formation table 100 can be used to navigate to mark points and further to determine the type and specific locations at which layout marks should be made. Experienced operators can also benefit from the instructions provided from data stored in a detail formation table 100. To this extent, systems using detail formation table 100 provide significant advantages to construction layout. Detail formation table 100 can provide similar advantages to other trade applications. Although detail data 106 has been discussed as including icon detail 280, icon position 282, primary/secondary information 284, point adjust 286, description 288, and display detail code 290, it should be understood that detail data can include additional information or omit any value described herein, including information specific to trade applications other than construction layout.

Figure 9:
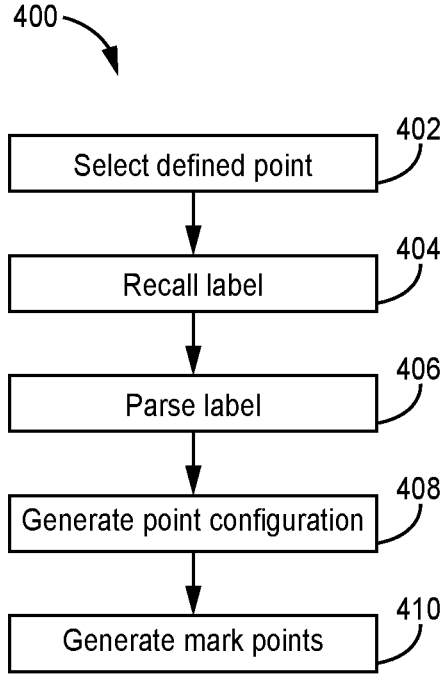
FIG. 9 is a flow diagram of an example of a method of generating a detail formation table.

FIG. 9 is a flowchart depiction of method 400, which is a method of generating a detail formation table such as detail formation table 100, described above. Method 400 includes sequential steps of selecting a defined point (step 402), recalling the descriptor for that defined point (step 404), parsing the descriptor (step 406), generating a point configuration (step 408), and generating mark points (step 410). Method 400 can be performed using a detail locating apparatus, including any detail locating apparatus described herein, such as detail locator 600 (FIGS. 11-13D, 15). Generally, the detail locating apparatus used with method 400 includes control circuitry capable of performing method 400 and a user interface capable of conveying information to an operator.

In step 402, a defined point is selected. The defined point can be selected from, for example, a defined point order such as defined point order 50 shown in FIG. 2. In some examples, the defined point can be selected by manual input from an operator, such as by input received at a user interface device. In other examples, the next defined point in a defined point order can be selected automatically once control circuitry detects that all mark points associated with the current defined point have been located and marked. For example, as method 400 is performed, control circuitry can measure the amount of time that an operator is near or at a defined point. After the reference point is at or near the mark point for a pre-defined amount of time approximating the amount of time required to make layout marks (which can be adjustable, e.g., to account for differences in marking speed for more or less experienced operators), control circuitry can be configured to automatically select the next defined point. The temporal threshold used to determine whether a layout mark has been made can be, for example, 5 seconds, 10 seconds, 15 seconds, or another suitable threshold value. As another example, control circuitry can be configured to switch defined points when the reference point is moved away from the current defined point according to the layout pattern. In such an example, a user can pick up the detail locating apparatus and begin moving on the job site, and such movement can cause the control circuitry to generate and begin displaying navigation instructions (such as via a user interface) for the subsequent mark point. In some examples where the next defined point is automatically selected, an operator can override the automatic switching and manually select a defined point.

In step 404, the descriptor for the defined point selected in step 402 is recalled. The descriptor is recalled from a stored defined point order, as described previously with respect to FIGS. 2B-3. In step 406, the recalled descriptor is parsed. Parsing the descriptor allows useful information, such as bearing 220 information, wall width 224, trade detail descriptor 30, or group type 20, from the descriptor to be extracted and stored in detail formation table 100, where it can be used by method 400 and other methods described herein. The descriptor can be parsed using, for example, code separation table 120 or another suitable method. The parsed descriptor can be stored in a detail formation table, such as detail formation table 100.

In step 408, a point configuration is generated. The point configuration is generated from the relative orientations of the current defined point, the previous defined point, and the next defined point. The point configuration can be used, for example, to determine bearing information for mark points associated with the defined point in combination with the parsed descriptor generated in step 406.

In step 410, mark point entries are generated in the detail formation table based on the parsed descriptor generated in step 406 and the point configuration information generated in step 408. Various elements of detail data can be based on the parsed descriptor, the point configuration, or both the parsed descriptor and the point configuration. For example, bearing information for the mark points can be based on both the parsed descriptor and the point configuration. Control circuitry can be configured to recognize point configuration and parsed descriptor combinations, make an appropriate number of entries in the detail formation table, and populate the entries created in the detail formation table. For example, a parsed descriptor can indicate that a defined point is a corner. Control circuitry can be configured to recognize that the defined point is a corner based on, for example, the parsed descriptor, the point configuration, or the bearing values determined from the point configuration and generate two mark points, each corresponding to one axis of the corner stored in the point configuration. Control circuitry can assign axis information to each mark point and can further populate the detail formation table with the appropriate detail data for each mark point, such as bearing information, primary and secondary point information, reference point information, icon information, and detail display code. Control circuitry can be programmed to recognize various point configuration and parsed descriptor combinations and populate detail data of the detail formation table accordingly. Alternatively, control circuitry can populate the detail formation table by cross-referencing the point configuration and parsed descriptor information with one or more lookup tables. For example, the control circuitry can populate point adjust information using the point adjust table 300, as described previously with respect to FIG. 8. As a specific example, the point adjust information for each mark point associated with a corner can be determined and used in combination with the mark point bearing information to generate a directional offset. The directional offset can be used by control circuitry in combination with the defined point location to generate a mark point location, which can be displayed by a user interface device. Other similar tables can be created for other values of detail data, such as wall width, and can be used by control circuitry to populate the detail formation table.

Where the detail formation table includes entries for wall width, the control circuitry can reference parsed descriptor information, such as trade detail descriptor 30, to generate a width for the mark point. Where the descriptor information for a defined point does not include a width, control circuitry can scan nearby defined points in the defined point order to find a width value that corresponds to the same wall as the current defined point and store that width value for mark points associated with the current defined point, as discussed previously with respect to FIG. 3A. As a specific example, control circuitry can be configured to use point configuration information and group type information to determine which defined points exist along the same wall line as the current defined point. A width value from a point along the same wall line can be used to determine the width of the wall at the current defined point and can be stored as the wall width for mark points associated with the current defined point.

Method 400 can be performed for each defined point in a defined point order. Accordingly, the size and contents of detail formation table vary according to the defined point order used to generate the detail formation table. Method 400 can also be performed alternatively prior to or substantially simultaneously with construction layout. Further, while method 400 has been generally described with respect to generating a detail formation table useful for building layout, it should be understood that method 400 can be used with a variety of trade applications, including but not limited to site-surveying, plumbing, metal stud framing, or cement masonry.

Figure 10:
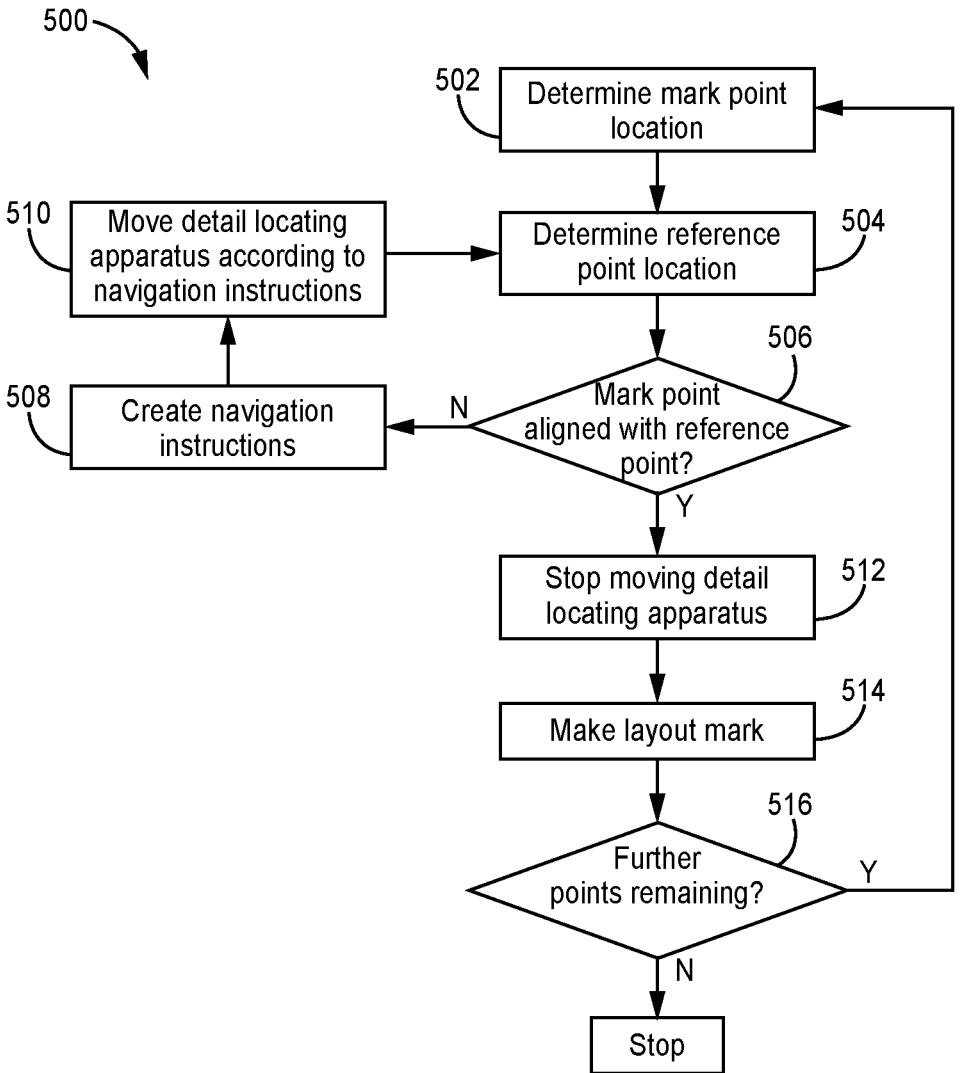
FIG. 10 is a flow diagram of an example of a method of locating a mark point.

FIG. 10 is a flowchart of method 500, which is a method of locating mark points using a detail locating apparatus. As used herein, "locating" a mark point refers to aligning the coordinate position of a reference point with the coordinate position of a mark point on a build site. Method 500 consists of steps of determining a mark point location (step 502), determining a reference point location (step 504), comparing mark point and reference point locations (step 506), creating navigation instructions (step 508), moving the detail locating apparatus (step 508), and stopping moving the detail locating apparatus (step 510). Like method 400 (FIG. 9), method 500 can be performed using a detail locating apparatus, including any detail locating apparatus described herein, such as detail locator 600 (FIGS. 11-13D, 15). Generally, the detail locating apparatus used with method 400 includes control circuitry capable of performing method 500 and a user interface capable of conveying information to an operator.

In step 502, the location of a mark point is determined. As described previously the coordinate location of a mark point can be offset by a known amount from a given defined point. Control circuitry performing method 500 can recall the appropriate offset for a given mark point, recall the coordinate position of the associated defined point, and generate the coordinate position of the mark point by adjusting the coordinate position of the relevant defined point according to the offset. For example, control circuitry can recall point adjust 286 from detail formation table 100 for a mark point and recall the coordinate position of the associated defined point from defined point order 50. The control circuitry can adjust the stored northing-easting coordinate position of the stored point by the amount stored in point adjust 286 in the direction of bearing 220 to generate the coordinate position of the mark point. The amount of offset can be adjusted based on user preference or operational needs. For example, if the surface at the location of the mark point is rough, if there is a hole at the mark point location (e.g., if the mark point is located on an upper floor of a building at a position where a column will extend through the floor), if the mark point location is beyond an exterior of an upper or basement level of a building (e.g., if the mark point is located in the air adjacent to an upper level), or is a location otherwise unsuitable for making a layout mark, the value stored in point adjust 286 can be changed to adjust the offset of the mark point from the defined point such that the mark point can be located at a location suitable for making the layout mark. Generally, the offset of mark points is only adjusted in along an axis according to the bearing 220 of the mark point in order for the mark made at the layout mark to be aligned with the appropriate wall line(s). As such, if the physical location of the mark point is unsuitable for making a layout mark, the location of the mark point is only adjusted according to direction of the bearing 220 and not along any other direction. As a specific example, the location a mark point having a north bearing 220 can be adjusted along a north-south extending axis that extends through the defined point location, but cannot be adjusted along an east-west extending axis. This principle is discussed in more detail subsequently with respect to FIG. 13F. After the coordinate position of the mark point is calculated, it can be stored for further use with method 500.

In step 504, the location of a reference point is determined. As described previously, a reference point is a point associated with the detail locating apparatus and can be used for navigating to a mark point. A reference point can be a point along the detail locating apparatus or a point at a known distance relative to a measured position of the detail locating apparatus. Control circuitry performing method 500 can reference, for example, reference point 222 of detail formation table 100 to determine the appropriate offset of the reference point from the detail locating apparatus. The position of the detail locating apparatus can be measured, for example using the system depicted in FIG. 12. Once the position of the detail locating apparatus is known, the coordinate position of the reference point can be calculated by adjusting the measured position of the detail locating apparatus according to the appropriate offsets. It should be understood that various offsets are available and that the amount of offset depends on the detail data for a given mark point as well as the detail locating apparatus used. After the coordinate position of the reference point is calculated, it can be stored for further use with method 500.

In step 506, the coordinate positions of the reference point and the mark point are compared. A mark point is located when the coordinate positions of the reference point is aligned with the coordinate position of the mark point. Comparing the coordinate positions of the mark point and the reference point can indicate whether the mark point and reference point are aligned. For example, in a northing-easting coordinate system, the northing and easting values of the reference point can be subtracted from the northing and easting values of the mark point. The resultant northing and easting values provide a relative northing-easting distance at which the mark point is located relative to the reference point. If resultant northing and easting values are "0," the reference point and mark point are aligned and step 512 is performed. If the resultant northing and easting values are not "0," the values are stored and steps 508 and 510 are performed.

As the coordinate values created by subtracting the coordinate position of the reference point from the coordinate position of the mark point indicate relative distances, a negative northing value indicates that the point is to the relative south and a positive northing value indicates that the point is to the relative north. Similarly, a negative easting value indicates that mark point is to the relative west while a positive easting value indicates that the mark point is to the relative east. The magnitude of the relative northing and easting values indicate the number of units which the mark point is spaced from the reference point and can accordingly be used to navigate to the mark point. The relative distance values generated in step 506 can be stored for further use with method 500.

In step 508, navigation instructions are created. The navigation instructions can be communicated to and used by an operator to allow that operator to locate a mark point. In some examples, step 508 is performed by displaying the relative distance values generated in step 506, allowing an operator to understand the directions and distances that the operator must move to align the reference point with the mark point. In other examples, the relative distances generated in step 506 can be converted to a vector. The magnitude and direction of the vector can be displayed to an operator to simplify the navigation from the current location of the reference point to the location of the mark point. In step 510, the detail locating apparatus is moved according to the navigation instructions and in the direction of the mark point, such that the relative distance between the mark point and the reference point is reduced.

Steps 504-510 can be performed iteratively until the coordinate positions of the mark point and reference point are aligned. In some examples, the mark point and reference point are considered to be aligned when they have the same coordinate position, such that the relative northing and easting values generated in step 506 are each "0." In other examples, the mark point and reference point may be considered to be aligned when the distance between the mark point and reference point are below a particular threshold. Control circuitry performing method 500 can be configured to recognize when the reference point and mark point are aligned and communicate to an operator that the reference point and mark point are aligned.

Step 512 is performed when the reference point is aligned with the mark point, such that the mark point has been located according to steps 502-10. In step 512, movement of the detail locating apparatus is ceased. In step 514, an operator can make appropriate layout marks at the location where the detail locating apparatus is positioned. Method 400 can be performed simultaneously to method 500, and detail data generated in 410 can be used to retrieve an icon or other information that can be displayed to an operator in order to communicate which layout marks should be made and the precise locations at which they should be made.

After step 512, the mark point can be flagged as located in, for example, detail formation table 100 or a memory associated with control circuitry performing method 500. In step 516, method 500 is repeated if there are mark points stored in detail formation table 100 that have not been located. The next mark point can be manually selected for locating by user input at the detail locating apparatus or can be automatically selected by control circuitry. If all mark points in detail formation table 100 have been located, method 500 is stopped.

In some examples, the navigation instructions created in step 508 and, accordingly, navigation in step 510 can be segmented into two stages, with each stage corresponding to movement along a single compass direction. In the first stage of navigation, the navigation instructions can direct an operator to navigate along a first, wall axis parallel to the wall line to which the mark point is adjacent. The navigation instructions direct the operator to navigate along the wall axis until the detail locating apparatus is moved to a position overlapping a second, bearing axis perpendicular to the wall axis and extending through the position of the mark point. The bearing axis extends in the direction of the bearing 220 value determined for the mark point and, as described with respect to step 502, the position of the mark point along the bearing axis can be adjusted based on user preference or operational needs. Once the detail locating apparatus is proximate to or overlapping the bearing axis, the second stage of navigation is performed by moving the detail locating apparatus along the bearing axis to the position of the mark point. In some of these examples, it may be sufficient that detail locating apparatus is in a position proximate to the bearing axis for the second stage of navigation to be performed. As a mark point is offset from a defined point according to the direction of the bearing, the wall and bearing axes can intersect at the location of the defined point, such that an operator first navigates along the wall axis to the defined point location and then navigates from the defined point location along the bearing axis to the mark point location.

In examples using two-stage navigation, the navigation instructions can further include separate icons for each stage of navigation. Using multiple icons can more clearly communicate to an operator which stage of navigation is being performed. For example, in the first stage a line-shaped icon can be displayed at a position overlapping the wall axis, allowing an operator to easily navigate along the wall axis by the displayed position of the line icon. In the second stage, arrow- or chevron-shaped icons can be displayed that indicate the relative direction and distance at which the mark point is positioned along the bearing axis.

Advantageously, two-stage navigation increases the ease with which an operator can adjust the location of the mark point relative to the defined point. Specifically, segmenting navigation into two steps can allow an operator to more clearly visualize the direction in which the mark point is offset from the defined point and, accordingly, more accurately adjust the location of the mark point along the bearing axis. As the mark point is offset from the defined point along the bearing axis, segmenting navigation into two steps can allow an operator to more clearly visualize the direction in which the mark point is offset to avoid, for example, rough surfaces or other areas unsuitable for making layout marks, such as holes, gaps, or other floor openings.

Methods 400 (FIG. 9) and 500 (FIG. 10) provide significant advantages. Method 400 allows for the creation of mark point detail data from a defined point descriptor and a point configuration for a given defined point. Method 400 can be performed in an automated manner by control circuitry for all defined points of a given floor plan, greatly reducing the need for operator experience in interpreting defined point descriptors on a build site. The detail data produced by method 400 also eliminates the need to make manual measurements to accurately place layout marks, improving efficiency with which construction layout or other trade techniques can be performed without requiring advanced operator experience. Method 500 allows for the automatic creation of navigation instructions that improve the efficiency with which mark points can be located. Further, the navigation instructions produced by method 500 eliminate the need for many manual measurements that are currently required to locate mark points, significantly reducing the operator experience required to perform construction layout. Method 500 can also be adapted to be used to determine the location of points along a site useful for other trade applications, providing a greater degree of versatility than other existing techniques.

For example, methods 400 and 500 can be used by a site survey technician to set pins for forming a radial curb. Specifically, method 400 can be used to define point data for the radial curb and method 500 can be adapted to allow an operator to navigate to the radial curb and further to navigate along the radial curb. Method 400 can be repeated multiple time to create points defining the entire radial curb or, alternatively, method 400 can be performed to create a single point along the radial curb and the remainder of points can be determined based on the desired radius and length of the curb. For example, a user interface device can display a line when overlapping or overlaid on the position where the radial curb should be marked. The line can mimic the position of the proper location for the radial curb as well as the proper curvature for the radial curb. As an operator moves the user interface to a new position along the curb, the user interface can update the displayed line to display the proper position and curvature of the curb below the new position of the user interface. The icon can be dynamically-updated such that the icon always reflects the correct location and curvature of the curb as an operator moves. In this manner, methods 400 and 500 allow an operator to continuously navigate a radial curb using a dynamically-updating icon that displays the radius and curvature of the curb. An operator can mark the curb according to the displayed positions of the icon and can also check the position of a marked curb using the displayed icon.

Detail Locating Apparatuses and Related Methods

Figure 11:
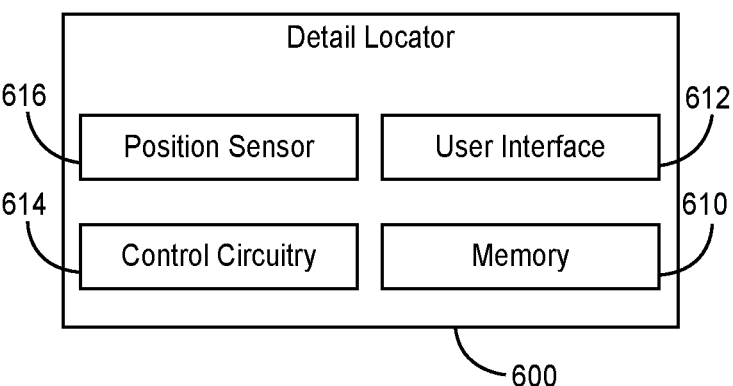
FIG. 11 is a block diagram of a detail locating apparatus according to an example of the present invention.

FIG. 11 is a block diagram of detail locator 600. Detail locator 600 is one example of a detail locating apparatus and can be used with detail formation table 100 and methods 400 and 500 to locate mark points and accurately place layout marks on a build site. Detail locator 600 includes memory 610, user interface 612, control circuitry 614, and orientation sensor 616.

Detail locator 600 is configured to perform any of the functions discussed herein, including receiving an output from any sensor referenced herein, detecting any condition or event referenced herein, and controlling operation of any components referenced herein. Control circuitry 614 can include hardware, firmware, and/or stored software. Control circuitry 614 can be of any suitable configuration for controlling operation of detail locator 600, including gathering data, processing data, etc. Control circuitry 614 can include one or more of a microprocessor, a controller, a digital signal processor (DSP), an application specific integrated circuit (ASIC), a field-programmable gate array (FPGA), or other equivalent discrete or integrated logic circuitry. Control circuitry 614 can be entirely or partially mounted on one or more boards. Control circuitry 614 can be of any type suitable for operating in accordance with the techniques described herein. In some examples, control circuitry 614 can be implemented as a plurality of discrete circuitry subassemblies.

Memory 610 can be configured to store information within detail locator 600 during operation. Memory 610, in some examples, can be described as a computer-readable storage medium. In some examples, a computer-readable storage medium can include a non-transitory medium. The term "nontransitory" can indicate that the storage medium is not embodied in a carrier wave or a propagated signal. In certain examples, a non-transitory storage medium can store data that can, over time, change (e.g., in RAM or cache). In some examples, memory 610 can include temporary memory, meaning that a primary purpose of the computer-readable memory is not long-term storage. Memory 610, in some examples, can be described as a volatile memory, meaning that the memory does not maintain stored contents when electrical power to the controller is removed. Examples of volatile memories can include random access memories (RAM), dynamic random-access memories (DRAM), static random-access memories (SRAM), and other forms of volatile memories. In some examples, memory 610 can be used to store program instructions for execution by one or more processors of the controller. For instance, memory 610 can be used by software or applications executed by the control circuitry 614 to temporarily store information during program execution. In some examples, memory 610 includes non-volatile storage elements. Examples of such non-volatile storage elements can include magnetic hard discs, optical discs, floppy discs, flash memories, or forms of electrically programmable memories (EPROM) or electrically erasable and programmable (EEPROM) memories.

User interface 612 can be an input/output device configured to provide and/or receive information from the user. User interface 612 can be of any form that enables operator interaction with control circuitry 614. For example, detail locator 600 can implement a graphical user interface displayed at a display device of user interface 612 for presenting information to and/or receiving input from an operator. User interface 612 can include graphical navigation and control elements, such as graphical buttons or other graphical control elements presented at the display device. User interface 612, in some examples, includes physical navigation and control elements, such as physically actuated buttons or other physical navigation and control elements. User interface 612, in some examples, includes audio elements, such as a microphone and/or speakers, to facilitate audio communication with the operator. User interface 612 can include one or more of any input and/or output devices and control elements that can enable operator interaction with detail locator 600. User interface 612 can extend radially relative to a vertical axis of detail locator 600. For example, the user interface can extend radially relative to a support base. The radially extending display can be one or more arms, one or more rotatable arms, or an annular disc, among other options.

Orientation sensor 616 is associated with detail locator 600 and is configured to generate and provide orientation data to control circuitry 614. Orientation sensor 616 is configured to determine the orientation of detail locator 600 relative to the relative north of the build site. The orientation sensor can be, for example, a magnetometer or another type of orientation sensor, such as an accelerometer or an inertial measurement unit. Where positions sensor 616 is a magnetometer, orientation sensor 616 measures the direction of magnetic north. The measured magnetic north data can be used to generate a baseline from which the relative site north can be defined based on a known offset between magnetic north and the relative site north. The orientation of detail locator 600 relative to the relative site north can thereby be generated. The orientation information can be used, for example, to determine the orientations of icons displayed by user interface 612 or to display information about the proper orientation of detail locator 600 for making a layout mark.

In examples where the orientation sensor 616 is a magnetometer, various objects on the build site can interfere with magnetometer measurements. For example, the presence of a relatively large amount of a ferric material, such as rebar, can decrease the ability of the magnetometer to make accurate measurements. When the magnetometer is unable to effectively measure true north, detail locator 600 can indicate to an operator via user interface 612 that the magnetometer should be recalibrated or, if recalibration fails to improve magnetometer error, to make manual measurements, such as by using an on-screen ruler displayed by user interface 612.

User interface 612 includes a display that provides information to the user during construction layout. For example, the display can provide visual icons to facilitate navigation about a job site and placing of layout marks (e.g., orienting arrows 12, control marks 13, angled wall marks 14, etc.) on the job site. In some examples, the display can be transparent or translucent, similar to a heads-up display. The transparent or translucent display can function as the user interface and an operator can mark icons at the job site directly below the transparent display, increasing the overall accuracy with which an operator can make layout marks on the build site. The transparent or translucent display can be utilized on an arm, an annular display, or a display having any other desired shape.

Memory 610 can be encoded with instructions that, when executed by control circuitry 614, cause detail locator 600 to operate in accordance with techniques described herein. For example, memory 610 can store instructions for obtaining and storing defined point descriptor 20 for a given defined point. Defined point descriptor 20 can be obtained by, for example, collecting human-readable data from a user interface 612 displaying defined point coordinate data and data regarding defined point descriptor 20 and converting that human-readable data to computer-readable data. The computer-readable data can be stored on memory 610. For example, control circuitry 614 can utilize a screen scraping technique to obtain the coordinate information and defined point descriptor 20 for each defined point.

Converting human-readable data to computer-readable data allows the data to be used by other programs or instructions while also allowing the human-readable data to be readily available to the user for, for example, error-checking. After the data is converted, the computer-readable defined point descriptor can be parsed by control circuitry 614 to generate detail data information and coordinate information for mark points to be located by an operator using detail locator 600, as discussed in more detail below. Control circuitry 614, for example, can parse the defined point descriptor 20.

In operation, detail locator 600 is used to locate mark points associated with individual layout marks. Detail locator 600 is further utilized to make the layout marks on the build site that are associated with the mark points. As defined previously herein, a mark point is a point associated with detail to be located on a build site that is positioned relative to a defined point. The mark point is located relative to where one or more layout marks should be made on the build site. Each of defined points and mark points are virtual points while the layout marks can be physically marked on the build site. Detail locator 600 can be configured to locate mark points, rather than defined points DP, to accurately provide the relative locations of layout marks on a build site. As each defined point of a given building plan can be associated with more than one layout mark, each defined point DP can also be associated with more than one mark point. For example, a defined point on an exterior wall defining a corner can be associated with two mark points, each corresponding to the location where individual layout marks should be made on the build site for the two walls extending from that corner. As another example, a defined point on a corridor partition defining the intersection of perpendicular partitions having different widths can be associated with three mark points. A defined point defining a window or door may be associated with four or more mark points. The defined point descriptor 20 of a given defined point can be used (e.g., by control circuitry) to determine the number, type, and location of the mark points associated with the defined point, as described previously with respect to FIGS. 3A-10.

Figure 14A:
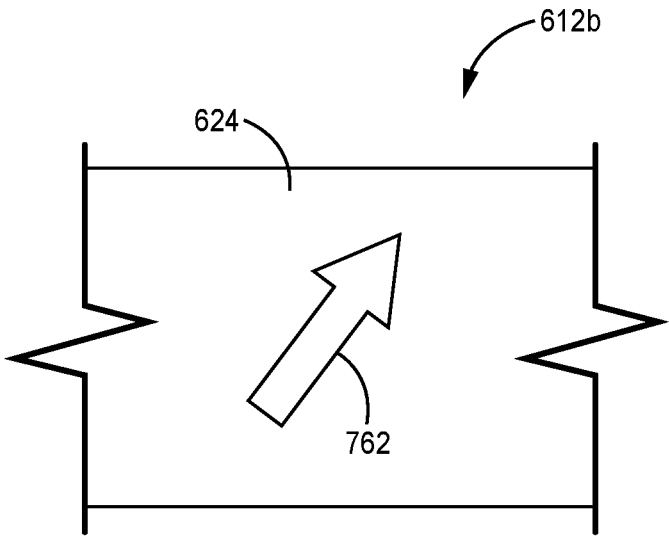
FIG. 14A is a top view of a section of the layout mark locator shown in FIG. 14B showing an example of a general navigation icon.
Figure 14B:
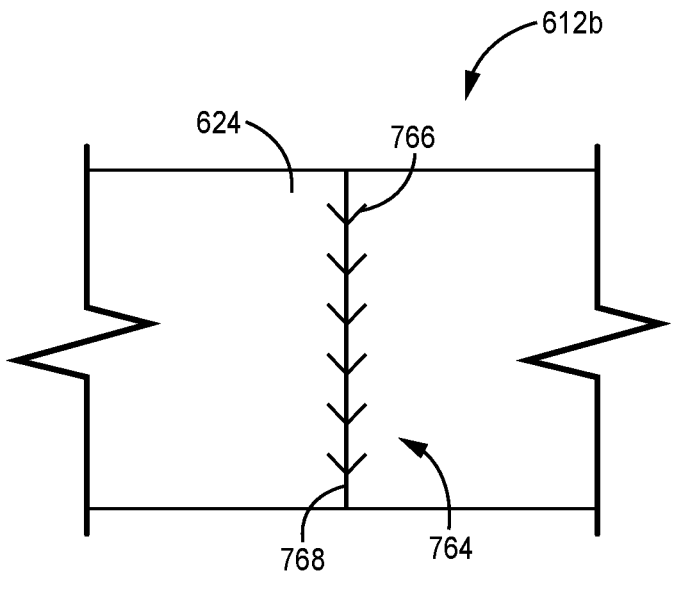
FIG. 14B is a top view of a section of the layout mark locator shown in FIG. 14B showing an example of a fine navigation icon.

User interface 612 is configured to display navigation instructions that allow an operator to navigate to a mark point from a reference point, as described previously with respect to method 500 (FIG. 10). The navigation instructions can be displayed as one or more navigation icons, such as a general navigation icon or fine navigation, as described subsequently in more detail (FIGS. 14A-B). The reference point can be associated with different portions of the detail locator 600 depending on the type of mark point being located. The reference point is established by the control circuitry 614 based on data in a detail formation table, such as detail formation table 100 (FIG. 3A). Each mark point can have a unique reference point to navigate to the mark point. The location of detail locator 600 on the job site can be determined using, for example, a prism associated with detail locator 600 and electronic surveying equipment, as discussed in more detail with respect to FIG. 12. Alternatively, the location of detail locator 600 can be determined using global-positioning system (GPS) information or global navigation satellite system (GNSS) information. In these examples, detail locator 600 can include navigation circuitry configure to generate location information regarding detail locator 600. detail locator 600 In all examples, the position of the reference point can be updated by frequent or continuous position measurements to allow displayed navigation instructions to be continuously updated, increasing the accuracy with which detail locator 600 can be used to locate a mark point.

After the mark point has been located, such as by aligning the reference point with the mark point, the operator can mark the build site with the proper layout mark for that mark point. For example, detail locator 600 can display one or more detail icons via user interface 612. The detail icons each represent a single mark point and provide information regarding the layout mark that should be made at the physical location of the mark point. An operator can use information represented by the detail icons displayed by detail locator 600 to make the layout marks at appropriate locations on the job site.

Once the detail for the current mark point is marked, the next mark point can be selected for navigation. The next mark point can be manually selected for locating by user input at the detail locating apparatus or can be automatically selected by control circuitry Manual selection allows an operator select the next mark point via input at user interface 612 of detail locator 600 via user interface 612. Automatic selection allows control circuitry 614 to display information for the next mark point without input from the operator. More specifically, control circuitry 614 can be configured to recognize when the current mark point has been located and to begin displaying information corresponding to the next mark point based on, for example, a time threshold or based on position data determined using total station 654 and EDM signal 676. In some examples, an operator can override automatic selection for one or more points by input at user interface 612.

Detail locator 600 can be configured to dynamically update the icons displayed by user interface 612 during operation. For example, detail locator 600 can alter the relative orientation of an icon, alter the position of the icon relative to and/or on user interface 612, and/or alter the icons displayed as, for example, detail locator 600 is moved about the build site and/or relative to relative north of the build site. As the operator's distance from the mark point changes, different icons can be displayed to assist in locating the mark point. For example, detail locator 600 can display navigation instructions as a general navigation icon until the operator reaches a threshold locating distance from the relevant mark point, at which point detail locator 600 can display a fine navigation icon. As used herein, a general navigation icon refers to an icon used to navigate a relatively long distance (e.g., more than 12 inches) across a build site to a mark point. Fine navigation icons, conversely, are used navigate relatively short distance to a mark point. General navigation icons provide more general or coarse navigation information than fine navigation icons, which will be discussed subsequently, and especially with respect to FIGS. 14A-B. General navigation icons are used to navigate to a mark point by providing navigation instructions for moving to the mark point. General navigation icons can be, for example, vectors indicating the relative direction to a relevant mark point. The general navigation icon is oriented to guide the operator to align the reference point with the relevant mark point. Fine navigation icons, like general navigation icons, function as vector indicators that convey the location of a mark point and represent orientation and magnitude information corresponding to the direction and distance, respectively, to the relevant mark point. A fine navigation icon can be selectively displayed by detail locator 600 when the reference point is within a threshold locating distance of the mark point. For example, fine navigation icons can be selectively displayed when the reference point is within 12 inches (30.48 cm) or fractions of an inch of an associated mark point. Alternatively, a fine navigation icon can be displayed by detail locator 600 continuously during the process of navigating to mark points Once the operator has located a mark point by moving detail locator 600 such that the reference point is aligned with the mark point, detail locator 600 can cease displaying general or fine navigation icons and can instead display a detail icon. Detail icons convey detail information corresponding to the relevant mark point. Detail icons provide information to the user regarding the layout marks to be marked on the build site, as discussed in more detail below.

In some examples, detail locator 600 can provide audio navigation through an audio component of user interface 612. For example, detail locator 600 can emit navigational beeps that are closer together the closer that the reference point is to the mark point and can emit a solid tone when the reference point and mark point are aligned. Using audio cues to locate a mark point can improve, for example, redundancy in locating mark points. Alternatively, audio-based navigation allows a display element of user interface 612 to display information unrelated to navigation.

Detail locator 600 provides significant advantages. Previously, an operator needed sufficient experience and expertise to be able to determine the locations of details on the building site. For example, in previous techniques, a team of at least two operators navigated between and measured distances between points by hand, such as with the floor plan and a tape measure. Similarly, existing techniques also work poorly on job sites having holes, gaps, or other floor openings. Detail locator 600 allows a single operator to quickly and efficiently navigate between points and mark detail regarding the points on the construction site. Detail locator 600 simplifies the layout process and provides detail data directly to the operator. Further, detail locator 600 can provide the detail data as simplified icons, which will be described in more detail subsequently, such that the single operator does not require expertise in reading and interpreting floor plans to effectively perform construction layout. Detail locator 600 generates navigational information and navigates the user to the relevant mark points on the job site. Detail locator 600 further generates and displays detail icons that inform the user of the type, orientation, and location of the layout marks to be made on the job site, removing user uncertainty, increasing user confidence, and providing more accurate and consistent layout on build sites.

Figure 12:
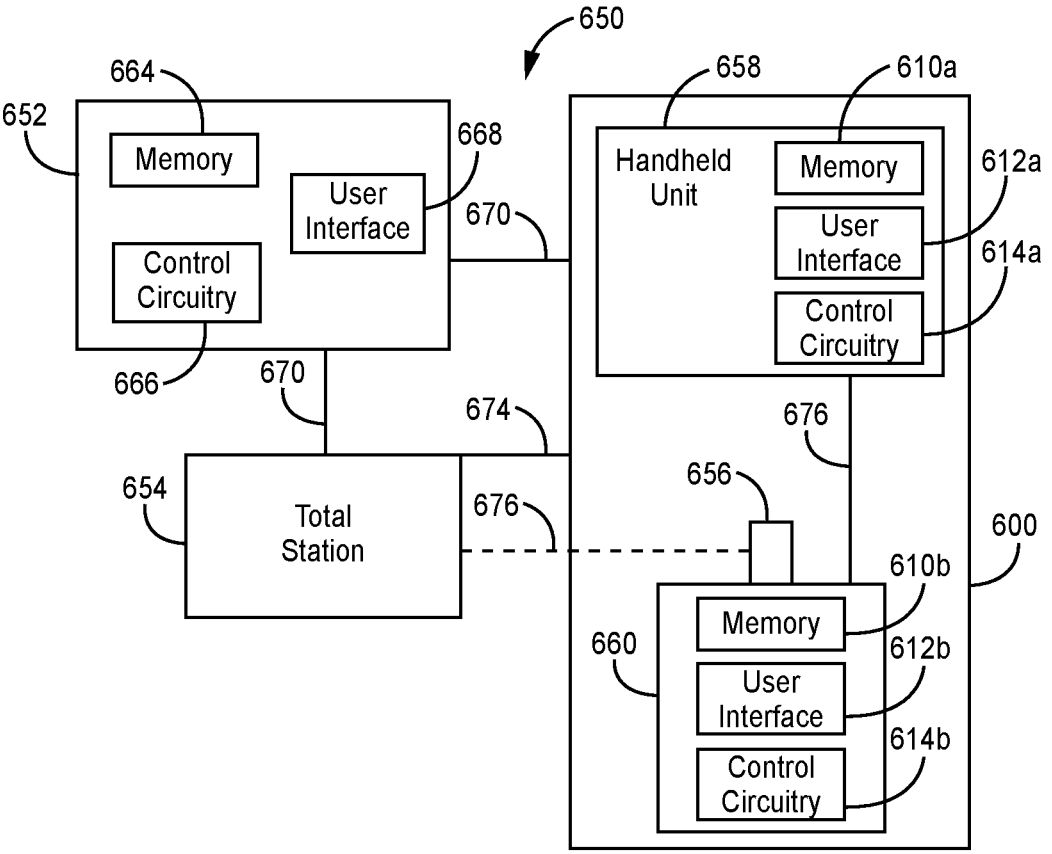
FIG. 12 is a block diagram of a system for performing construction layout according to an example of the present invention.

FIG. 12 is a block diagram of system 650 for generating and locating mark points and marking layout marks during construction layout. System 650 can be configured to perform any method described herein. System 650 can also be used convert a floor plan, such as floor plan 10, to full size for use during construction layout. System 650 includes detail locator 600, computer 652, total station 654, and prism assembly 656. Detail locator 600 includes handheld unit 658 and layout mark locator 660. Computer 652 includes memory 664, control circuitry 666, and user interface 668. Handheld unit 658 includes memory 610*a*, user interface 612*a*, and control circuitry 614*a*. Layout mark locator 660 includes memory 610*b*, user interface 612*b*, and control circuitry 614*b*. Memories 610*a*, 610*b* can together form memory 610 (FIG. 2) of detail locator 600 and can together or individually perform any of the functions of memory 610. Control circuitries 614*a*, 614*b* can together form control circuitry 614 of detail locator 600 and can together or individually perform any of the functions of control circuitry 614. User interfaces 612*a*, 612*b* can together form user interface 612 of detail locator 600 and can together or individually perform any of the functions of user interface 612.

Computer 652 can be disposed remote from other components of system 650 and communicate with other components in any desired manner. Computer 652 can be any type of computing device, such as a portable computing device (e.g., smart phone, tablet computer), a personal computer (e.g., desktop computer, laptop computer), a cellular network, or a server, amongst other options. Memory 664 can be encoded with instructions that, when executed by control circuitry 666, cause computer 652 to operate in accordance with techniques described herein. Memory 664, for example, can store a floor plan, such as floor plan 10, and software for converting the floor plan for use in construction layout. Control circuitry 666 can execute the software to establish wall lines WL and to generate defined points DP at desired locations on the floor plan. The control circuitry 666 can assign a description, such as defined point descriptor 20, to each defined point based on the location of the defined point, the nature of the wall 16 that the defined point lies on, and the nature of any walls extending from the defined point. User interface 668 allows an operator to manipulate the floor plan, such as to assign relative north. The control circuitry 666 can also determine a defined point order based on the defined points DP established.

The defined point data generated by computer 652 can be uploaded from memory 664 to total station 654 and/or detail locator 600 (e.g., to handheld unit 658 and/or layout mark locator 660). For example, the floor plan data can be provided through communication links 670 or in any other desired manner. Communication links 670 can be wireless or wired connections. In some examples, the converted floor plan can additionally or alternatively be stored on removable memory, such as a flash drive, to provide the defined point data from memory 664 to total station 654 and/or detail locator 600.

Total station 654, which can also be referred to as an electronic surveying device, is surveying equipment that is configured to determine the location of detail locator 600 by determining the location of prism assembly 656. Total station can measure the position of detail locator 600 by an electronic distance measurement (EDM) signal 676. Total station 654 can include an electronic transit and electronic distance measuring device and can accurately determine angles and distances from the total station. To allow for measurement of the position of detail locator 600, detail locator 600 can include, for example, a prism assembly 656 operable with total station 654. EDM signal 676 can be a modulated infrared carrier signal generated by total station 654 and reflected by prism assembly 656. As described previous, the location of detail locator 600 can also be determined using GPS or GNSS information. In these examples, total station 654 can be omitted from system 650.

In the example shown, detail locator 600 includes handheld unit 658 and layout mark locator 660 that can operate in conjunction to generate mark point data and populate a detail formation table, generate and display navigational data, generate and display icons for construction layout, etc. In the example shown, handheld unit 658 is configured to communicate with total station 654 and/or layout mark locator 660 during operation. Handheld unit 658 can receive a converted floor plan from computer 652 and/or total station 654. Handheld unit 658 can receive information regarding the location of layout mark locator 660 from total station 654. Handheld unit 658 can provide information to layout mark locator 660 to cause layout mark locator 660 to display relevant detail and marking information to the operator based on the determined location of layout mark locator 660 and the known location of the relevant defined point.

Handheld unit 658 is shown as including memory 610*a*, control circuitry 614*a*, and user interface 612*a*. Handheld unit 658 can be of any type suitable to store software, implement functionality, and/or process instructions. Handheld unit 658 is configured to perform any of the functions discussed herein, including receiving an output from any sensor referenced herein, detecting any condition or event referenced herein, and controlling operation of any components referenced herein. Handheld unit 658 can include hardware, firmware, and/or stored software. Handheld unit 658 can be a tablet, smartphone, or other handheld device configured to communicate with total station 654.

Reference points can be associated with various portions of layout mark locator 660 for mark point navigation according to, for example, method 500 (FIG. 10). For example, layout mark locator 660 can include a base and user interface 612*b* can extend radially from the base and include a display to visually provide data to the user, such as the example of layout mark locator 660 discussed in greater detail subsequently with respect to FIGS. 13A-F. Prism assembly 656 can be mounted to the base and extend vertically from the base. User interface 612*b* can be formed as one or more arms that extend from the base, formed as an arcuate or annular display extending from the base, or formed in any other desired manner. The reference point can be associated with the base or with a location along user interface 612*b*.

In operation, the operator can control total station 654 with handheld unit 658. For example, handheld unit 658 can communicate directly with total station 654 through communication link 672. Communication link 672 can be a wireless or wired connection. The operator instructs total station 654 to locate layout mark locator 660. Total station 654 can locate layout mark locator 660 and determine a position of layout mark locator 660 with electronic distance measurement (EDM) signal 676.

Total station 654 can periodically or continuously determine the location of layout mark locator 660 and thereby periodically or continuously provide information to update the location of the reference point used to determine relative distance and thereby update go-to information for a given mark point. The reference point can be associated with layout mark locator 660 and layout mark locator 660 can be configured to display navigational and layout mark information to the user via user interface 612*b*. Control circuitry, such as control circuitry 614*a*, 614*b*, can use the updated reference point information obtained from total station 654 to update navigation instructions and navigation icons displayed by user interface 612*b* in real-time, increasing the efficiency and accuracy with which the operator is able to locate a mark point.

Handheld unit 658 can also aid in operation of layout mark locator 660. Layout mark locator 660 can send information to and receive information from handheld unit 658 via communication link 674. Communication link 674 can be a wireless or wired connection. Handheld unit 658 can be configured to perform various operations to aid in the operation of layout mark locator 660. For example, memory 610*a* can store instructions for obtaining and storing defined point descriptor 20 for a given defined point. For example, control circuitry 614*a* can be configured to perform a screen-scraping function to gather human-readable defined point descriptors 20 from handheld unit 658. Control circuitry 614*a*, 614*b* can be configured to convert the screen-scraped data into computer-readable information for use in generating detail formation tables, such as detail formation table 100 (FIG. 3A), and other relevant information. Further, handheld unit 658 can, for example, obtain the human-readable defined point descriptor 20 information from computer 652 via communication link 670. The computer-readable data can be stored on memory 610*a*, 610*b*. As another example, user interface 612*a* can be used to select the current defined point and/or the current mark point to be located using detail locator 600. User interface 612*a* of handheld unit 658 can also provide information about a particular mark point to an operator, including go-to information for reaching mark point or detail information describing a wall mark as text or as one or more icons.

Though handheld unit 658 and layout mark locator 660 are depicted as separate devices forming detail locator 600, handheld unit 658 and layout mark locator 660 can be integrated into a single device forming detail locator 600 and can share one or more of control circuitry, memory, or a user interface. Further, all components of system 650 can share control circuitry, memory, or user interfaces. For example, layout mark locator 660, computer 652, and handheld unit 658 can share one or more of control circuitry, memory, or a user interface. This can advantageously allow for the simplification of the design of components of system 650, including detail locator 600 and computer 652.

During operation, detail locator 600 is utilized to generate data regarding mark points, navigate to the mark points, and provide information regarding the layout marks associated with the mark points. A defined point can be selected via detail locator 600 for navigation and location. The defined point descriptor can be displayed via a user interface, such as user interface 612*a*. Control circuitry 614*a* can gather the displayed defined point via, for example, a screen-scraping function. Alternatively, the defined point descriptors can be directly entered or stored to memory 610*a* and recalled by control circuitry 614*a* for use in generating detail formation table 100. The defined point descriptor can be used to generate one or more mark points in a detail formation table, such as detail formation table 100 described previously. Control circuitry 614*a* or 614*b* can generate detail data for the mark points based on information stored in one or more of memories 610*a* or 610*b*. For example, the detail data can be recalled from one or more reference tables stored in memory 610*a* or memory 610*b*. Memory 610*a* or 610*b* can store values specific to detail locating apparatus for reference point 222, icon detail 280, icon position 282, and display detail code 290, for example.

In the example shown, the location of layout mark locator 660 is determined by total station 654 and prism assembly 656. In some examples, as discussed above, the locational information can be generated based on a navigation module of layout mark locator 660, such as a GPS chip among other options. Control circuitry 614*a* or 614*b* determines the relative location of the reference point on layout mark locator 660, which can be offset from the position of the prism assembly 656 relative to layout mark locator 660. The relative location of the reference point can be determined based on the recalled detail data. Navigational information is generated by detail locator 600 based on the known coordinate location of the subject defined point and the measured location of layout mark locator 660. The navigational information is displayed to the user via user interface 612*a* and/or user interface 612*b* and the user moves layout mark locator 660 towards the mark point.

The displayed navigational information can be dynamically updated on user interface 612a/612b as the reference point approaches the mark point and based on updated location data provided by total station 654. With the reference point aligned with the mark point, user interface 612b displays layout mark information to the user to facilitate making layout marks on the build site. For example, user interface 612b can display layout mark icons associated with the actual layout marks made by the user and placed on the build site. After making the layout marks, the user can use detail locator 600 to navigate to the next mark point and make relevant layout marks.

While system 650 is described as being used by a user, it should be understood that system 650 can include an autonomous detail locator 600. For example, detail locator 600 can include a chassis and motive devices (e.g., wheels, tracks, balls, etc.) that facilitate autonomous movement about the job site. The autonomous detail locator 600 can also include a marking device, such as a sprayer or other device suitable for making marks on a ground surface, for making the layout marks on the build site.

System 650 provides significant advantages. Total station 654 accurately and precisely provides the actual location of layout mark locator 660 on the job site. Detail locator 600 generates navigational information and provides the navigational information to the user to facilitate quick and precise movement to align the reference point with the mark point. Layout mark locator 660 displays information to inform the user of the correct marks to make on the build site and the correct location and orientation in which to make the marks. System 650 facilitates a single user efficiently and quickly making layout marks on a job site. System 650 provides enhanced ability, speed, and accuracy during construction layout, preventing undesired errors that can lead to misalignment and overrun.

Figure 13A:
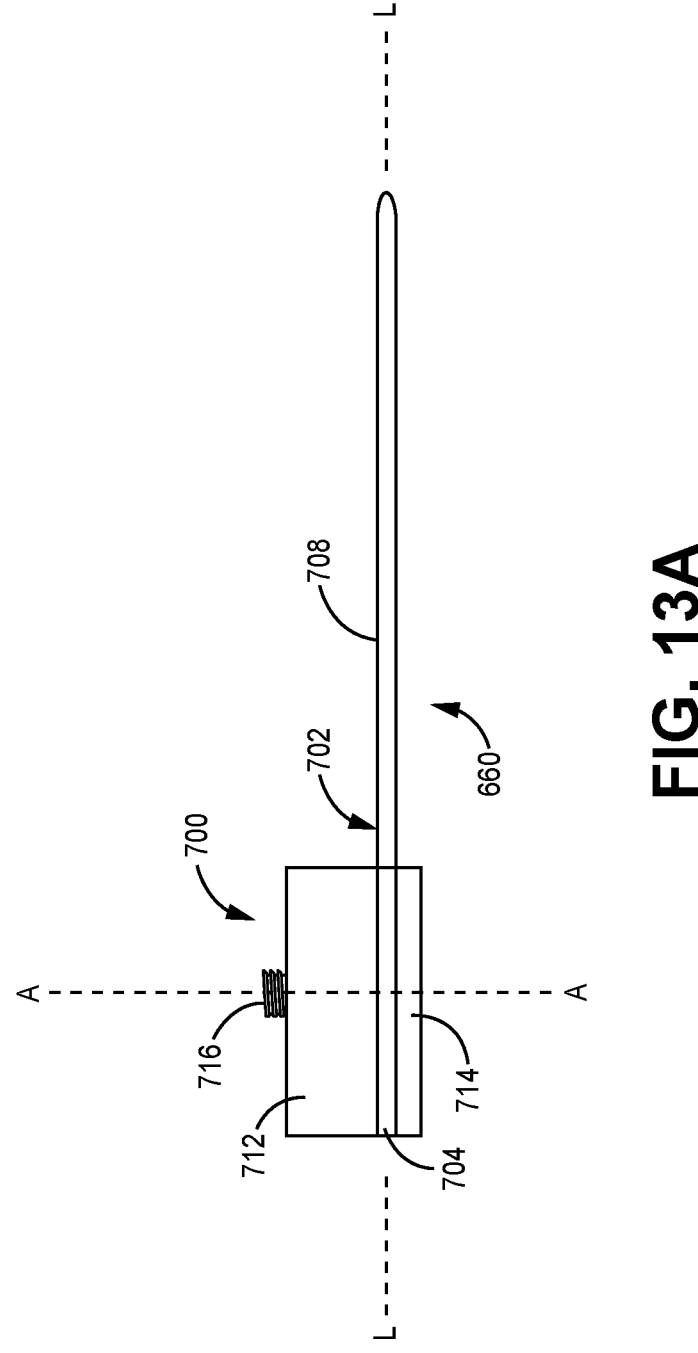
FIG. 13A is a side view of a layout mark locator according to an example of the present invention.
Figure 13B:
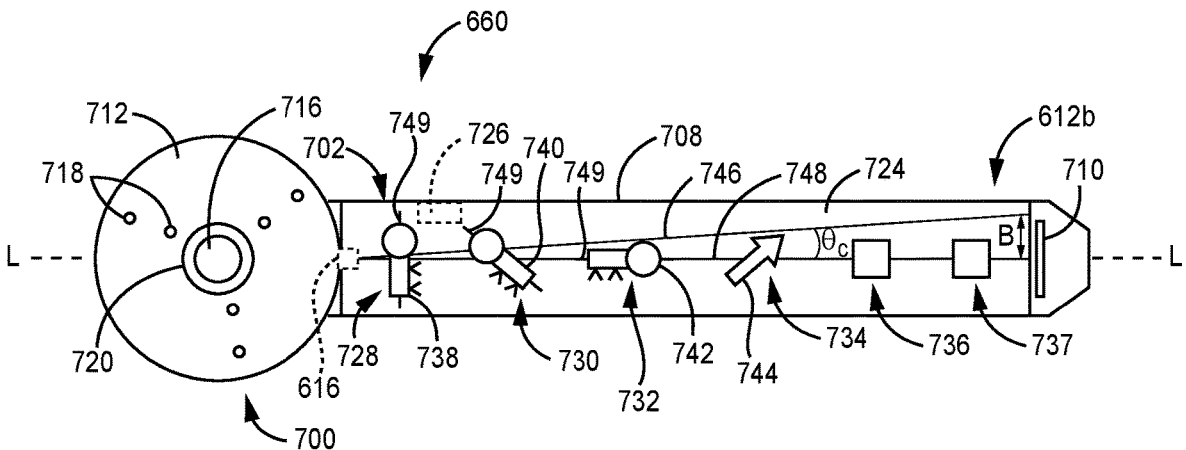
FIG. 13B is a top view of the layout mark locator shown in FIG. 13A.
Figure 13C:
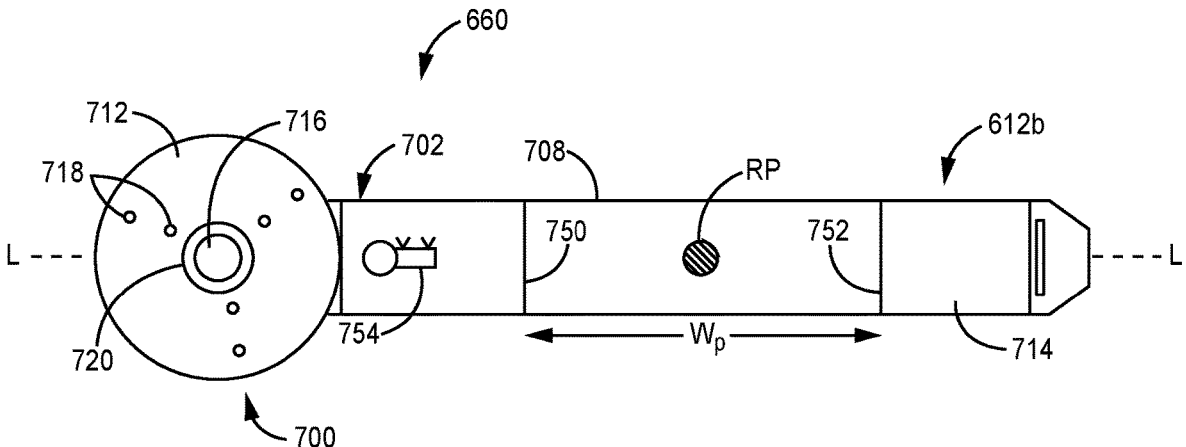
FIG. 13C is a top view of the layout mark locator shown in FIGS. 13A-B including an example of position lines.
Figure 13D:
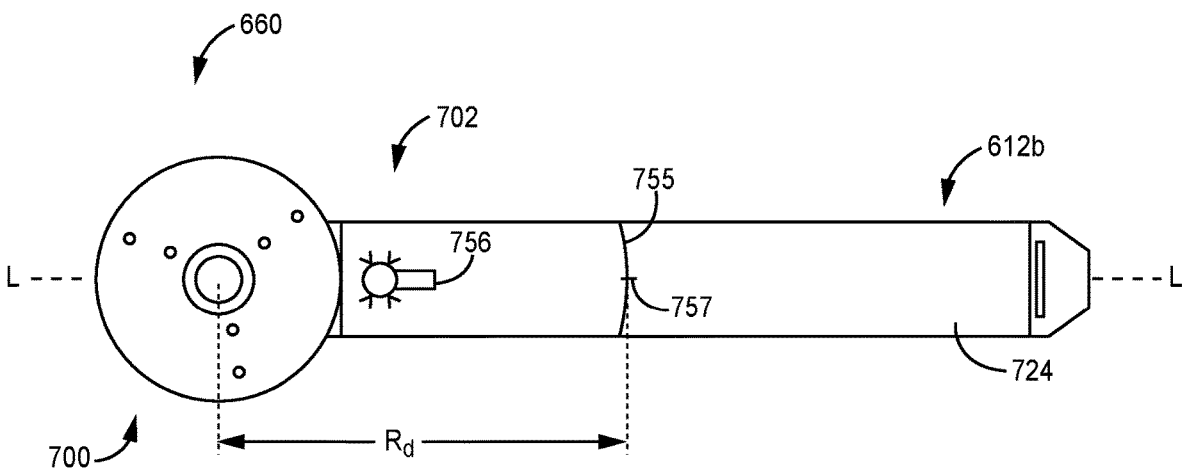
FIG. 13D is a top view of the layout mark locator shown in FIGS. 13A-B including an example of a circularly-shaped position line.
Figure 13E:
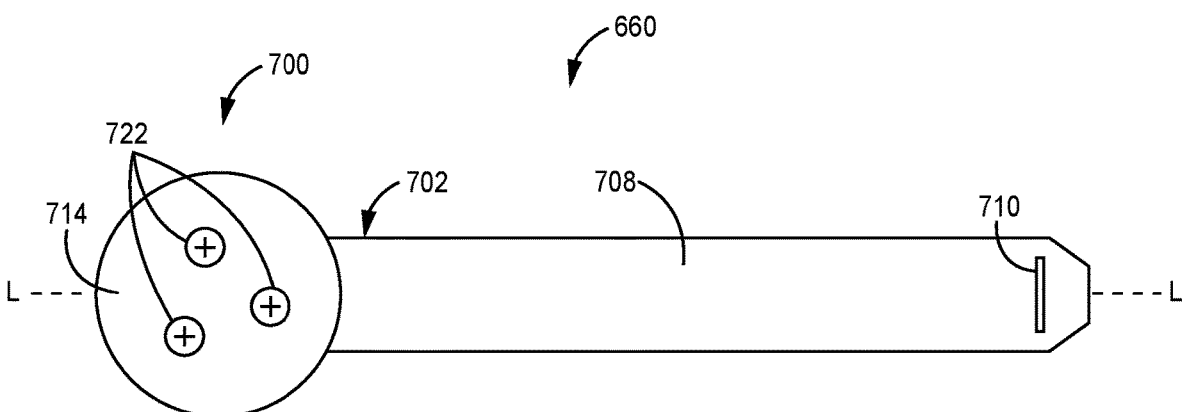
FIG. 13E is a bottom view of the layout mark locator shown in FIGS. 13A-C.
Figure 13F:
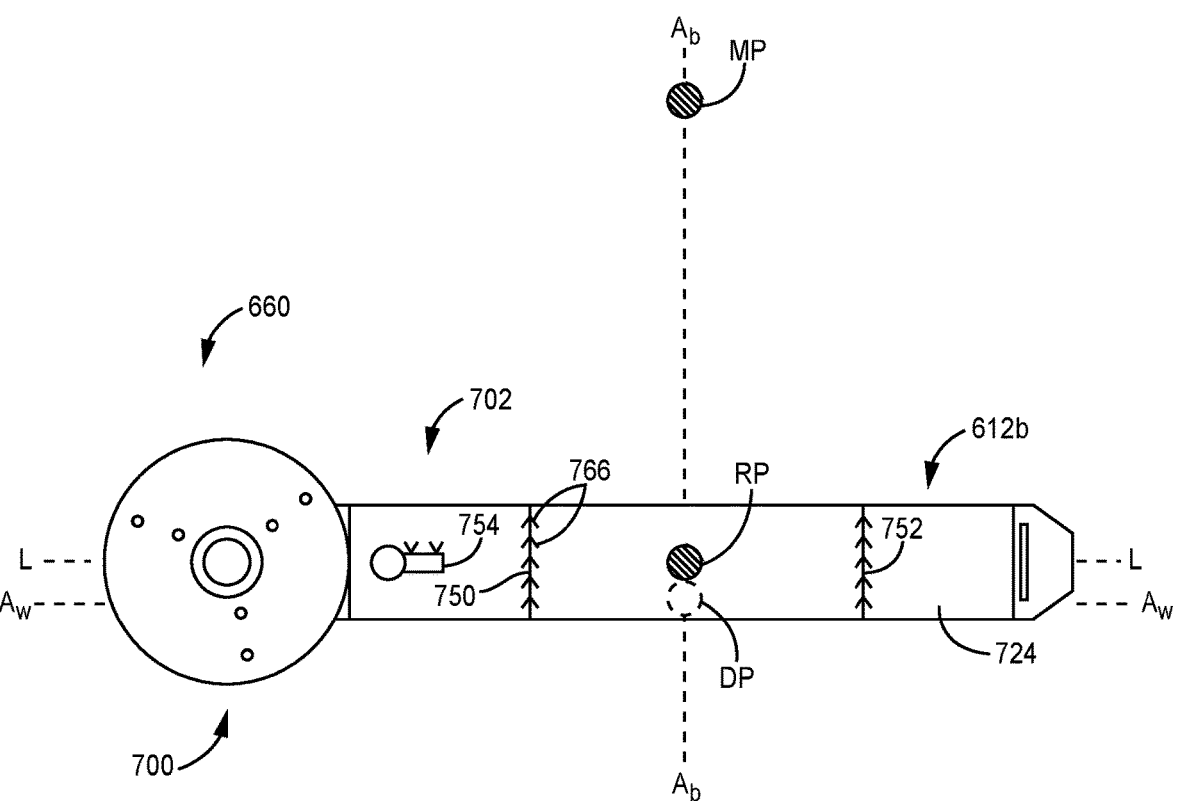
FIG. 13F is a top view of the layout mark locator shown in FIGS. 13A-E showing examples of a wall axis and a bearing axis in relation to examples of a reference point, defined point, and mark point.

FIGS. 13A-F show views of one embodiment of layout mark locator 660. FIG. 13A is a side view of layout mark locator 660. FIG. 13B is a top view of layout mark locator 660 showing navigation icons. 13C is a top view of layout mark locator 660 showing linear position lines. 13D is a top view of layout mark locator 660 showing an arc-shaped position line. FIG. 13E is a bottom view of layout mark locator 660. FIG. 13F is a top view of layout mark locator 660 showing a wall axis and a bearing axis in relation to a reference point, defined point, and mark point. FIGS. 13A-F will be discussed together. Layout mark locator 660 includes point marker base 700 and detail locating arm 702. In some examples, layout mark locator 660 forms detail locating apparatus 600 (FIG. 12). Detail locating arm 702 includes disk 704 and arm 708. Arm 708 includes user interface 612b and extension slot 710. Point marker base 700 includes weighted mount 712, base 714, set screw 716, and fasteners 722. Weighted mount 712 includes leveler holes 718 and bore hole 720.

Detail locating arm 702 is supported by point marker base 700 and extends laterally from point marker base 700 along longitudinal axis L-L. In layout mark locator 660, user interface 612b is formed detail locating arm 702. In some examples, detail locating arm 702 is rotatably mounted to point marker base 700 with disk 704 secured between weighted mount 712 and base 714. Detail locating arm 702 is supported such that detail locating arm 702 is disposed above a ground surface when point marker base 700 contacts the ground surface. In the example shown, arm 708 is cantilevered relative to point marker base 700. While layout mark locator 660 is shown as including a single detail locating arm 702 supporting user interface 612b, user interface 612b can be formed by one or more arms, one or more rotatable arms, or an annular disc, among other options.

Orientation sensor 616, can be configured to generate orientation data regarding the orientation of detail locating arm 702 relative to plan north and is mounted within rotatable detail locating arm 702. The data from orientation sensor 616 can be used to determine the orientation of detail locating arm 702 relative to plan north and, consequently, the orientation of detail locating arm 702 about marker base 700 and relative to plan north and relative to the various layout details (e.g., wall lines, orientation marks, control marks, angled wall marks, etc.). The orientation information can further be used for navigation when the reference point is positioned along detail locating arm 702 rather than base 700, as discussed in more detail below. For example, if the position of marker base 700 is directly measured by an instrument used in construction layout, such as where a prism is mounted to marker base 700, the orientation information can be used in combination with the position of the marker base 700 to determine the location of the reference point along detail locating arm 702.

FIG. 13B shows is a top-down view of layout mark locator 660 showing user interface 612b. In the depicted embodiment, user interface 612b includes display 724 and audio device 726. Display 724 can be a graphical display configured to include graphical navigation and control elements, such as graphical buttons or other graphical control elements presented at the display device. Audio device 726 can include speakers and/or a microphone for presenting information to and/or receiving input from an operator. In some examples, layout mark locator 660 can include physical navigation and control elements, such as physically actuated buttons or other physical navigation and control elements. Display 724 is disposed on a top side of arm 708 such that display 724 is easily viewable by the operator both while the operator holds layout mark locator 660 and while layout mark locator 660 is set down on the ground surface while the operator marks the surface during the construction layout process. Audio device 726 can be disposed within the housing forming the body of detail location arm 702, as is shown in FIG. 13B, or alternatively can be disposed elsewhere on layout mark locator 660, such as within point marker base 700.

In the example shown, display 724 includes icon locations 728, 730, 732, 734, 736, and 737 and is shown displaying icons 738, 740, 742 and 744 as well as confidence lines 746 and 748. In the example depicted in FIG. 13B, detail icon 738 is shown at icon location 728, detail icon 740 is shown at icon location 730, detail icon 742 is shown at icon location 732, and navigation icon 744 is shown at icon location 734. No icons are show at positions 736 and 737 in the depicted example. Detail icons 738, 740, and 742 include midlines 749.

Detail icons 738, 740, and 742 convey information about layout marks and mark points and are derived from data stored in a detail formation table, such as detail formation table 100 (FIG. 3A). Each of detail icons 738, 740, and 742 correspond to separate mark point entries in a detail formation table. The location of a detail at any of icon locations 728, 730, or 732 is determined by the icon position 282 value (FIG. 3A) stored in a detail formation table for the corresponding mark point. The range of values stored as icon position 282 (FIG. 3A) in a detail formation table can be adjusted according to the specifications of the detail locating apparatus used. For example, if an embodiment of user interface 612b is capable of displaying more than three or fewer than three detail icons, the range of icon position 282 (FIG. 3A) values generated and stored in a detail formation table can be adjusted to match the number of available icon locations for displaying detail icons. The icon position 282 for each mark point entry can be dynamically updated by control circuitry such that the detail icon for the closest mark point is displayed at icon location 728, the detail icon for the second closest mark point is displayed at icon location 730, etc. Advantageously, ordering icons at icon locations 728, 730, 732 allows an operator to quickly determine the relative positions of the corresponding mark points by the order in which they are displayed by user interface 612b.

When detail locating arm 702 is rotated about axis A-A, the relative orientation of each icon can remain fixed within the relative coordinates of the build site based on the orientation measured by orientation sensor 616. For example, if navigation icon 744 points to relative north, then navigation icon 744 will rotate relative to detail locating arm 702 and continue to point to relative north as detail locating arm 702 is rotated. Similarly, the orientations of detail icons 738, 740, and 742 can remain fixed as detail locating arm 702 is rotated about axis A-A, such that each icon remains oriented in the direction of the corresponding bearing 220 value in the detail formation table. Layout mark locator 660 is configured to use the orientation information from the orientation sensor 616 to update the orientation of each of detail icons 738, 740, and 742 as layout mark locator 660 rotated or moved about the site. In this way, the operator is provided with real-time feedback regarding the proper orientation of detail locating arm 702 as detail locating arm 702 is rotated, increasing the ease and efficiency with which layout mark locator 660 can be used to perform construction layout.

As shown in FIG. 13B, detail icons 738, 740, and 742 mimic the shape of point marker base 700 and detail locating arm 702. The orientations of detail icons 738, 740, and 742 can be determined by their bearing 220 values, such that the portion of the detail icon that mimics the shape of detail locating arm 702 extends perpendicular to the direction of the mark point's bearing 220 value. Midlines 749 of detail icons 738, 740, and 742 are centered on and extend substantially parallel with the portion of detail icons 738, 740, and 742 that represents detail locating arm 702. An operator can turn detail locating arm 702 until a midline 749 of one of detail icons 738, 740, or 742 is aligned with center confidence line 740 to activate various features of user interface 612b, as will be discussed in more detail subsequently. As layout marks made using detail locating arm 702 as a guide are generally made along the side of detail locating arm 702, having detail locating arm 702 extend in a direction that is 90 degrees relative to the bearing allows for marks made using detail locating arm 702 to point in the direction of the mark point bearing 220 stored in the detail formation table. User interface 612b can display different detail icons based on the orientation of detail locating arm 702 relative to the mark points bearing 220 value. For example, if the mark point bearing 220 for a mark point is north, reversed or mirrored detail icons can be displayed when detail locating arm 702 extends toward the relative east and toward the relative west, such that the orientation of the layout marks shown by the detail icon point toward the relative north of the build site in both orientations of detail locating arm 702. It is to be understood that detail icon can be of any desired configuration for conveying useful layout data to the operator.

Detail icons can also include other information, such as shapes corresponding to a wall mark associated with a mark point. In the depicted example, detail icons 738, 740, and 742 include chevron-shaped symbols pointing toward and touching the representation of detail locating arm 702. The chevron-shaped symbols represent the shape of wall marks that should be made at the mark point represented by each of detail icons 738, 740, and 742 as well as the orientation and placement of those marks relative to detail locating arm 702. An operator can accurately make layout marks on the build site by copying the displayed chevron-shaped symbols onto the build site in the positions indicated by the relevant detail icon 738, 740, 742. Although detail icons 738, 740, and 742 are shown in FIG. 13B as including chevron-shaped symbols to represent wall marks, any suitable shapes or symbols can be used to represent the location and type of wall marks, including shapes or symbols that are different than the shape of the wall marks they represent. Further, in some examples, one or more of detail icons 738, 740, and 742 do not include shapes or symbols representative of wall marks.

For example, a layout mark associated with a given mark point can be orienting arrows 12 for a wall line. A detail icon for that mark point can include a depiction of orienting arrows 12 adjacent to the depiction of point marker base 700 and detail locating arm 702. Further, the depiction of orienting arrows 12 can be located on the side of the depiction of detail locating arm 702 corresponding the side of detail locating arm 702 where the operator should mark orienting arrows 12 on the build site (further examples of this are discussed in more detail subsequently, including with respect to FIG. 8B). As another example, the detail icon for a control mark 13 can be a chevron depiction of a control mark 13 adjacent to a depiction of point marker base 700 and detail locating arm 702. The depiction of the control mark 13 can likewise be located on the side of the depiction of detail locating arm 702 corresponding to the side of detail locating arm 702 where the operator should mark the control mark 13 on the build site. As a further example, a detail icon for an angled wall mark can be a circle surrounding the depiction of point marker base 700. User interface 612b can display different icons for angled wall mark 18 based on the actual wall width W of the wall with which angled wall mark 18 is associated. Using icons that resemble layout mark locator 660 and the shape of the layout mark to be made allows the operator to visually confirm that the detail is being properly marked with the appropriate type of mark and in the correct orientation on the site by referencing the detail icon.

Generally, only detail icons for mark points associated with a single defined point are displayed simultaneously by display 724. For defined points associated with fewer than three mark points in detail formation table, user interface 612b can be configured to omit one or more of detail icons 738, 740, or 742 such that the number of displayed detail icons is the same as the number of mark points associated with the defined point. An operator can switch selected defined points by input at, for example, handheld unit 658. Alternatively, an operator can switch selected defined points by input at one or more physical buttons on layout mark locator 660, or the selected defined point can be updated automatically once control circuitry, such as control circuitry 614a or 614b (FIG. 12), detects that all mark points for the current defined point have been located. However, it is to be understood that it may be advantageous in some examples for mark points from multiple defined points to be displayed simultaneously by display 724.

Navigation icon 744 conveys navigation instructions, such as those generated by method 500 (FIG. 10), for directing the operator to the relevant mark point on the build site. Navigation icon 744 is a general navigation icon, as distinguished from a fine navigation icon, both of which are described in more detail with respect to FIGS. 14A-B. In the depicted example, display 724 includes three detail icons 738, 740, and 742, and only one navigation icon 744.

Navigation icon 744 shows only the navigation instructions for a single mark point, referred to herein as the "active" mark point. The active mark point can be selected from those represented by detail icons 738, 740, and 742 by operator input. The operator can select the active mark point by input at one or more of handheld unit 658 or detail locating arm 702. For example, the operator can rotate detail locating arm to align with the orientation of one of the detail icons. In the depicted example, rotating detail locating arm 702 clockwise by 90 degrees clockwise would align the orientation of detail locating arm 702 with the orientation of detail icon 738, selecting the mark point associated with detail icon 738 as the active mark point. As midlines 749 extend substantially parallel with the portion of detail icons 738, 740, and 742 that represent detail locating arm 702, an operator can select an active mark point by rotating detail locating arm 702 until the midline 749 for the icon representing the mark point overlaps and is parallel with center confidence line 748.

Alternatively, where the orientation of detail locating arm 702 required to select an active mark point would obscure line of sight between prism assembly 656 and total station 654 (FIG. 12), the mark point can also be selected as active by rotating detail locating arm 702 in the opposite direction of the displayed orientation. For example, if rotating detail locating arm 702 90 degrees clockwise to match the orientation of detail icon 738 would block EDM signal 676 (FIG. 12), detail locating arm 702 can instead be rotated 90 degrees counterclockwise to select the mark point associated with detail icon 738 as the active mark point. Control circuitry can be configured to detect that detail locating arm 702 is blocking EDM signal 676 and prompt the user to rotor detail locating arm 702 180 degrees to the opposite orientation. Similarly, control circuitry can be configured to determine whether one of the two opposite orientations of detail locating arm 702 would block EDM signal 676 based on the relative positions of detail locating apparatus 600 and total station 654 while navigating to a mark point. Control circuitry can be further configured to initially display a detail icon 738 or another icon corresponding to the orientation of detail locating arm 702 that would not block EDM signal 676, such that an operator is prompted to rotate detail locating arm 702 into a position that does not block EDM signal 676. Control circuitry can also display a text prompt to communicate to the operator that detail locating arm 702 should be rotated 180 degrees and an operator can align the midline 749 for the detail icon corresponding to the active mark point with center confidence line 748 to ensure that detail locating arm 702 is correctly oriented.

In this manner, the orientation of detail icons 738, 740, and 742 icons indicate the orientation at which detail locating arm 702 should be positioned to make the layout mark indicated by the icon. Layout mark locator 660 can use the orientation information from orientation sensor 616 to determine when layout mark locator 660 is properly aligned to mark a detail on the build site with a layout mark. For example, layout mark locator 660 can be configured so that the positions of detail locating arm 702 and point marker base 700 in the displayed detail icon are aligned with the positions that the operator needs to rotate detail locating arm 702, such that the operator knows that detail locating arm 702 is in the correct position when the detail locating arm

702 and marker base 700 are in the same orientation as arm and marker base depicted by the detail icon 742.

Layout mark locator 660 can also contain one or more physical buttons that can be used to select the active mark point. Having a single active mark point advantageously simplifies the information displayed by display 724, improving clarity for operators using detail locating arm 702. However, it should be understood that display 724 can display other navigations in addition to navigation icon 744. For example, display 724 could display separate navigation icons for each of detail icon 738, 740, and 742.

Alternatively, user interface 612b can be configured to adjust another attribute of the detail icon to indicate that detail locating arm 702 is correctly aligned to mark detail and/or to activate the mark point associated with the detail icon. For example, the color and/or opacity of the detail icon can change to indicate that detail locating arm 702 is aligned with a particular icon such that that icon is an active icon. As another example, the outline thickness of the detail icon can vary to indicate whether detail locating arm 702 is correctly aligned. A thicker outline, for example, can indicate that detail locating arm 702 is correctly aligned. The outline of the detail icon can also include dashing that is varied based on the alignment of detail locating arm 702, such that the detail icon has a dashed or dotted outline while detail locating arm 702 is not correctly aligned and a solid outline while detail locating arm 702 is correctly aligned.

Primary and secondary points, as described previously with respect to FIG. 3A, can also have different detail icons. For example, the color and/or opacity of the detail icon can indicate whether it corresponds to a primary or secondary mark point. Similarly, the outline thickness of the detail icon can indicate whether the detail icon corresponds to a primary or secondary mark point. In all embodiments, the location and presentation of icons are selected to provide the operator with clear, immediate, and intuitive directions for navigation and marking, requiring neither advanced experience nor additional tools.

Icon locations 736 and 737 indicate locations at which other icons associated with the defined point (e.g., additional icons associated with additional mark points for that defined point or icons that convey other information) can be displayed. Each of icon locations 728, 732, 734, 736, and 737 can display icons for layout marks that should be made at one or more mark points. For example, a defined point with three separate mark points can have icons corresponding to each mark point at icon locations 728, 732, and 736.

Confidence lines 746 and 748 can be displayed by layout mark locator 660. Center confidence line 746 is oriented along axis L-L and outer confidence line 348 is offset from center confidence line 746 by angle $\theta_c$. Confidence lines 746 and 748 correspond to the relative uncertainty between the orientation of detail locating arm 702 measured by orientation sensor 616 and the true orientation of detail locating arm 702. The breadth B of outer confidence line 746 from center confidence line 748 increases along the length of detail locating arm 702 and is largest at the distal end of detail locating arm 702. The angle $\theta_c$ between outer confidence line 746 and center confidence line 746 indicates the range of possible positions that the true orientation of the relative direction falls within. Generally, center confidence line 748 extends along the center of display 724 (along longitudinal axis L-L) while the position of confidence line 746 is adjusted dynamically to represent the error associated with measurements made by orientation sensor 616. Error associated with measurements made by the orientation sensor 616 can increase during use. To reduce or reset error of measurements made by the orientation sensor 616, the orientation sensor 616 can be calibrated. The orientation sensor 616 of detail locating apparatus 600 can be recalibrated by performing a calibration routine. For example, an operator can calibrate the orientation sensor through shaped movement, such as by swinging the layout mark locator 660 in a figure-eight pattern, among other options. It should be understood that layout mark locator 660 can display the relative uncertainty of the orientation sensor measurements any desired suitable icon or display method. For example, relative uncertainty can be indicated with a numerical value corresponding to the uncertainty. Sensor error can contribute to misplaced or misaligned layout marks.

Confidence lines 746 and 748 can be selectively displayed by display 724 rather than being continuously displayed. This allows for optimization and clarity of the amount of information displayed based on the operator's requirements, increasing the clarity of the displayed information and thereby improving the efficiency with which an operator can use layout mark locator 660 to accurately locate mark points on a build site. For example, confidence lines 746 and 748 can be selectively displayed when the operator is within a short distance, such as 1, 2, 3, 12, or another number of inches, of a given mark point, allowing display 724 of layout mark locator 660 to display other relevant information as an operator locates a mark point, and then switch to a display layout that includes confidence lines 746 and 748 as the operator prepares to make a layout mark relative to the mark point. Alternatively, confidence lines 746 and 748 can be selectively displayed only when the error of measurements made by the orientation sensor exceeds a certain threshold. For example, confidence lines 746 and 748 can remain hidden unless the error associated with the orientation sensor exceeds 10%, 11 degrees, 15 degrees, or another threshold error value. Thus, the confidence lines are only displayed when the error exceeds the pre-selected or operator-defined threshold, meaning that the appearance of confidence lines 746 and 748 can serve as a trigger for an operator to recalibrate the orientation sensor 616.

Alternatively, center confidence line 748 can be displayed continuously and outer confidence line 748 can be displayed selectively. Center confidence line 748 runs the length of display 724 and can aid an operator in activating functions of detail locating apparatus 600 that are based on the relative orientation of detail locating arm 702. For example, center confidence line 748 can aid an operator in aligning detail locating arm 702 with a direction indicated by an icon shown by display 724. For example, the user can know that the user is navigating in the correct direction when outer confidence line 746 is aligned with or near to (e.g., within 11 degrees of) center confidence line 748.

The error associated with confidence lines 746 and 748 can also be adjusted based on the type of wall or layout detail being marked. For example, if the operator is locating a mark point where the operator should mark, for example, orienting arrows 12 to indicate a wall having a 4-inch width, the spread of confidence lines 746 and 748 can correlate to the amount of error associated with the position of the orienting arrows 12 along the direction in which detail locating arm 702 extends.

Confidence lines 746 and 748 can also be selectively displayed based on the relative orientation of detail locating arm 702 in the northing-easting coordinate system of the build site. For example, confidence lines 746 and 748 can be selectively displayed only when the operator rotates detail locating arm 702 to a relative north along the build site. The operator can also, for example, re-calibrate the orientation sensor, as described previously, to reset the relative north to a new direction on the build site, improving the flexibility of use of confidence lines 746 and 748. For example, if two units on a build site have different relative norths, an operator can re-calibrate the orientation sensor to reset the relative north when moving between units.

Although only one outer confidence line 746 has been discussed herein, a second outer confidence line can be included to more clearly communicate the range of possible true orientations of detail locating arm 702 based on the current error of orientation sensor 616. The second outer confidence line can be a line extending at the same angle from center confidence line 748 as outer confidence line 746 and reflected or mirrored across center confidence line 748. Advantageously, examples including a second outer confidence line more clearly represent the error associated with the orientation measurements made by orientation sensor 616.

The orientation sensor 616 can optionally include a vertical alignment sensor or component to measure the vertical orientation of layout mark locator 660. The orientation sensor 616 can include, for example, an accelerometer or gyroscope to measure the vertical orientation of layout mark locator 660 and determine an offset of vertical axis A-A from true vertical. For example, orientation sensor 616 can be configured to sense when detail locating arm 702 is transverse to a plane normal to gravity. Where layout mark locator 660 is attached to a prism that is used by a total station to measure the position of layout mark locator 660, non-vertical orientations of layout mark locator 660 can cause inaccurate positions measurements using the prism. Vertical orientation measurements by the orientation sensor 616 can be used to alert an operator that layout mark locator 660 has a vertical orientation that is outside of an acceptable range for accurate positions measurements. Detail locating apparatus 600 can be configured to communicate that layout mark locator 660 is outside of that acceptable range via one or more icons displayed on display 724 or via an audio cue from audio device 726.

In some examples, audio device 726 can provide an audio indication that the detail locating arm 702 is properly aligned and/or that a particular icon 742 is activated. The operator can visually or aurally (depending on whether a visual or audio confirmation is used) confirm that point marker base 700 and detail locating arm 702 are properly aligned based on the orientation and configuration of the detail icon 742.

When an active mark point has been located, such as by method 500 (FIG. 10), user interface 612*b* can stop displaying all previously displayed icons and instead display only information relevant for making layout marks at the located mark point. For example, user interface 612*b* can display only the detail icon for the located mark point and description 288 information from the detail formation table (if there is description 288 for the located mark point). As will be explained subsequently, for some wall marks, base 700 is sized such that it can be used as a template for making wall marks. For other wall marks, detail locating arm 702 can be used as a guide for accurate mark placement. For these marks, user interface 612*b* can also display position lines once an active mark point has been located. Position lines are lines displayed by user interface 612*b* that indicate where wall marks should be made relative to detail locating arm 702. Specifically, an operator can accurately place the layout marks by making the marks shown in the displayed detail icon directly beneath the position lines.

FIG. 13C is a top view of layout mark locator 660 and shows an example of information displayed by user interface 612*b* after an active mark point has been located. The depiction of user interface 612*b* shown in FIG. 13C includes position lines 750 and 752, as well as detail icon 754 at icon location 728. For clarity, FIG. 13C depicts a display for an active mark point that does not have description 288 information. Accordingly, no description 288 information is depicted.

Detail icon 754 includes chevrons that indicate the shape of detail marks that should be made as well as the side of detail locating arm 702 on which the marks should be made. Reference point RP is the virtual location of the reference point along detail locating arm 702 and in the depicted example reference point RP is aligned with the mark point. Position lines 750 and 752 indicate the position on the build site at which an operator should make the layout marks displayed by detail icon 754. Accordingly, an operator can accurately make layout marks according to the displayed icons by placing chevrons on the build site at the locations indicated by position lines 750 and 752. While position lines 750 and 752 are depicted as extending the entire width of display 724 of user interface 612*b*, it should be understood that position lines 750 and 752 can take any form suitable for indicating the location at which layout marks should be made.

Position lines 750 and 752 are spaced by a width $W_p$. As the space between layout marks can be used to indicate wall width, position lines 750 can be positioned at a width Wp corresponding to the wall width 224 value for the active mark point stored in the detail formation table. As described previously, wall width 224 values stored in detail formation table 100 can be formatted according to the trade of construction layout. For example, a width value of "8" can cause position lines 750 and 752 to be displayed 7.25 inches apart while a width value of "8." can cause position lines 750 and 752 to be displayed 8 inches apart. Control circuitry 112 can use wall the width 224 to determine the locations on user interface 612*b* at which position lines should be displayed such that the width $W_p$ between position lines 750 and 752 are displayed matches the stored width 224 value for that mark point. As described previously, it should be understood that any desired indicator can be utilized to distinguish between finished and unfinished widths.

Position lines 750 and 752 are located adjacent to the position of the located mark point. In the depicted example, reference point RP is located at the center point of detail locating arm 702. As such, when the reference point is aligned with the mark point, the mark point is also located at the center point of detail locating arm 702. As such, the displayed positions of position lines 750 and 752 depict an embodiment in which layout marks should be made at locations relative and adjacent to the location of the mark point. In the depicted example, position lines 750 and 752 are positioned symmetrically about reference point RP, each spaced from reference point RP by one-half of the width $W_p$. Control circuitry can be configured to display position lines at the correct location for layout marks relative to the reference point. Further, FIG. 13C depicts only one example of position lines and in some examples, the location of the reference point is the location where a layout mark should be made, including examples where two or more layout marks should be made while the detail locating apparatus is at a single mark point.

Position lines can also be used for circularly-shaped angled wall marks, such as those used to denote angled wall marks. An operator can trace a circularly-shaped angled wall mark onto the build site by rotating detail locating arm 702 and continuously marking the build site at the location of the position line. Angled wall marks generally use base 700 as a reference point in order to allow the rotation of detail locating arm 702 to be used to make layout marks. Similar to the example depicted in FIG. 13C, then, the location of the position line for an angled wall mark is generally offset from the location of the reference and, consequently, the mark point by a pre-determined distance. The pre-determined distance is selected based on operator preference and trade application requirements. Control circuitry can be configured to display the position line at the correct offset from the reference point for making an angled wall mark. Further, for circularly-shaped angled wall marks, the position line can also be, for example, a curved line or arc to indicate the radial position along detail locating arm 702 that the circularly-shaped mark should be made.

Base 700 can be sized such that the diameter of base 700 corresponds to the size of an angled wall mark for the most common wall, allowing an operator to make an appropriate wall mark by tracing around base 700 or otherwise using base 700 as a guide for layout mark placement. For example, base 700 can have a diameter of 6 inches, allowing it to be easily used to make angled wall marks to denote angled intersections of 6-inch walls.

For some circularly-shaped wall marks, it can be advantageous to also make chevron or crosshair shapes at various points along the curved, circular shaped line of the circularly-shaped wall mark. For example, if four equidistant chevrons are made along the outer circumference of a circularly-shaped wall mark, lines can be made connecting opposite chevrons to locate the center of the circularly-shaped wall mark. Where the circularly shaped wall mark is centered on the mark point, the intersection of the lines overlaps with the location of the mark point. Drawing lines to connect opposing chevron or crosshair shapes can be useful to denote, for example, backsight points along an angled wall or a butt joint formed between, for example, an angled wall and an exterior wall.

When the reference point (e.g., base 700) is aligned with the mark point location and the mark point for an angled wall mark has been located, user interface 612*b* can use crosshair or chevron symbols to indicate the locations where an operator should make crosshair or chevron shapes on the build site. Further, user interface 612*b* can display the crosshair or chevron symbols at fixed positions on the build site directly above where those symbols should be made, such that rotating detail locating arm 702 above the location where a crosshair or chevron symbol should be made causes user interface 612*b* to display the crosshair or chevron symbol and rotating detail locating arm 702 away from the causes user interface 612*b* to stop displaying the crosshair or chevron symbol. User interface 612*b* can also be configured to display the crosshair or chevron icons with a scrolling effect, such that rotating detail locating arm 702 to a stored location (e.g., stored on memory 610*a*, 610*b*) at which the symbol should be made causes the corresponding icon to scroll onto the display screen of user interface 612*b* and rotating detail locating arm 702 away from the stored location causes the icon to scroll off of user interface 612*b*.

FIG. 13D is a top view of layout mark locator 660 showing an arc-shaped position line for marking a circularly shaped-wall mark. Specifically, the depiction of user interface 612*b* shown in FIG. 13D includes arc-shaped position line 755, detail icon 756, and crosshair icon 757. Like detail icon 754 (FIG. 13C), detail icon 756 includes chevrons that indicate the shape of detail marks that should be made as well as the side of detail locating arm 702 on which the marks should be made. Arc-shaped position line 755 is displayed at a position such that the radial edge of arc-shaped position line offset from the center of base 700 by radial distance $R_d$. The radial distance $R_d$ is equal to the radius for the circularly-shaped wall mark, such that an operator can properly trace a circularly-shaped wall mark onto the build site by tracing arc-shaped position line 755 onto the build site at the displayed position of arc-shaped position line 755. Crosshair icon 757 indicates that the position at which an operator should make a chevron- or crosshair-shaped mark on the build site. Whether an operator should make chevron- or crosshair-shaped marks can be indicated by detail icon 756. In the depicted example, detail icon 756 includes chevron-shaped marks, indicating that an operator should make chevron-shaped marks on the build site at the position of crosshair icon 757. For both types of marks, detail icon 756 can also include additional elements indicating that an operator should draw lines connecting opposing chevron or crosshair shapes to indicate the position of the mark point on the build site.

The position of crosshair icon 757 can remain fixed and can be selectively displayed by user interface 612*b* when detail locating arm 702 is positioned above the location of where the crosshair- or chevron-shaped mark should be made on the build site. Further, additional crosshair icons 757 can be displayed at other orientations of detail locating arm 702. For example, three additional crosshair icons 757 can be displayed at 90-degree intervals along the rotation of detail locating arm 702, such that an operator can accurately make four crosshair-shaped marks at equidistant circumferential positions of a circularly-shaped wall mark. The positions can be selected such that the positions of the crosshair- or chevron-shaped marks on the build site mimics the position of the crosshair- or chevron-shaped marks in detail icon 756. Further, user interface 612*b* can be configured to cause the crosshair icon 757 to scroll across user interface 612 as detail locating arm 702 is rotated. User interface 612*b* can be configured to display additional icons or text information to communicate to a user how detail locating arm 702 should be rotated to make all crosshair- or chevron-shaped marks.

For some examples of circularly-shaped wall marks that are made by tracing the outer circumference of base 700, user interface 612*b* does not display an arc-shaped position line 755. Rather, the detail icon 756 can that user should trace the outer circumference of base 700 and user interface 612 can display icons to indicate the positions along the outer circumference at which an operator should make crosshair- or chevron-shaped wall marks.

Alternatively, user interface 612*b* can display marking icons in place of position lines or crosshair icons. As referred to herein, marking icons refer to large icons that mimic the shape, size, and position of layout marks that should be made on the build site. As such, marking icons function similarly to position lines but also indicate the size and/or shape of layout marks in addition to the position at which they should be made. The operator can make the appropriate mark by copying the displayed marking icon or icons onto the site at the locations indicated by the marking icon or icons. For circularly-shaped angled wall marks, the marking icon can be a straight or curved line, or another suitable shape, to indicate the radial position along detail locating arm 702 that the circularly-shaped mark should be made.

Advantageously, marking icons allow an operator to quickly and accurately make layout marks associated with a mark point without having to manually measure the location at which the layout marks should be made. User interface 612*b* can display one or more icons to communicate to an operator that base 700 should be used to make layout marks rather than one or more positions along detail locating arm 702.

In some examples, user interface 612*b* can also display an on-screen ruler to allow an operator to accurately measure the correct distances relative to the mark point to place layout marks on the build site. The on-screen ruler can also be used to locate and make undefined layout marks and/or marks at locations that are otherwise not recognized by layout mark locator 660.

In some examples, an operator can manually select the ruler to be displayed on layout mark locator 660. Manual selection allows an operator to use the general and fine navigation functions of layout mark locator 660 in combination with the on-screen ruler to accurately place layout marks on the build site. Manual selection is advantageous when, for example, the orientation sensor 616 cannot accurately measure magnetic north, preventing layout mark locator 660 from determining the position of relative north, as previously described. Layout mark locator 660 can also be configured to selectively display a glossary of wall marks that can be used by an operator (e.g., in lieu of memorized information) in combination with the on-screen ruler to make the appropriate layout marks on the build site.

In some instances, a first mark may need to be made within the length of detail locating arm 702 and a second mark may need to be made at a location beyond the distal end of detail locating arm 702, such as for orienting arrows to mark a wall having a width greater than the length along axis L-L of display 724. To allow for marks beyond the distal end of detail locating arm 702 without shifting layout mark locator 660, a measuring device (e.g., tape measure) can be affixed to detail locating arm 702 at extension slot 710. Layout mark locator 660 can display instructions on detail locating arm 702 indicating the location and/or type of mark that should be made. Layout mark locator 660 can display a numeric distance and icon to prompt an operator as to the type and location of wall marks that should be made. In some examples, layout mark locator 660 can display a code indicating that the operator should identify the detail manually from the floor plan or defined point descriptor in order to make any required wall marks using a measuring device attached to extension slot 710 or the displayed on-screen ruler. The measuring device can be a standard tape measure, a ruler, or another suitable apparatus for measuring distance. In this way, extension slot 710 is configured to allow the operator to locate relevant layout marks at locations beyond the distal end of detail locating arm 702. Advantageously, the use of a tape measure in combination with extension slot 710 allows layout marks to be made beyond the length of detail locating arm 702. Further, the use of a tape measure allows marks to be more easily made in, for example, a blind spot in which EDM signal 767 cannot reach prism assembly 656 attached to layout mark locator 660. To make a mark in such a blind spot, an operator can position layout mark locator in a position that can be sensed by total station 654 via EDM signal 767 and use a tape measure attached to extension slot 710 to accurately measure to the position of the blind spot and make the layout mark.

FIG. 13E is a bottom view of layout mark locator 660, showing point marker base 700, detail locating arm 702 (including arm 708), extension slot 710, base 714, and fasteners 722. As shown in FIG. 13E, fasteners 722 secure base 714 to weighted mount 712. Disk 704 includes a central aperture (not depicted in FIGS. 13A-13F). Fasteners 722 extend through the central aperture of disk 704 such that detail locating arm 702 is freely rotatable about axis A-A. While detail locating arm 702 and point marker base 700 are described as separate components, detail locating arm 702 and point marker base 700 can in fact be fixed relative each other and, in some examples, can be formed together. Weighted mount 712 maintains point marker base 700 in a desired position on the build site, allowing layout mark locator 660 to be used by a single operator.

FIG. 13F is a top view of layout mark locator 660 overlaid on wall axis $A_w$-$A_w$ and bearing axis $A_b$-$A_b$ and showing reference point RP, mark point MP, defined point DP. In the depicted example, layout mark locator 660 includes detail locating arm 702 and user interface 612b. User interface 612b includes display 724, which displays position lines 750 and 752, fine navigation chevrons 766, and detail icon 754. FIG. 13F also longitudinal axis L-L. Wall axis $A_w$-$A_w$ extends in the direction of wall lines WL and bearing axis $A_b$-$A_b$ extends perpendicular to wall axis $A_w$-$A_w$ and intersects mark point MP. Defined point DP is shown in dotted lines to indicate that it is positioned under layout mark locator 660 at the intersection of wall axis $A_w$-$A_w$ and bearing axis $A_b$-$A_b$.

Bearing axis $A_b$-$A_b$ is oriented along the compass direction encoded by bearing 220 in detail formation table 100 for mark point MP. For example, if MP is positioned north or south of wall axis $A_w$-$A_w$, bearing axis $A_b$-$A_b$ extends in the north-south direction and intersects wall axis $A_w$-$A_w$ at defined point DP. To locate mark point MP, an operator can navigate along wall axis $A_w$-$A_w$ user interface 612b overlaps or overlays bearing axis $A_b$-$A_b$. Once user interface 612b overlaps bearing axis $A_b$-$A_b$, user interface 612b can display position lines 750 and 752 to display the positions of where layout marks should be made once detail locating arm 702 is positioned over mark point MP. Advantageously, user interface 612b can reposition position lines 750 and 752 based on the position of user interface 612b with respect to wall axis $A_w$-$A_w$, such that position lines 750 and 752 are continuously aligned with the correct location for layout marks even when reference point RP is not perfectly aligned with mark point MP. To this extent, an operator does not have to directly align reference point RP with mark point MP to locate mark point MP and accurately place layout marks, advantageously improving the efficiency and ease with which an operator can locate mark points by increasing the range of positions of layout mark locator 660 that result in accurate mark placement. In the depicted example, user interface 612b can also display fine navigation chevrons 766 centered on position lines 750 and 752 to convey the distance and direction of the mark point, as described in more detail subsequently with respect to FIG. 14B.

In this manner, layout mark locator 660 can be configured to allow a user to perform two-axis navigation to locate mark points. Two-axis navigation provides a number of advantages. Specifically, two-axis navigation improves the ease with which an operator can locate mark points by decomposing navigation into multiple steps along perpendicular axes. Rather than navigate by moving layout mark locator diagonally with respect to wall axis $A_w$-$A_w$ or bearing axis $A_b$-$A_b$, an operator can first following the wall axis $A_w$-$A_w$ and then move along the bearing axis $A_b$-$A_b$ when prompted to do so by user interface 612b. Generally, a wall axis $A_w$-$A_w$ is oriented parallel with an existing, visible feature on the build site, such as an exterior edge of a concrete slab. As compared to direct navigation to locate a mark point, it can be easier for inexperienced operators to locate mark points by following an axis parallel to a visible feature (i.e., along axis $A_w$-$A_w$) while navigating longer distances and then to navigate perpendicular to that axis (i.e., along bearing axis $A_b$-$A_b$) for a short distance to locate the mark point and place layout marks.

As will be explained in more detail subsequently with respect to FIG. 18, in some examples an operator can select the active mark point from multiple mark points associated with the current defined point by rotating detail locating arm 702 to be oriented approximately +90 degrees or −90 degrees with respect to the direction of the mark point bearing 220. In examples using two-axis navigation, it can be advantageous to display a non-component icon while an operator navigates along the first axis (e.g., along axis $A_w$-$A_w$). More specifically, where an operator rotates detail locating arm 702 perpendicular to the mark point bearing 220 direction to select a mark point, it can be unintuitive for operators to navigate while detail locating arm 702 is parallel to the direction of navigation, as would be required to, for example, navigate along axis $A_w$-$A_w$ while mark point MP is selected in FIG. 13F. To improve operator ability to navigate along the first axis (e.g., axis $A_w$-$A_w$), user interface 612b can display an icon that does not correspond to a mark point, but prompts a user to rotate detail locating arm 702 to be perpendicular with the first axis of navigation (e.g., such that axis L-L of detail locating arm 702 is perpendicular to axis $A_w$-$A_w$). Icons that do not correspond to a mark point but prompt a user to rotate detail locating arm 702 are referred to herein as "non-component icons."

Advantageously, user interface 612b can display a non-component icon to prompt a user to rotate detail locating arm 702 to be perpendicular to the first axis in a two-axis navigation scheme. A user can navigate along the first axis until the user is within a threshold distance of the second, perpendicular axis in the two-axis navigation scheme. The threshold distance can be, for example, a radial extent of the user interface 612b, such that user interface 612b overlaps or overlays the second axis when detail locating arm 702 is rotated to be perpendicular to the second axis. Control circuitry can prompt the user to rotate detail locating arm 702 to a position perpendicular to the second axis (e.g., such that axis L-L of detail locating arm 702 is parallel to axis $A_w$-$A_w$ and perpendicular to axis $A_b$-$A_b$) when layout mark locator 660 is within the threshold distance. When the user rotates detail locating arm 702 to a position perpendicular to the second axis, user interface 612b can display position lines 750 and 752 as well as chevrons 766, which can be used to locate the mark point and make appropriate layout marks.

Where the mark point is located at a position that is unsuitable for making layout marks, an operator can interact with, for example, user interface 612b or user interface 612a to adjust the location of the mark point along the second axis by adjusting the point adjust 286 for the mark point. For example, if the surface at the location of the mark point is rough, if there is a hole at the mark point location (e.g., if the mark point is located on an upper floor of a building at a position where a column will extend through the floor), if the mark point location is beyond an exterior of an upper or basement level of a building (e.g., if the mark point is located in the air adjacent to an upper level), or is a location otherwise unsuitable for making a layout mark, the value stored in point adjust 286 can be changed to adjust the offset of the mark point from the defined point such that the mark point can be located at a location suitable for making the layout mark. Using a two-axis navigation scheme advantageously more clearly represents the direction in which point adjust 286 affects mark point position to an operator, increasing the ease with which an operator can change point adjust 286 based on site conditions or other operational needs.

Layout mark locator 660 provides significant advantages. Layout mark locator 660 can generate and display information to guide an operator to locations on a construction site. Layout mark locator 660 can display information relating to construction detail, including navigation instructions for locating a mark point as well as the layout mark to be made relative to the mark point. Layout mark locator 660 facilitates an operator moving about the site, locating various points, and making layout marks without referencing a plan or utilizing measuring tools. Detail locating arm 702 reduces downtime and increase efficiency, saving time and costs. Detail locating arm 702 reduces operator error and increases end-user confidence. Detail locating arm 702 provides a simple interface that requires less training than traditional methods to effectively and efficiently layout construction sites.

FIG. 14A is a section of a user interface 612*b* showing general navigation icon 762. As described previously, general navigation icons provide coarser navigation than fine navigation icon. General navigation icon 762 is shaped as an arrow. The orientation of the arrow can be determined from the angle of a straight-line path to the mark point from the relative north. the orientation of the arrow can be dynamically updated as layout mark locator 660 is moved or rotated so that an operator can continuously use general navigation icon 762 to navigate to a mark point. While general navigation icon 762 has been described as being an arrow, it is to be understood that a general navigation icon can be any shape or symbol suitable for directing the operator to a mark point and can also include other information represented as text, such as a numerical straight-line distance value or a relative cardinal direction.

FIG. 14B is a section of user interface 612*b* showing fine navigation icon 764. Fine navigation icon 764 includes chevrons 766 and center line 768. As described previously, fine navigation icons provide less coarse navigation than general navigation icons and enhance navigation over short distances (e.g., distances less than 12 inches). The apexes of chevrons 766 intersect center line 768 and function as fine navigation indicators that convey navigation information for the selected mark point. Chevrons 766 can be used to indicate both the direction and relative distance of the mark point being located. The direction that the apexes of chevrons 766 are pointed can be used to convey the direction of the mark point. Further, the number of fine navigation indicators can vary based on the distance, allowing the number of indicators displayed to communicate the distance to the mark point to the operator. In the depicted example, the chevrons function as fine navigation indicators. Accordingly, the number of chevrons can correlate to the distance between the reference point and the mark point. Each chevron can indicate a discrete unit of distance (such as an inch, centimeter, etc.). The six chevrons depicted on fine navigation icon 764 can indicate that the mark point is six units of distance away. Similarly, twelve chevrons can indicate that the mark point is twelve units of distance away.

Layout mark locator 660 can be configured to cause user interface 612*b* to stop displaying a general navigation icon when the reference point is within a threshold distance of the mark point and display a fine navigation icon. The fine navigation icon can be displayed additionally to or in place of the general navigation icon. The threshold distance is generally equivalent the maximum number of fine navigation indicators configured to be displayed on a fine navigation icon, allowing for a seamless transition in navigation between general navigation and fine navigation icons. The threshold distance can be, for example, 12 inches, such that a fine navigation icon is displayed when the reference point is within 12 inches of the active mark point. Alternatively, layout mark locator 660 can be configured to cause user interface 612*b* to be displayed when detail locating arm 702 intersects the bearing axis for the mark point.

Layout mark locator 660 can dynamically update the number of fine navigation indicators displayed with fine navigation icon 764 as the distance between the reference point and the mark point changes. As distance between the reference point and mark point decreases, the number of fine navigation indicators can increase or decrease, based on user preference.

In some examples, center line 768 can be one or both of position lines 750 and 752. When layout mark locator is within a threshold distance of the mark point or is aligned with the bearing axis for the mark point, layout mark locator 660 can be configured to stop displaying a general navigation icon and instead display position lines 750 and 752, and to also chevrons 766 on position lines 750 and 752. Advantageously, displaying chevrons 766 on position lines 750 and 752 allows for the spacing of layout marks as well as their relative distance to be simultaneously displayed by user interface 612*b*.

Although fine navigation icon 764 has been described as a line intersecting a varying number of chevrons, it is to be understood that the fine navigation icon can more generally take any form suitable for displaying navigation instructions for locating a mark point, e.g., with characteristics (such as the aforementioned chevrons) that provide a real-time indication of distance between the reference and mark points. It is further understood that layout mark locator 660 can be configured to dynamically display a fine navigation icon in any desired manner. For example, fine navigation icon 764 or another suitable fine navigation icon can enlarge and shrink based on the distance to the mark point, among other dynamic display options.

Figure 15:
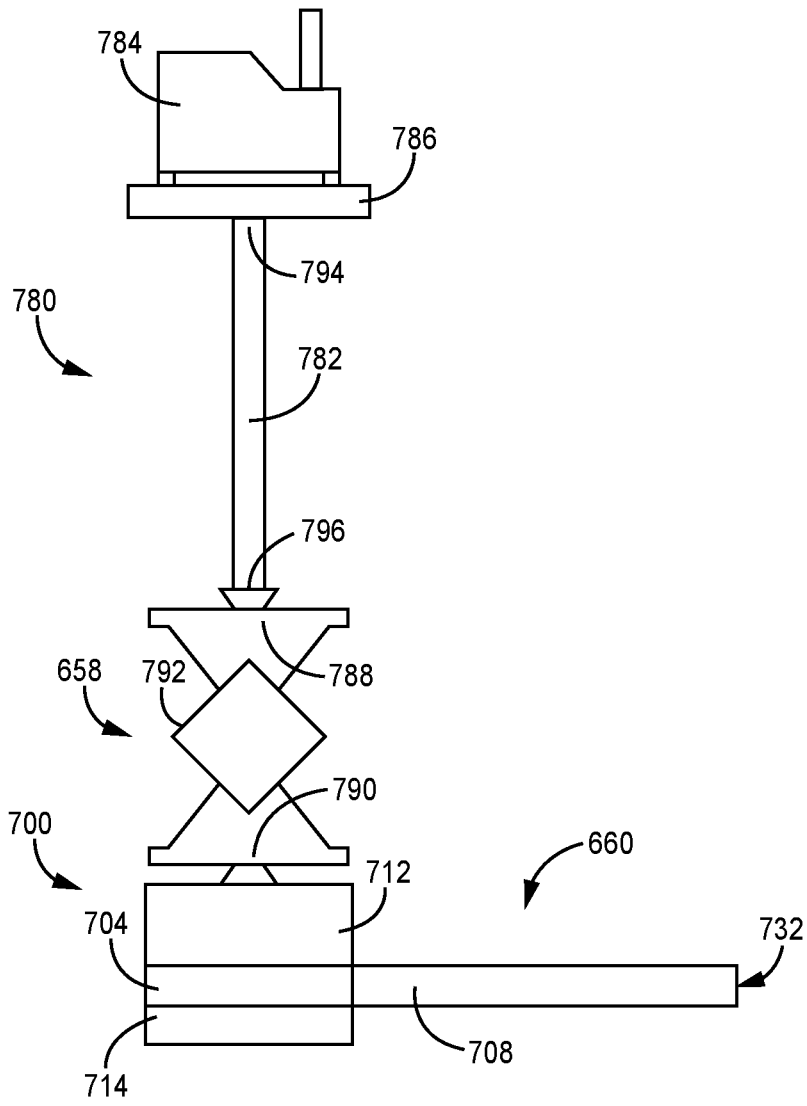
FIG. 15 is an elevation view of the layout mark locator shown in FIGS. 13A-F and an example of a prism pole.

FIG. 15 is an elevation view of layout mark locator 660 attached to prism pole 780. As shown in FIG. 15, prism pole 780 can be mounted to layout mark locator 660. Prism pole 780 is configured for use with electronic surveying equipment such as a total station. It should be understood that layout mark locator 660 can be used or combined with any suitable apparatus for locating layout marks on a build site, and that the assembly shown is merely one example of such a detail locating apparatus.

Prism pole 780 includes prism assembly 656, shaft 782, remote control 784, and protective bumper 786. Prism assembly 656 includes first attachment portion 788, second attachment portion 790, and prism 792 secured between first attachment portion 788 and second attachment portion 790. Shaft 782 includes first end 794 and second end 796 opposite first end 794. The electronic surveying equipment can be, for example, a total station.

In the example depicted in FIG. 5, remote control 784 is mounted to first end 794 of shaft 782. Protective bumper 786 is mounted between remote control 784 and first end 794. Protective bumper 786 is configured to prevent both remote control 784 and prism assembly 656 from being damaged if prism pole 780 falls over. Prism assembly 656 is mounted to shaft 782 by attaching first attachment portion 788 to second end 796. Remote control 784 can facilitate communications with the total station and/or handheld device 658 (FIG. 12). It should be understood, however, that some examples do not include a remote control 784 and layout mark locator

660 instead includes communications circuitry configured to facilitate direct communications.

Prism 792 is mounted near the base of prism pole 780. By mounting prism 792 near the base of prism pole 780 any rotational offset from a purely vertical orientation of prism pole 780 will have a negligible impact on the position of prism 792 and the placement of wall lines WL at the construction site. Additionally, while it is impractical to mount prism 792 near the base of prism pole 780 while conducting a conventional survey, due to the contour of the earth possibly cutting off a line of sight between the electronic surveying equipment and prism 792, a construction site is typically level, which permits an unbroken line of sight from the electronic surveying equipment to prism 792.

Prism 792 can be used with electronic surveying equipment to determine the location of prism 792 on the build site. As prism 792 is located vertically above point marker base 700, measuring the location of prism 792 provides a location of point marker base 700 on the build site. This positional data can be used to determine the reference point used for generating go-to information. Remote control 784 can be used to control the electronic surveying equipment, allowing a single user to operate both detail locating apparatus 600 and the electronic surveying equipment.

In the example depicted in FIG. 15, point marker base 700 is attached to the base of prism pole 780 such that point marker base 700 forms the base of prism pole 780. Thus, detail locating arm 702 is also located near the base of prism pole 780 and is located vertically below prism 792. Shaft 782 can be used to handle layout mark locator 660 during use. In some examples, detail locating arm 702 can be freely rotated about point marker base 700 during use.

Point marker base 700 can be weighted such that prism pole 780 will remain vertically oriented when layout mark locator 660 is set down. Weighted mount 712 allows a single operator to conduct construction layout even when adverse conditions, such as wind, would usually cause significant offset of prism 792 from vertical, potentially causing inaccurate readings. In some examples, prism 792 is mounted at a height such that prism 792 remains sufficiently level to provide accurate readings without the use of any leveling device in addition to point marker base 700.

In some examples, prism pole 780 can be connected to layout mark locator 660 by attachment to point marker base 700 by, for example, a set screw (e.g., set screw 66, FIG. 13B) that connects weighted mount 712 to the second attachment portion 790 of prism assembly 656. Base 714 can be attached to weighted mount 712 by fasteners 74, which are arranged such that disk 57 is rotatable around the set screw and an axis A-A along which the set screw and shaft 782 extend. In some examples, weighted mount can include leveler holes (FIG. 13B) configured to accept leveling screws between weighted mount 712 and second attachment portion 790. The leveling screws can be used to level and prevent rocking of prism 792 and point marker base 700 on typical environmental site debris. In other examples, leveler holes can project through base 714 or be otherwise formed on an opposite side of base 714, such that leveling screws can be disposed between base 714 and the ground. A level (not shown) can be attached to prism pole 780 in order to ensure accurate readings from electronic surveying equipment using prism 792. Similarly, prism pole 780, point marker base 700, or another component of layout mark locator 660 can include a sensor configured to measure vertical alignment of prism pole 780 to ensure accurate readings using prism 792. Alternatively, any other suitable connections can serve as a leveling mechanism for prism 792.

Figure 16A:
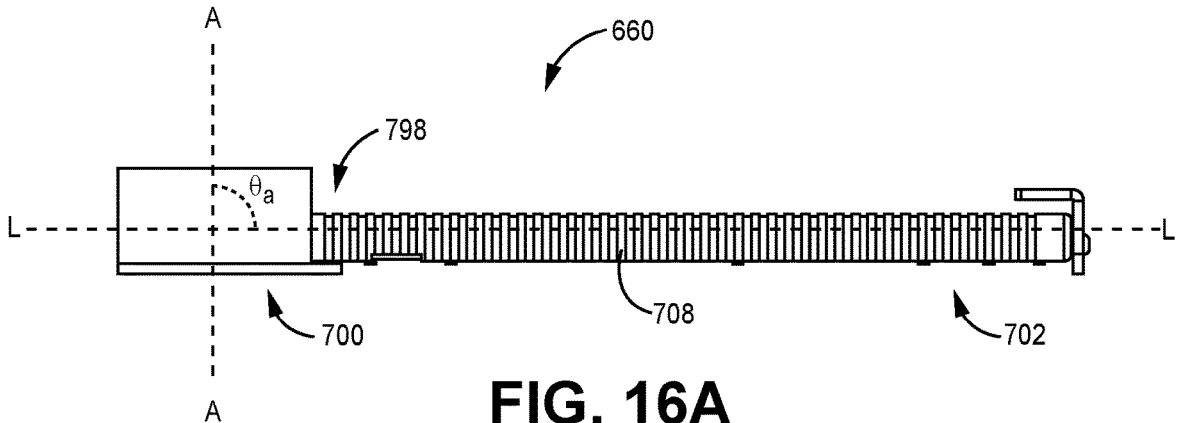
FIG. 16A is a side view of an embodiment of the layout mark locator shown in FIGS. 13A-F including a pivoting connection.
Figure 16B:
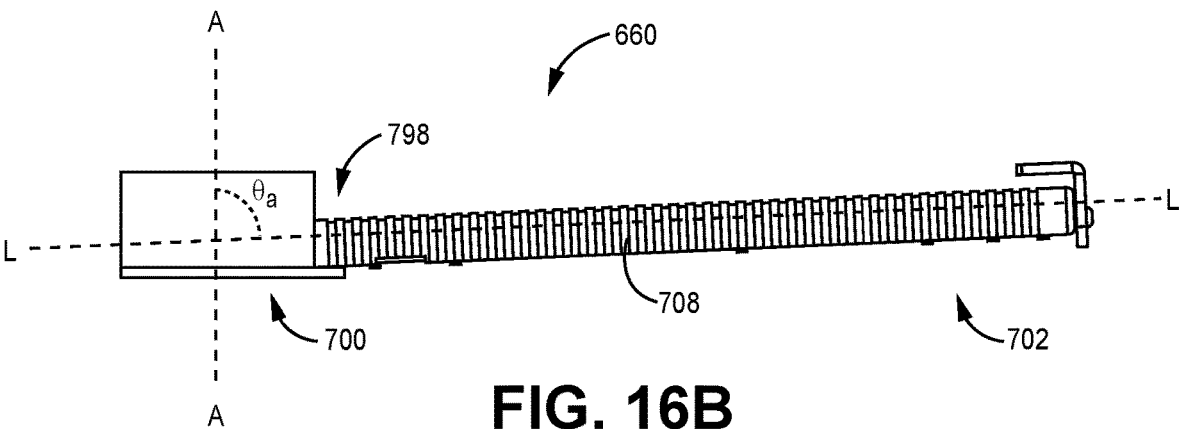
FIG. 16B is a side view of the layout mark locator and pivoting connection shown in FIG. 16A.

In some examples, layout mark locator 660 can include a pivoting connection between point marker base 700 and detail locating arm 702. FIGS. 16A-B are side views of an embodiment of layout mark locator 660 that includes pivoting connection 798. Point marker base 700, detail locating arm 702, arm 708, axis A-A, axis L-L and angle $\theta_a$ are also depicted in FIGS. 16A-B. For convenience, FIGS. 16A-B will be described together.

As described previously, axis L-L extends substantially parallel with detail locating arm 702 and axis A-A extends substantially parallel with point marker base 700. Angle $\theta_a$ is the angle formed between the portion of axis L-L that overlaps with arm 702 and the portion of axis A-A that extends vertically away from the intersection of axis A-A and axis L-L. Pivoting connection 798 is configured to allow an operator to adjust angle $\theta_a$ by adjusting the relative positions of point marker base 700 and or detail locating arm 702. Pivoting connection 798 can include a pivot joint, a hinge, or another suitable pivoting connection.

In FIG. 16A, angle $\theta_a$ is approximately 90°, such that axis A-A and axis L-L are substantially perpendicular. In FIG. 16B, the value of angle $\theta_a$ has been adjusted using pivoting connection 798 to be less than 90°, such that an axis A-A and axis L-L are not perpendicular. The values of angle $\theta_a$ depicted in FIGS. 16A-B are provided to illustrate the operation of pivoting connection 798, and in other examples pivoting connection 798 can allow other possible values of angle $\theta_a$, including values greater than 90°.

Generally, it is advantageous for angle $\theta_a$ to be approximately 90° in order to improve the accuracy with which construction layout is performed and layout marks are placed on the build site using layout mark locator 660. However, detail locating arm 702 is generally located close to the surface of the build site during operation and can collide with debris or other obstacles, such as exposed nails, on the surface of the build site as layout mark locator 660 is moved to perform construction layout. An operator can use pivoting connection 798 to lift detail locating arm 702 as detail locating arm 702 is passed over debris or other site obstacles, and subsequently lower arm 702 until angle $\theta_a$ is approximately 90° to continue performing construction layout.

Figure 17A:
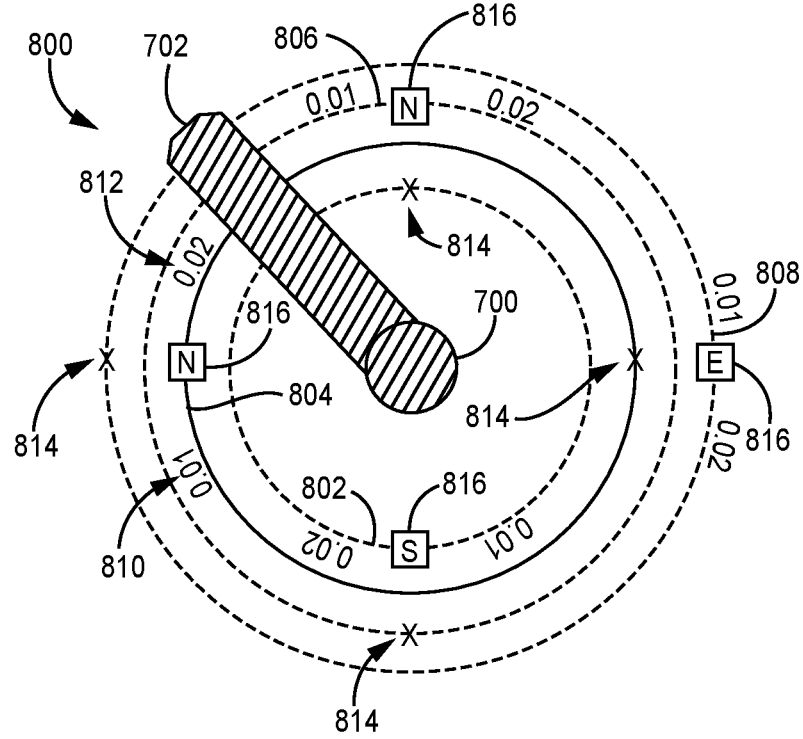
FIG. 17A is a schematic diagram of a coordinate scheme for selecting an icon according to an example of the present invention.
Figure 17B:
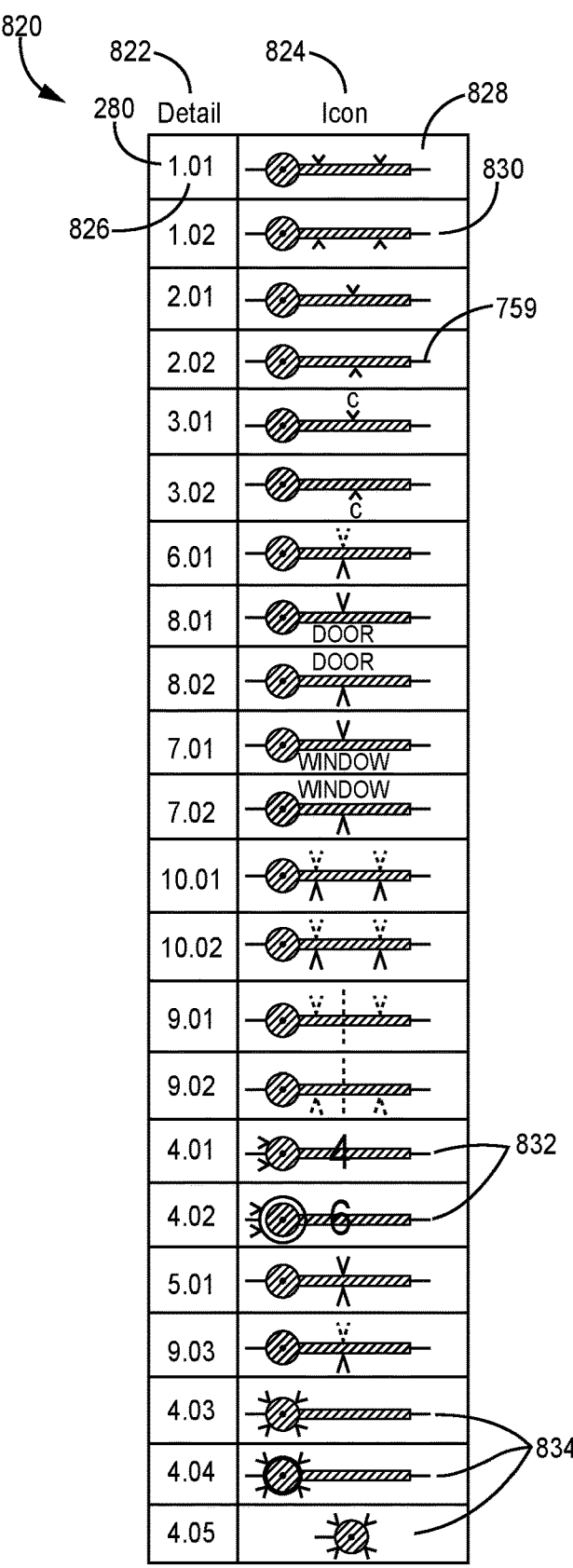
FIG. 17B is a schematic diagram of an icon table according to an example of the present invention.

FIG. 17A is a schematic of a coordinate scheme 800 for selecting an icon. In some instances, coordinate scheme 800 may be referred to as a coordinate grid. FIG. 17B is a schematic of an icon table 820 to be used in conjunction with coordinate scheme 800 or other lookup tables. As will be explained in more detail subsequently, coordinate scheme 800 is a visualization of logic that is used to modify icon detail 280 for a mark point according to the orientation of detail locating arm 702. The modified icon detail 280 values can then be used to cross reference icon table 820 in order to generate icons for display by user interface 612*b* of layout mark locator 660. The icons generated according to coordinate scheme 800 and icon table 820 can be displayed by user interface 612*b* as detail icons at any of icon locations 728, 730, 732, 734, 736, or 737 (FIG. 13B), based on the icon position 282 values (FIG. 3A) for the corresponding mark points. FIGS. 17A and 17B will be discussed together.

Coordinate scheme 800 is a visualization that illustrates operations that can be performed by control circuitry, such as control circuitry 614, based on the orientation of detail locating arm 702, as measured by orientation sensor 616. As such, coordinate scheme 800 or instructions that perform the functions represented by coordinate scheme 800 can be stored on a memory and used by control circuitry to modify detail icon 280 values.

Coordinate scheme 800 includes four radial and concentrically-distributed compass circles: south circle 802, west circle 804, north circle 806, and east circle 808. Each compass line includes a first zone 810 (indicated by "0.01") and a second zone 812 (indicated by "0.02"). Each first zone 810 is separated from each second zone 812 by an axis extending from a separation point 814 to the directional marker 816 for that compass circle. For example, for west circle 804, first zone 810 is separated from second zone 812 by separation point 814 and the direction marker for west circle 804, such that first zone 810 encompasses the portion of west circle 804 extending clockwise from west directional marker 816 to separation point 814, and second zone 812 encompasses the portion of west circle 804 extending counterclockwise from west directional marker 816 to separation point 814. Each first zone 810 and second zone 812 encompass a 180-degree swath, in the example shown.

Coordinate scheme 800 corresponds to the orientation of detail locating arm 702 about point marker base 700 relative to the relative north of the site. Control circuitry can determine the icon to display based on whether detail locating arm 702 is disposed in a first zone 810 or a second zone 812. For example, when detail locating arm 702 is located in a first zone 810, the control circuitry can add a value of 0.01 to the value recalled from the icon detail 280 (FIG. 3A) for that point. Likewise, when detail locating arm 702 is located in second zone 812, the control circuitry can add a value of 0.02 to the value recalled from the icon detail 280 column for that point. Thus, coordinate scheme 800 is utilized by control circuitry 36 to select an icon to be displayed based on the orientation of detail locating arm 702, the bearing 220, and icon detail 280. The value added (e.g., 0.01 or 0.02) to that shown in icon detail column 280 based on the orientation of detail locating arm 702 relative the active compass circle can be referred to as a detail modifier.

In the example shown, the active compass circle in coordinate scheme 800 is depicted as west circle 804. The active compass circle is chosen by the control circuitry from south circle 802, west circle 804, north circle 806, and east circle 808 based on bearing 220. For example, if the value of bearing 220 returned from detail formation table 100 is "W," then west circle 804 is the active compass circle for that mark point and the icon displayed is based on the location of detail locating arm 702 relative to that active compass circle. In the depicted example, detail locating arm 702 is located in second zone 812 of west circle 804.

While coordinate scheme 800 has been described as having four compass circles corresponding to south, west, north, and east relative directions, it is to be understood that coordinate scheme 800 can have any number of compass circles corresponding to any number of directions. For example, coordinate scheme 800 could also have compass circles corresponding to southwest, northwest, northeast, and southeast directions. Coordinate scheme 800 could be further divided into north-northwest, west-northwest, west-southwest, south-southwest, north-northeast, east-northeast, east-southeast, and south-southeast directions.

Further, while coordinate scheme 800 has been described as being a diagram of concentric circles, the information stored in coordinate scheme 800 can be represented in any form usable by the control circuitry for selecting and displaying an icon, such as a table, wherein first zone 810 and second zone 812 are indicated by degrees of rotation of detail locating arm 702 about point marker base 700. For example, a common directional marker can be set at relative north as 0°, first zone 810 for the west compass circle 804 can correspond, in the clockwise direction, to 90° to 270° quadrants and second zone 812 can correspond to 270° to 90° quadrants. In another example, if directional marker 816 of the west compass circle 804 is set as 0°, first zone 810 for the west compass circle can correspond to 180° to 360° of rotation in the clockwise direction and second zone 812 corresponds to 0° to 180° of rotation. It is to be understood that some icons are not based on the orientation of detail locating arm 702. For example, mark types that have a reference point 222 of "base" can be represented by detail icons that are not dependent on the orientation of detail locating arm 702.

Icon table 820 can be stored on a memory and used by control circuitry to select a detail icon for display by detail locator 600. Icon table 820 is shown as including modified detail values 822 and detail icons 824. Modified detail values 822 are formed by modifying icon detail 280 values (FIG. 3A) with detail modifier 826 according to the process represented by coordinate scheme 800. For example, the position column 282 (FIG. 3A) can encode a symbol or phrase, such as "grid," or a code, such as "B.01," to indicate that the detail modifier 826 should be derived from coordinate scheme 800. In the depicted example, a modified detail value of "1.01" corresponds to icon entry 828, while a modified detail value of "1.02" corresponds to icon entry 830. Notably, both icon entries 828 and 830 are for detail icons with symbols for orienting arrows 12, but are mirror images of each other. Thus, in combination, coordinate scheme 800 and icon table 820 allow control circuitry to recall and display the appropriate detail icon based on the orientation of detail locating arm 702, allowing the operator to accurately mark the build site with the appropriate wall mark. Mirrored icons can exist for other types of detail icons, including detail icons not depicted in icon table 820.

Using icon entries 828 and 830 as examples, the control circuitry knows that a feature marked by a defined point exists in a certain direction relative the mark point. Utilizing the appropriate icon entry 828 and 830 when detail locating arm 702 is in the active zone ensures that the marked detail is always properly oriented on the site. For example, icon entry 828 shows arrows pointing west when detail locating arm 702 is in zone 810 of the west circle and icon entry 830 also shows arrows pointing to the west when detail locating arm 702 is in zone 812 of the west circle. Detail locator 600 thereby accurately displays the relevant detail regardless of the orientation of detail locating arm 702. When used in combination, coordinate scheme 800 and icon table 820 allow detail locator 600 to display a detail icon that provides enhanced information about the proper location of layout marks on the build site relative to detail locator 600.

Icon table 820 is shown as including variety of icons associated with various positions of various marks. It should be understood that icon table 820 can contain any suitable icons for any potential layout marks based on a given site, floor plan, or layout system.

Icon table 820 can also contain detail icons 824 that are not dependent on the orientation of detail locating arm 702. For example, icons for angled wall marks 14 (FIG. 1A) can be represented using icon entries 832 and 834. Generally, control circuitry does not reference coordinate scheme 800 to generate to modified detail values 822 for angled wall marks 14 (FIG. 1A). Rather, the value stored as width 224 (FIG. 3A) is used as the detail modifier 826 for angled wall marks 14. In some examples, an alternative lookup table can be utilized to generate modified detail values 822 for angled wall marks 14 (FIG. 1A). These icons can be used, for example, to mark points that have a "base" reference point 222 and are located using point marker base 700 rather than detail locating arm 702.

Icon entries 832 and 834 include circles surrounding the depiction of point marker base 700, a number based on the size of wall 16, and marking chevrons to indicate a position that the wall extends. A number "4" in the icon indicates to the operator that wall 16 is a standard 2×4 wall that is 3.5 inches wide, and a number "6" indicates that the wall is a 2×6 wall that is 5.5 inches wide. Icon entries 832 and 834 indicate to the operator that a circle should be marked about the base and the chevrons should be marked relative the circle. As described previously with respect to FIG. 13C, lines can be drawn between opposing chevrons, the intersection of which denotes the location of the mark point. Though in the depicted example the layout marks surrounding the depiction of point marker base include a circle and four chevrons, crosshair icons or any other suitable icons can also be used in icons for angled wall marks 14.

Altering the displayed icon throughout operation provides significant advantages. Altering the displayed icon based on the orientation of detail locating arm 702 ensures that the icon displayed provides correct information to the operator. The icon displayed is oriented to indicate the correct direction of wall lines or other detail associated with the mark point regardless of the zone (e.g., zone 810 or zone 812) that detail locating arm 702 is disposed in.

As depicted in FIG. 17B, detail icons 824 stored in icon table 820 include midlines 749. However, in other examples, some or all of detail icons 824 do not include midlines 749 and midlines 749 are added by control circuitry after the correct detail icon 824 has been recalled based on the position of detail locating arm 702. For example, the entry of icon entries 834 that has a detail value 822 of "4.05" does not include a midline.

Figure 18:
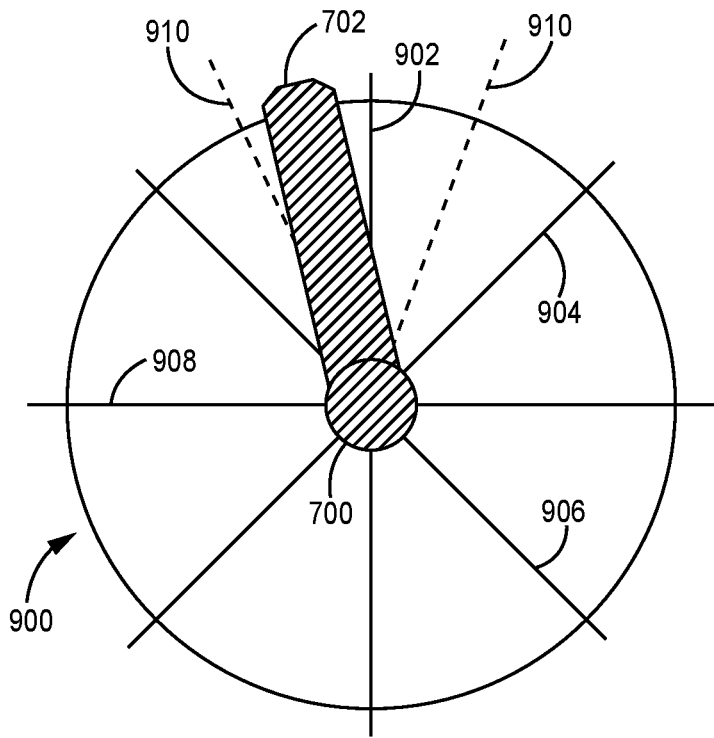
FIG. 18 is a schematic diagram of an active zone scheme according to an example of the present invention.

FIG. 18 shows schematic of zone scheme 900 with a top-down view of marker base 700 and detail locating arm 702 superimposed on top of zone scheme 900. Zone scheme 900 can be utilized by the control circuitry 614 to determine an active zone for a mark point and further to select an active mark point based on the orientation of detail locating arm 702. Like coordinate scheme 800, zone scheme 900 is a visualization that illustrates operations that can be performed by control circuitry, such as control circuitry 614, based on the orientation of detail locating arm 702, as measured by orientation sensor 616. Instructions that perform the functions represented by zone scheme 900 can be stored on a memory and used by control circuitry to generate active zone information.

As used herein, an "active zone" of a mark point refers to the orientation of detail locating arm 702 from relative north of the build site in which other features of detail locator 600 are active for that mark point, such as general and/or fine navigation icons for navigating to the mark point. Other elements of icons displayed by detail locator 600 can be altered when detail locating arm is located in an active zone. For example, if the defined point descriptor 20 of a defined point provides for multiple mark points, each mark point can have a separate active zone and an operator can select a mark point for navigation and marking by rotating the detail locating arm 702 into the appropriate orientation from relative north to activate that mark point. As described previously, icons for each mark point can be held in a fixed orientation from relative north such that an operator can select a mark point by rotating detail locating arm 702 to match the orientation of an icon shown by detail locator 600, or in the opposite direction to prevent detail locating arm 702 from blocking EDM signal 676 (FIG. 12). Detail locator 600 can provide additional feedback to the operator to indicate that a given mark point has been selected. For example, detail locator 600 can change the outline of an icon (e.g., from dotted to continuous, among other options) to indicate that the corresponding mark point has been selected. Detail locator 600 can also change, for example, the opacity of an icon to indicate that the corresponding mark point has been selected. As a further example, detail locator 600 can provide an auditory cue via audio device 726 when a mark point has been selected. In some examples, detail locator 600 can stop displaying icons for mark points associated with inactive zones or can display those inactive icons at other icon locations on detail locating arm 702. For example, the inactive icons can be displayed at icon locations 730 and 732 (FIG. 13B) while the active icon is displayed at icon location 728 (FIG. 13B).

The control circuitry 614 can determine which icons are active and can selectively display icons on detail locator 600 based on zone scheme 900 and data regarding the orientation of detail locating arm 702. In the example shown, zone scheme 900 is divided into octants according to lines 902, 904, 906, and 908. The ends of lines 902 and 904 correspond to relative cardinal directions associated with the relative cardinal directions of the converted floor plan. The ends of lines 906 and 908 correspond to relative ordinal directions. Thus, the octants formed by lines 902, 904, 906, and 908 are descriptive of the angles of rotation of detail locating arm 702 about point marker base 700 and the relative orientation of detail locating arm 702 relative to plan north.

In the example depicted in FIG. 18, an active zone can be defined between lines 910, which have reflection symmetry about line 902. The active zone can be determined based on the bearing 220 and detail modifier 826 for that mark point. The active zone is offset by 90-degrees from the bearing 220 provided for that mark point. For example, in zone scheme 900, the active zone is based on a bearing value of either "E" or "W" and encompasses angles of –22.5° to 22.5° about the relative north assigned to the build site. If the active zone was based on a bearing 220 value representing north or south, it would encompass angles of –22.5° to 22.5° about the relative east or west. The active zone can be further defined by the detail modifier 826 for that point type. For example, assuming point type has a bearing "W," then the active zone that is shown in FIG. 18 is for an icon having a detail modifier 826 of 0.02. The same point type with the same bearing "W" can have an active zone about relative south for a detail modifier 826 of 0.01. As such, the active zones can be dynamically updated based on the orientation of detail locating arm 702. Referring again to FIG. 13B, the detail icon 728, 730, 732 for a mark point having a north or south bearing 220 would be oriented to the relative east or relative west, such that the midline 749 of the icon would overlap with the center confidence line 748 when detail locating arm 702 is pointed toward the relative east and/or the relative west.

Angled wall marks can have a compass direction associated with the angled wall mark. The active zone for such an angled wall mark can be similarly based on the bearing 220 and, in some examples, the detail modifier 826. For example, an angled wall mark having a bearing 220 of "NE" can have its active zone about relative northeast or about relative southwest, depending on the detail modifier 826 for that angled wall mark.

In some examples, an angled wall mark does not have a direction associated with that mark. In such an example, the active zone for the angled wall mark can be any zone not currently assigned as an active zone. For example, if the defined point has two mark points, one having a bearing "E" and the other "A," then the active zones for the angled mark associated with the "A" are those not associated with the mark point having a bearing of "E". As such, "A" can be active in any zone other than those about relative north and relative south.

Detail locator 600 can selectively display certain icons or detail information depending on the orientation of detail locating arm 702 and whether detail locating arm 702 is located within an active zone. For example, if a defined point has more than one mark point, such as is the case for mark point entries 298 and 299 in detail formation table 100 (FIG. 3A), the icons displayed can be altered based on the active zone for each point type. The detail icon displayed can vary based on the active zone information. For example, the icon associated with the active zone can be altered to indicate that that icon is the active icon. For example, the color and/or opacity of the detail icon can change, the outline thickness of the detail icon can vary, the outline of the detail icon can include change between dashed and undashed, etc. In some examples, an icon can be activated within the active zone and the operator can be further alerted when the icon is properly aligned for marking. In some examples, the properties of the active icon can change within the active zone. For example, the icon can become solid when in the active zone and can have varying degrees of shading depending on whether the detail locating arm 702 is aligned with the midpoint of that active zone. In some examples, the orientation of the marking detail associated with the active icon can dynamically change to ensure that any marks made are properly aligned. Where more than one mark point is associated with a defined point, it can be advantageous that the active zones for each mark point are non-overlapping. Non-overlapping active zones allow for a single mark point to be selected as "active" at a time.

The general navigation and/or fine navigation icons can also be varied based on the active zone information. As described previously, an operator can cause detail locator 600 to display general navigation and/or fine navigation icons for the mark point by rotating detail locating arm 702 into the active zone corresponding to that mark. Similarly, if a point type provides for a secondary point in addition to a primary point, detail locating arm 702 can display the navigation information for the secondary point in the active zone for the secondary point using a general navigation icon or a fine navigation icon and can display icons for the primary point elsewhere on detail locator 600, such as at icon locations 734 and 736.

The active zone designation allows the operator to locate and mark multiple details for a single defined point utilizing layout mark locator 660. As described previously, the orientations of detail icons displayed by user interface 612b can be fixed based on relative north (e.g., dynamically shift relative to the display as the display moves) to provide a visual indicator to the operator of what orientation detail locating arm 702 should be rotated to select that mark point for locating and marking. An operator can select a mark point by rotating detail locating arm 702 to match the orientation of the displayed detail icon. Once the operator has selected a mark point by rotating detail locating arm 702 into the active zone, the control circuitry can generate navigation instructions for that mark point based on the stored coordinate information for the defined point and point adjust 286 and reference point 222 information from the entry for the mark point in the detail formation table. Detail locator 600 can display the navigation instructions as a general and/or fine navigation icon. In combination, active zone scheme 900 allows for an operator to efficiently switch between mark points and have various information about those marks update automatically, including navigation instructions for the mark point.

For example, if a defined point has three separate mark points associated with that single defined point (as indicated by its defined point descriptor 20), each of the three mark points will be assigned an associated active zone. The icons for each of the three mark points can be displayed simultaneously. Detail locating arm 702 being in an active zone causes detail locator 600 to display navigation instructions and other information for the icon associated with the active zone while the other two icons are inactive. When detail locating arm 702 exits the active zone of that icon, then that previously active icon can be inactivated.

The active and inactive zones facilitate quick and efficient layout operations. Detail locator 600 automatically displays the correct icon and associated detail based on the position of detail locating arm 702. The active zones ensure that the detail is accurately marked on the site and prevents the operator from inadvertently marking the incorrect layout mark at a given mark point.

While FIG. 18 depicts eight relative directions about which to orient active zones, any number of relative directions could be used for orienting active zones. Further, while active zones are described as forming non-overlapping 45° sectors extending symmetrically from relative cardinal and ordinal directions, the active zones can be a sector of any suitable size for use in controlling detail locator 600, including sectors extending asymmetrically from a relative compass direction.

Figure 19:
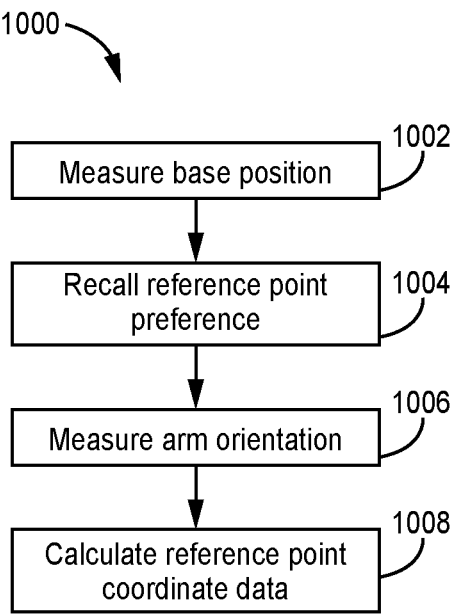
FIG. 19 is a flow diagram of an example of a method of generating a reference point.

FIG. 19 is a flow diagram of method 1000 of generating a reference point using layout mark locator 660 (FIGS. 13A-F). Method 1000 includes sequential steps of measuring the base position (step 1002), recalling a reference point preference (step 1004), measuring arm orientation (step 1006), and calculating reference point coordinate data (step 1008). Any or all steps of method 1100 can be performed automatically by control circuitry or manually by a user.

In step 1002, the position of point marker base 700 is measured. The position of point marker base 700 (FIGS. 13A-F) can be measured, for example, using prism assembly 656 and total station 654 (FIG. 12). More specifically, total station 654 can measure the distance to prism assembly 656 and an angle between lines extending from total station 654 to prism assembly 656 and a backsight point of known location. The position of prism assembly 656 can then be calculated using the distance and angle measurements. Where point marker base 700 includes prism assembly 656, point marker base 700 is mounted directly beneath prism assembly 656. Consequently, the measured position of prism assembly 656 can be used as the position of point marker base 700. Alternatively, point marker base 700 can include GPS or GNSS equipment capable of measuring the location of point marker base 700.

In step 1004, the reference point preference is recalled from the detail formation table. With reference to detail formation table 100 (FIG. 3A), a reference point 222 value of "ruler" can indicate that the reference point should be a point along detail locating arm 702 (FIGS. 13A-F) and reference point 222 value of "base" can indicate that the reference point should be the location of point marker base 700 (FIGS. 13A-F). If the recalled reference point preference is point marker base 700, method 1000 can stop at step 1004, as the location measured in step 1002 is the location of point marker base 700. The coordinate position of the reference point can then be used with other methods disclosed herein, such as method 500 (FIG. 10). If the recalled reference point preference is a point along detail locating arm 702, steps 1006 and 1008 are performed to generate the location of the point along detail locating arm 702.

In step 1006, the orientation of detail locating arm 702 is measured using orientation sensor 616 (FIGS. 13A-F). Orientation sensor 616 can measure, for example, the angle between detail locating arm 702 and magnetic north. In step 1008, the coordinate position of a reference point located along detail locating arm 702 is calculated using the orientation measured in step 1006 and the position of the base measured in step 1002. Once the orientation of detail locating arm 702 and the coordinate position of point marker base 700 are known, the northing and easting coordinate position of any location along detail locating arm 702 can be calculated, as is explained in more detail with respect to FIG. 20. The calculated position can then be used as a reference point with other methods disclosed herein, such as method 500 (FIG. 10). Operator preference or trade application requirements can be used to select the specific portion of detail locating arm 702 that is used as a reference point. For example, the midpoint of detail locating arm 702 can be used as the reference point to improve navigation to a mark point location.

Method 1000 can be performed as part of step 504 of method 500 (FIG. 10) to calculate the position of a reference point for use in navigating to a mark point. Further, method 1000 can be performed repeatedly for each mark point stored in the detail formation table.

Figure 20:
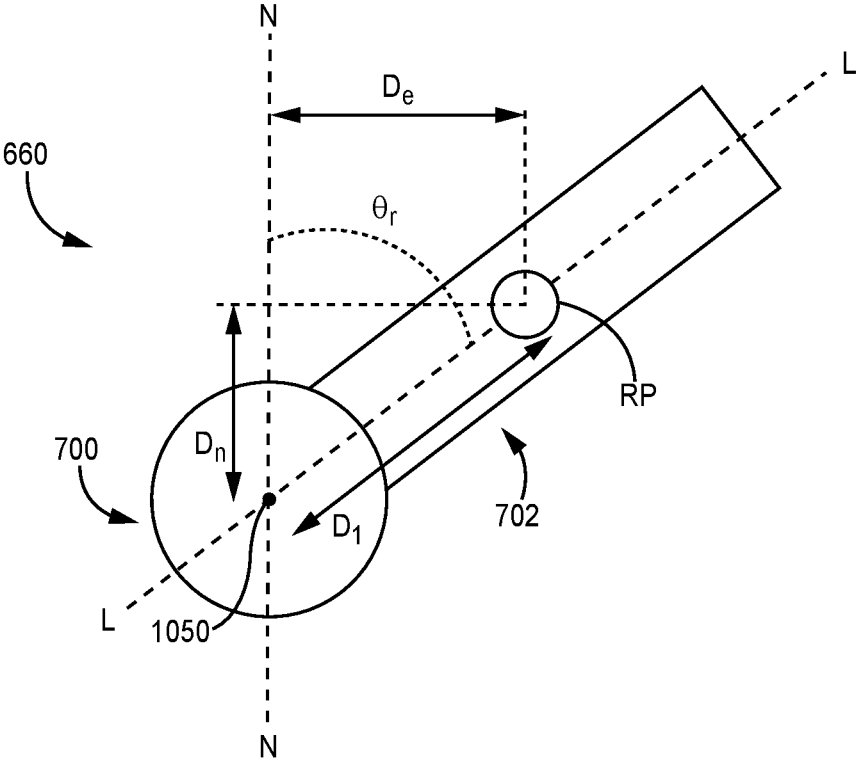
FIG. 20 is a top view of the layout mark locator of FIGS. 13A-F showing the coordinate position of a reference point.

FIG. 20 is a top-down view of layout mark locator 660 (FIGS. 13A-F) that illustrates an example of how a coordinate position of a reference point along detail locating arm 702 can be calculated. Angle $\theta_r$ is the angle between longitudinal axis L-L, which extends from point marker base 700 through the midline of detail locating arm 702 (FIGS. 13A-F), and axis N-N, which extends from point marker base 700 toward relative north. Reference point RP is offset from the center 1050 of point marker base 700 along axis L-L by distance $D_1$. Distance $D_1$ is known and selected according to operator preference or trade application requirement. Using the measured angle $\theta_r$ and distance $D_1$, northing distance $D_n$ and easting distance $D_e$ can be calculated by trigonometric operations. Northing distance $D_n$ and easting distance $D_e$ are distances measured relative to the center 1050 of point marker base 700. Accordingly, the location of reference point RP can be calculated by adding northing distance $D_n$ and easting distance $D_e$ to the measured northing and easting coordinate values, respectively, of point marker base 700 measured in step 1002 of method 1000 (FIG. 19). Alternatively, $D_1$ and angle $\theta_r$ can also be used to generate a reference point vector representative of the distance between point marker base 700 and reference point RP. The reference point vector can be decomposed into orthogonal northing and easting vectors representative of the northing component and the easting component of the reference point vector, respectively.

For simplicity, the relative north of the build site is aligned with magnetic north in FIG. 20. Relative north is not required to be aligned with magnetic north to generate northing and easting coordinate data for a point along detail locating arm 702 (FIGS. 13A-F). Where relative north is not aligned with magnetic north, the angle between relative north and magnetic north can be measured. The orientation of detail locating arm 702 measured in step 1006 of method 1000 (FIG. 19) can then be offset by the angle between relative and magnetic norths before the orientation data is used to calculate northing and easting coordinate information for the reference point.

As mentioned previously, some examples of layout mark locator 660 (FIGS. 13A-F) do not include arm 708 and instead have a user interface 612b that includes an annular display 724. FIG. 21 is a top-down illustration of layout mark locator 1160, which includes user interface 1112 but is otherwise identical to layout mark locator 660. User interface 1112 includes annular display 1124, which surrounds point marker base 1170 and has a ring thickness $R_r$. Point marker base has a radius $R_b$. Navigation icon 1144 and detail icon 1138 are displayed along display axis 1172.

The combined radial extent of radius $R_b$ and ring thickness $T_r$ defines the total radial extent $R_e$ of layout mark locator 1160. Advantageously, user interface 1112 can display icons, including navigation and detail icons, at any position of annular display 1124, thereby replicating the total rotation of display 724 on detail locating arm 702 (FIG. 13A-F) without requiring a rotatable component. Further, user interface 1112 can advantageously display navigation and detail icons for multiple mark points simultaneously, including mark points associated with the same or with different defined points. In some examples, user interface 1112 can display navigation icons and detail icons along axes extending from the center of user interface 1112 (i.e., above point marker base 1170). Each axis can correspond to a single mark point and can be oriented according to the mark point bearing 220 for that mark point. For example, navigation and detail icons for a mark point having a north or south bearing 220 value can be displayed on an east or west extending axis on user interface 1112, thereby replicating the active zone function of layout mark locator 660 discussed previously with respect to FIG. 18. In the depicted example, general navigation icon 1144 and detail icon 1138 are displayed by display 1124 along display axis 1172, which extends from the center of annular user interface 1112 to an outer edge of annular user interface 1112. Additionally and/or alternatively, annular display can display navigation and detail icons for different mark points at different locations of display 1124 not aligned with an axis extending from the center of annular user interface 1112.

As depicted in FIG. 21, navigation icon 1144 and detail icon 1138 resemble, respectively, navigation icon 744 and detail icons 738, 740, 742 depicted in FIG. 13B. However, navigation icon 1144, detail icon 1138, and other navigation icons and detail icons displayed by user interface 1112 can take any suitable shape for conveying navigation and detail information. For example, detail icon 1138 can resemble the shape of layout mark locator 1160 rather than the shape of layout mark locator 660.

Orientation sensor 616 can be mounted elsewhere along the detail locating apparatus. Orientation data from orientation sensor 616 can be used to fix the position of icons displayed by user interface 1112 relative to the build site as layout mark locator 1160 is rotated. For example, user interface 1112 can fix the orientation of the display axes used to display navigation and detail icons such that each axis is continuously oriented along a single compass direction as layout mark locator 1160 is rotated.

Display 1124 can also be transparent or translucent, similar to a heads-up display. When a mark point comes within the radial extent $R_t$ of layout mark locator 1160, user interface 1112 can display icons within at a location within the annular extent $R_t$ of display 1124 that show the exact location of where individual layout marks should be made, increasing the overall accuracy with which an operator can make layout marks on the build site. Like user interface 612b, user interface 1112 can also display icons to indicate that marks should be made about point marker base 1170 (FIG. 17B). For example, radius R$_b$ can be selected to match a common measurement dimension used in construction layout or another trade application, allowing an operator to make certain layout marks by tracing around or making marks relative to point marker base 1170. Further, if more than one mark point is within the radial extent R$_t$ of the layout mark locator 1160, display 1124 can show icons showing the location of each mark point simultaneously, further increasing the efficiency with which an operator can perform construction layout or another building trade technique.

Metrics Generation and Monitoring

FIG. 22 is a flow diagram of method 1200 of generating metrics associated with locating mark points and marking detail. Method 1200 includes steps of starting a timer (step 1202) selecting a mark point (step 1204), storing a first time (step 1206), locating a mark point (step 1208), and storing a second time (step 1210). Any or all steps of method 1200 can be performed automatically by control circuitry or manually by a user.

In step 1202, a timer is started. The timer can be started manually or can be started automatically by control circuitry 614. Further, the timer can be started before step 1204 or at the same time step 1204 is performed. For example, the timer can be started automatically by control circuitry at the same time that the mark point is selected in step 1204. As a further example, the timer can be started at the beginning of construction layout before a mark point has been selected, such as when a controller detects that the detail apparatus used to perform construction layout is on a jobsite.

In step 1204, a mark point is selected. The mark point can be selected using any method disclosed herein and can be selected by an operator or by control circuitry. For example, the mark point can be selected by rotating detail locating arm 702 of layout mark locator 660 into an active zone (FIG. 18). As a further example, the mark point can be selected by manual input of an operator into a user interface device, such as user interface 612 of detail locator 600.

In step 1206, a first time is stored. The first time is stored substantially simultaneously to the selection of the mark point in step 1204 and the time is taken from the timer. As such, when step 1202 is performed substantially simultaneously as step 1204, the time stored in step 1206 can be zero or a near-zero value.

In step 1208, a mark point is located. The mark point can be located according to another method described herein, such as method 500 (FIG. 10), and can be located using a detail locating apparatus described herein, such as detail locator 600 (FIG. 11).

In step 1210, a second time is stored. Step 1210 is performed simultaneously or substantially simultaneously to step 1208, such that the second time stored in step 1210 is the time at which the mark point is located. This allows the first time to be subtracted from the second time to yield to total time required to locate the mark point after it is selected in step 1204. In some examples, control circuitry can detect that the mark point has been located in step 1208. For example, the control circuitry can determine that the mark point has been located when the reference point is aligned with the mark point. The control circuitry can then store the second time in step 1210 as it detects that the mark point is located in step 1208.

Steps 1202-1210 can be repeated for every mark point located on a construction site. Method 1200 can be used to determine the total time required to perform construction layout for a given floor plan. For example, the times required to locate individual mark points can be summed or the first time stored in step 1204 for the first mark point can be subtracted from the time stored in step 1210 for the final mark point to determine the total time. The total time can be compared against other total times to determine how efficiently a given operator can perform construction layout. Likewise, the total times can be used to track an operator's efficiency over time, thereby providing a metric to evaluate the progression of the operator's skill in performing construction layout. Further, the time required to locate the mark points can be subcategorized in order to provide more useful statistical information about a particular operator performing a method of locating mark points described herein. For example, the total time that a total station and a detail locating apparatus are active can be stored as "job time." Job time values can represent the total amount of time that workers are on a build site locating the mark points. Likewise, the total time that mark points are being located can be stored as "layout time." Differences between job time and layout time can be useful for increasing time efficiency on the build site. Further, the time that navigation icons are displayed, including the total time that general navigation icons and fine navigation icons are displayed, can be stored as "active layout time." Active layout time indicates the efficiency of a particular operator at locating mark points on the build site and traversing between the mark points. The time values can be stored to a computer-readable storage medium, such as computer-readable memory.

As method 1200 allows for the measurement of the time required to locate individual mark points, metrics relating to an individual group type, grid position, or trade detail descriptor can also be derived from the measured times. For example, the time data collected by method 1200 allows the time required to locate and mark all exterior wall points to be compared against the time required to place all corridor wall points. Similarly, the time data collected by method 1200 allows the time required to locate all mark points belonging to one unit to the time required to locate all mark points belonging to another unit.

The time data collected by method 1200 also allows for tracking of the time required to perform construction layout for different floor plans, allowing for more accurate estimates of job time to perform construction layout for the same or similar floor plans. Method 1200 can also be used to track layout progress in real-time, allowing for more accurate scheduling of, for example, material deliveries or for the scheduling of another phase of a project.

While measurements of job time, layout time, and active layout time have been described herein, it should be understood any relevant measurement for determining operator efficiency can be performed using the time measurements. Further, while method 1200 has been described as measuring efficiency of construction layout, it is to be understood that method 1200 can be performed for a variety of trade applications, including but not limited to plumbing, metal stud framing, or cement masonry.

Method 1200 can be performed multiple times and across multiple job sites and various times generated using method 1200 can be compared. Comparing times can indicate, for example, relative efficiency of various operators performing construction layout according to a method disclosed herein. The times can be compared across a single floor plan or across multiple floor plans. Further, the times compared can be those of a particular workforce, allowing a manager to understand the relative efficiency of individual operators, or can be of all operators worldwide, allowing the comparison of workforces and workers on a global scale. In order to facilitate comparison, times measured using method 1200 can be uploaded to a storage server. An operator can request data for comparison from the storage server and the data can be transmitted over a network to the operator. Alternatively, an operator can request that the servers perform the comparison and the results of the comparison can be transmitted over a network to the operator. Further, the servers can be preconfigured to perform certain comparisons. For example, the servers can be preconfigured to determine a certain number of operators having the fastest active layout times in a particular geographic region and can store the comparison as a numbered ranking. An operator can request the ranking from the server and the ranking can be transmitted over a network to the operator. The operator can thus compare their own time efficiency at performing layout methods described herein with other operators who have stored their time data on the storage server. While the servers have been described as preconfigured to determine a ranking of active layout times, it should be understood that the servers can generate any desired comparison of the time measurements.

While the methods described herein have generally referenced an operator, it should be understood that the operator can be a human operator or a computerized operator. For example, an autonomous or human-controlled robot can be configured to perform the methods of construction layout described herein. Components of detail locator 600 can be incorporated into or can be attached separately to an autonomous or human-controlled robot.

While the invention has been described with reference to an exemplary embodiment(s), it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of locating features for construction layout on a build site, the method comprising:

recalling, by control circuitry of a detail locating apparatus, a defined point descriptor associated with a first defined point, wherein the first defined point has first defined point coordinate data describing a location of a first floor plan feature on the build site;

parsing, by the control circuitry, the defined point descriptor into a parsed descriptor;

generating, by the control circuitry, a point configuration based on the first defined point coordinate data;

generating, by the control circuitry, detail data for a first mark point based on at least one of the point configuration and the parsed descriptor, wherein the first mark point is a first location defined relative to the defined point for one or more layout marks for describing the first floor plan feature;

generating, by the control circuitry, a first reference point coordinate position based on a coordinate position of the detail locating apparatus and the detail data;

generating, by the control circuitry, a first mark point coordinate position of the first mark point based on the first defined point coordinate data and the detail data;

generating, by the control circuitry, navigation instructions for locating the first mark point, wherein locating the first mark point comprises moving the detail locating apparatus to align the first reference point coordinate position with the first mark point coordinate position;

retrieving, by the control circuitry, a first detail icon associated with the first mark point based on the detail data; and displaying, by a user interface of the detail locating apparatus, the first detail icon.

2. The method of claim 1, wherein parsing the defined point descriptor into the parsed descriptor comprises:

separating the defined point descriptor to generate a group type and a grid position; and re-associating the group type and grid position to generate the parsed descriptor.

3. The method of claim 1, wherein generating the detail data for the first mark point comprises recalling detail data from a lookup table based on at least one of the point configuration and the parsed descriptor.

4. The method of claim 1, further comprising:

measuring, by electronic surveying equipment, a coordinate position of the detail locating apparatus; and transmitting the coordinate position to the control circuitry.

5. The method of claim 1, further comprising:

retrieving, by the control circuitry and based on the navigation instructions, a navigation icon type; and displaying, by the user interface, a navigation icon for the retrieved navigation icon type.

6. The method of claim 1, further comprising:

fixing, by the control circuitry, an orientation of the first detail icon relative to a relative north of the build site such that the orientation of the first detail icon is constant relative to the relative north as the detail locating apparatus moves about the build site.

7. The method of claim 1, further comprising determining, by the control circuitry, a wall width associated with the first mark point based on the detail data, wherein retrieving the first detail icon is further based on the wall width.

8. The method of claim 1, wherein the retrieving the first detail icon is further based on an orientation of the detail locating apparatus.

9. The method of claim 1, wherein the first detail icon includes a plurality of position line icons offset along the user interface.

10. The method of claim 9, further comprising:

determining, by the control circuitry, a wall width associated with the first mark point based on the detail data; and displaying a first position line icon of the plurality of position line icons and a second position line icon of the plurality of position line icons such that the first position line icon is spaced from the second position line icon by the wall width.

11. The method of claim 1, further comprising:

determining, by the control circuitry, a first offset between a previous defined point and a current defined point, the first mark point associated with the current defined point; and determining, by the control circuitry, a second offset between a next defined point and the current defined point;

wherein generating, by the control circuitry, the point configuration is further based on the first offset and the second offset.

12. The method of claim 1, further comprising:

generating, by the control circuitry, second detail data associated with a second mark point based on at least one of the point configuration and the parsed descriptor, wherein the second mark point is a second location defined relative to the defined point for one or more further layout marks for describing the first floor plan feature;

generating, by the control circuitry, a second reference point coordinate position based on the coordinate position of the detail locating apparatus and the second detail data;

generating, by the control circuitry, a second mark point coordinate position of the second mark point based on the first defined point coordinate data and the second detail data;

generating, by the control circuitry, second navigation instructions for locating the second mark point, wherein locating the second mark point comprises moving the detail locating apparatus to align the second reference point coordinate position with the second mark point coordinate position;

retrieving, by the control circuitry, a second detail icon associated with the second mark point based on the second detail data; and displaying, by the user interface, the second detail icon.

13. The method of claim 12, further comprising:

recalling, by the control circuitry, an active zone scheme;

generating, by the control circuitry, a first active zone based on the active zone scheme and the detail data, wherein the first active zone comprises a first sector extending about a base of the detail locating apparatus;

generating, by the control circuitry, a second active zone based on the active zone scheme and the second detail data, wherein the second active zone comprises a second sector about the base of the detail locating apparatus, and wherein the second sector does not overlap with the first sector;

displaying, by the user interface, the navigation instructions based on a detail locating arm extending from the base being located in the first sector, wherein an orientation of the detail locating arm is determined based on position data provided to the control circuitry by an orientation sensor associated with the detail locating arm; and displaying, by the user interface, the second navigation instructions based on the detail locating arm being located in the second sector.

14. The method of claim 1, further comprising:

displaying, by the user interface, a navigation icon based on the navigation instructions; and determining, by an orientation sensor associated with the detail locating apparatus, a first orientation of the detail locating apparatus;

providing the first orientation to the control circuitry;

dynamically updating, by the control circuitry, a second orientation of the displayed navigation icon based on the first orientation.

15. The method of claim 1, further comprising:

storing, by the control circuitry, a first time when the first mark point is selected;

storing, by the control circuitry, a second time when the first reference point is aligned with the first mark point; and generating, by the control circuitry, a locating duration based on the first time and the second time.

16. A detail locating apparatus for locating and marking detail on a construction site during construction layout, the detail locating apparatus comprising:

a marker base having a vertical axis extending therethrough;

a detail locator extending radially relative to the marker base, the detail locator comprising:

a user interface; and control circuitry configured to:

generate a navigation icon for navigating a first reference point associated with the detail locating apparatus to a first mark point coordinate position of a first mark point, wherein:

first mark point is a first location defined relative to a defined point for one or more layout marks for describing a first floor plan feature;

the defined point has defined point coordinate data which describes a location of the first floor plan feature on the construction site;

the first mark point coordinate position describes a location of the first mark point on the construction site;

the first mark point coordinate position is based on the first defined point coordinate data and detail data for the first mark point;

cause the user interface to display the navigation icon;

generate a first detail icon associated with the first mark point; and cause the user interface to display the first detail icon.

17. The detail locating apparatus of claim 16, wherein the detail locator includes a detail locating arm extending radially away from the base and supported by the base, and wherein the detail locating apparatus includes an orientation sensor configured to generate orientation data regarding an orientation of the detail locating arm relative to the base.

18. The detail locating apparatus of claim 17, wherein the detail locating arm is rotatably supported by the base such that the detail locating arm can rotate relative to the base and about the vertical axis.

19. The detail locating apparatus of claim 17, wherein the detail locator includes a body having a top side and a bottom side, and wherein the user interface includes a display screen disposed on the top side.

20. A method of performing construction layout on a build site, the method comprising:

navigating a detail locating apparatus to a mark point based on navigation data displayed by the detail locating apparatus to align a reference point associated with the detail locating apparatus with the mark point, wherein: the mark point is a location defined relative to a defined point for one or more layout marks for describing a first floor plan feature;

the defined point has defined point coordinate data which describes a location of the first floor plan feature;

the detail locating apparatus comprises:

a base having a vertical axis;

a display extending radially from the base; and an orientation sensor associated with the display;

detail data is generated by control circuitry of the detail locating apparatus based on at least one of a parsed descriptor associated with the mark point and a point configuration associated with the mark point;

a coordinate location of the reference point on the detail locating apparatus is determined by control circuitry of the detail locating apparatus based on a measured position of the detail locating apparatus and the detail data;

a coordinate location of the mark point on the detail locating apparatus is determined by control circuitry of the detail locating apparatus based on the defined point coordinate data and the detail data;

displaying, by the display, an icon associated with the mark point based on the reference point being aligned with the mark point, wherein the icon is displayed above a location on the build site where the one or more layout marks should be made.

\* \* \* \* \*